(12) United States Patent
Chuang et al.

(10) Patent No.: US 11,152,384 B2
(45) Date of Patent: Oct. 19, 2021

(54) BOUNDARY STRUCTURE FOR EMBEDDED MEMORY

(71) Applicant: Taiwan Semiconductor Manufacturing Co., Ltd., Hsin-Chu (TW)

(72) Inventors: Harry-Hak-Lay Chuang, Zhubei (TW); Ming Chyi Liu, Hsinchu (TW); Shih-Chang Liu, Alian Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 14 days.

(21) Appl. No.: 16/387,720

(22) Filed: Apr. 18, 2019

(65) Prior Publication Data

US 2020/0227426 A1 Jul. 16, 2020

Related U.S. Application Data

(60) Provisional application No. 62/792,525, filed on Jan. 15, 2019.

(51) Int. Cl.
| | |
|---|---|
| *H01L 27/11548* | (2017.01) |
| *H01L 21/02* | (2006.01) |
| *H01L 21/033* | (2006.01) |
| *H01L 21/311* | (2006.01) |
| *H01L 21/3213* | (2006.01) |
| *H01L 21/762* | (2006.01) |

(Continued)

(52) U.S. Cl.
CPC .... *H01L 27/11548* (2013.01); *H01L 21/0217* (2013.01); *H01L 21/02164* (2013.01); *H01L 21/02532* (2013.01); *H01L 21/02595* (2013.01); *H01L 21/0332* (2013.01); *H01L 21/0337* (2013.01); *H01L 21/31144* (2013.01); *H01L 21/32139* (2013.01); *H01L 21/762* (2013.01); *H01L 27/11521* (2013.01); *H01L 27/11526* (2013.01); *H01L 29/42328* (2013.01); *H01L 21/0273* (2013.01)

(58) Field of Classification Search
None
See application file for complete search history.

(56) References Cited

U.S. PATENT DOCUMENTS

| | | | |
|---|---|---|---|
| 6,271,094 B1 * | 8/2001 | Boyd | ............... H01L 21/28114 257/E21.205 |
| 10,134,748 B2 | 11/2018 | Liu et al. | |

(Continued)

*Primary Examiner* — Steven M Christopher
(74) *Attorney, Agent, or Firm* — Eschweiler & Potashnik, LLC

(57) ABSTRACT

An integrated circuits device includes a semiconductor substrate having a logic region and a memory region separated by an isolation region having an isolation structure of dielectric material. A memory device is formed on the memory region and includes a gate electrode over a gate dielectric. A dummy gate structure is formed on the isolation structure. The dummy gate structure has a dummy gate electrode layer corresponding to the gate electrode and a dummy gate dielectric layer corresponding to the gate dielectric. A tapered sidewall structure is formed on a logic region-facing side of the dummy gate structure. The tapered sidewall structure is spaced above the isolation structure and either adjacent to or contiguous with the dummy gate electrode layer.

20 Claims, 26 Drawing Sheets

(51) Int. Cl.
*H01L 27/11521* (2017.01)
*H01L 27/11526* (2017.01)
*H01L 29/423* (2006.01)
*H01L 21/027* (2006.01)

(56) References Cited

U.S. PATENT DOCUMENTS

| | | | |
|---|---|---|---|
| 2014/0246712 A1* | 9/2014 | Chuang | H01L 29/7833 |
| | | | 257/288 |
| 2015/0041875 A1* | 2/2015 | Perera | H01L 29/7881 |
| | | | 257/314 |
| 2015/0084111 A1* | 3/2015 | Wu | H01L 27/11548 |
| | | | 257/316 |
| 2015/0137206 A1 | 5/2015 | Liu et al. | |
| 2016/0181268 A1* | 6/2016 | Chuang | H01L 21/823842 |
| | | | 257/314 |
| 2016/0307909 A1* | 10/2016 | Tseng | H01L 29/42344 |
| 2018/0151579 A1 | 5/2018 | Liu et al. | |

* cited by examiner

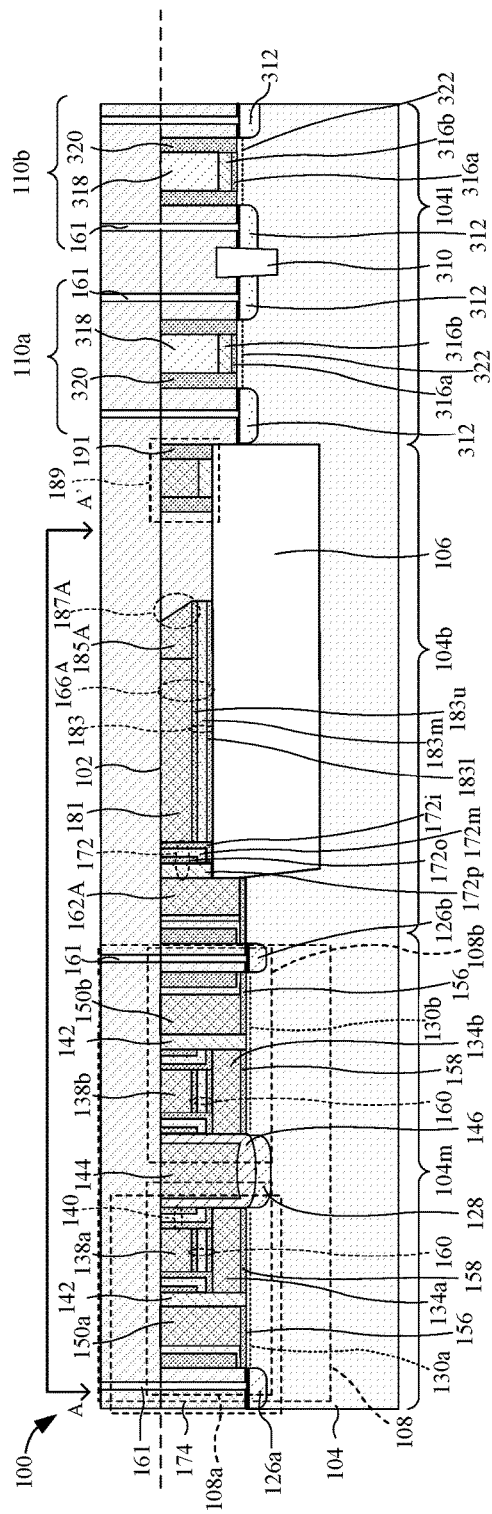
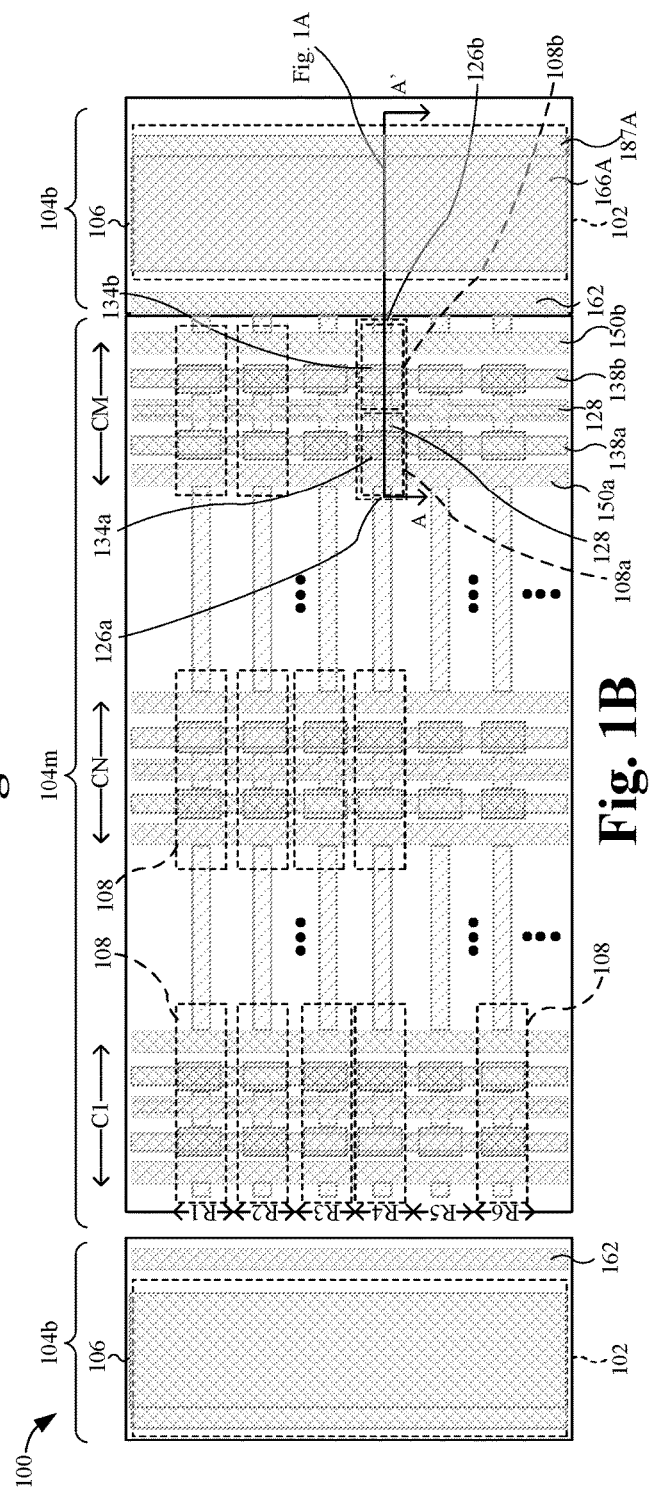
Fig. 1A
Fig. 1B

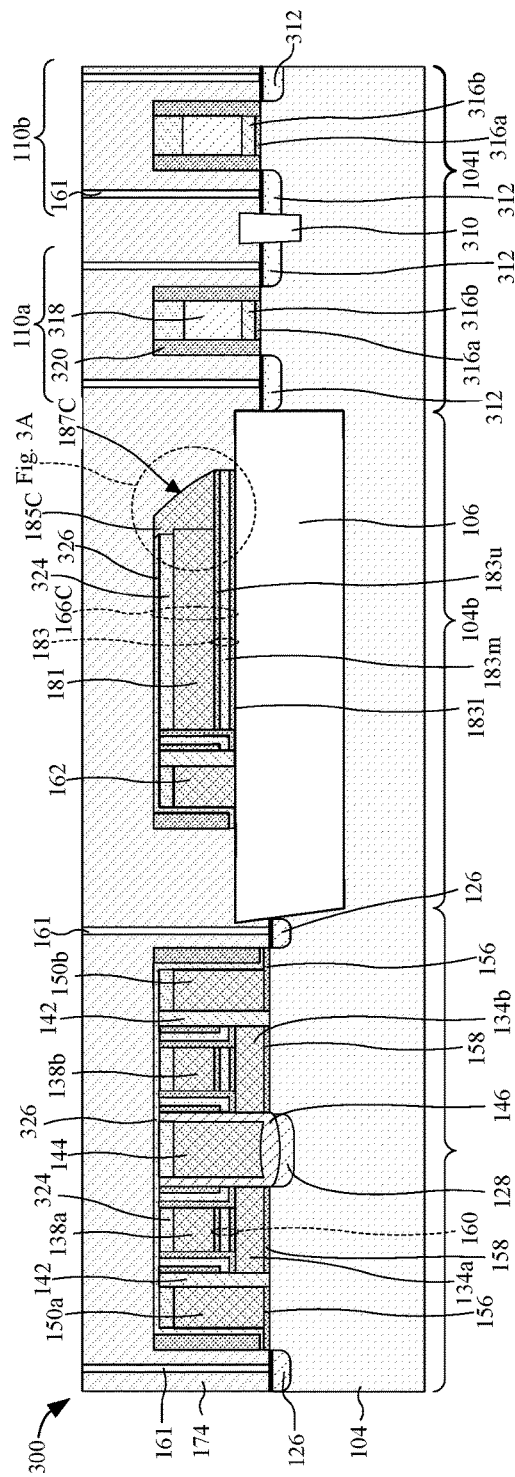
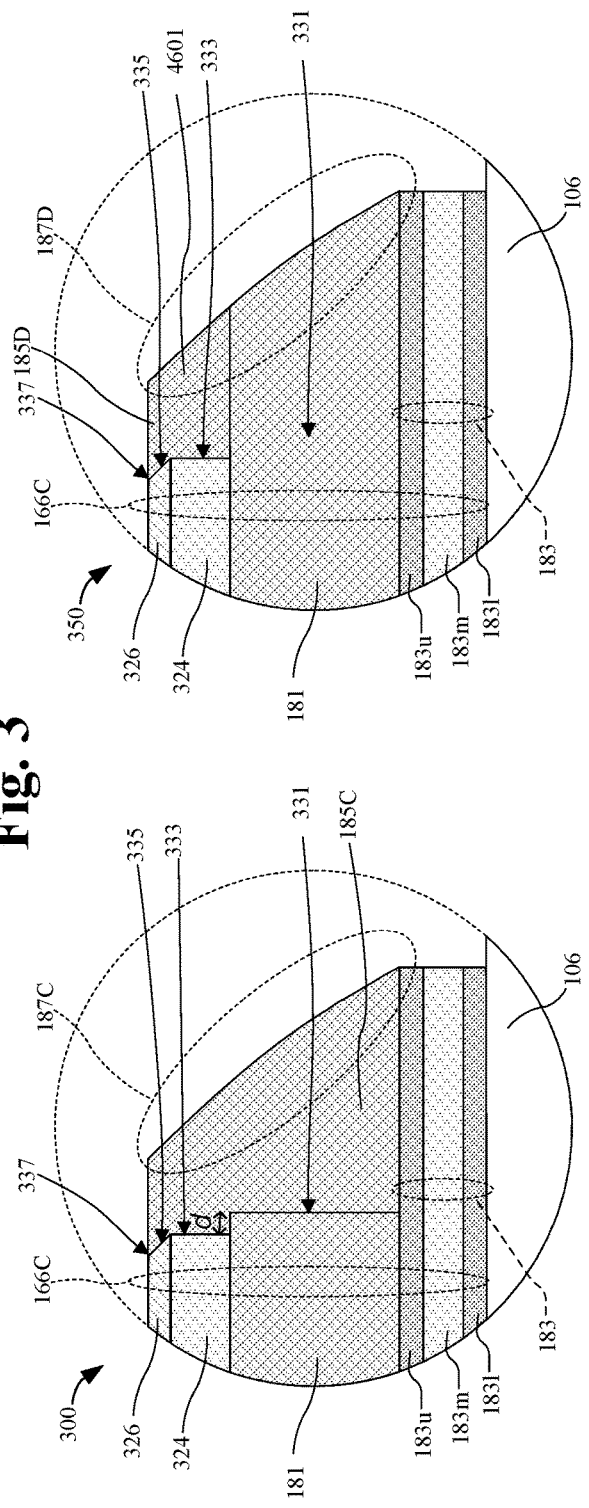
Fig. 3
Fig. 3A
Fig. 3B

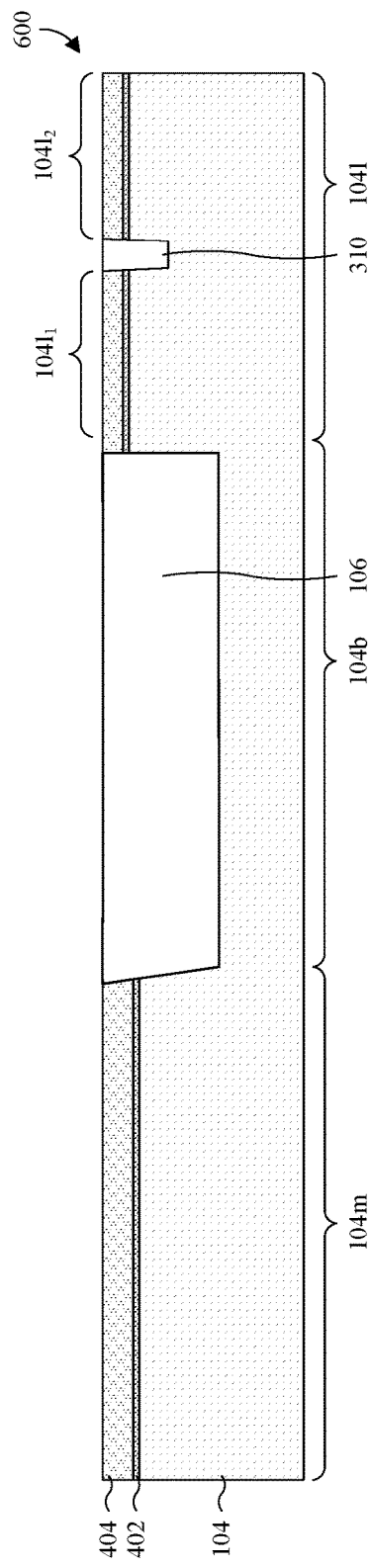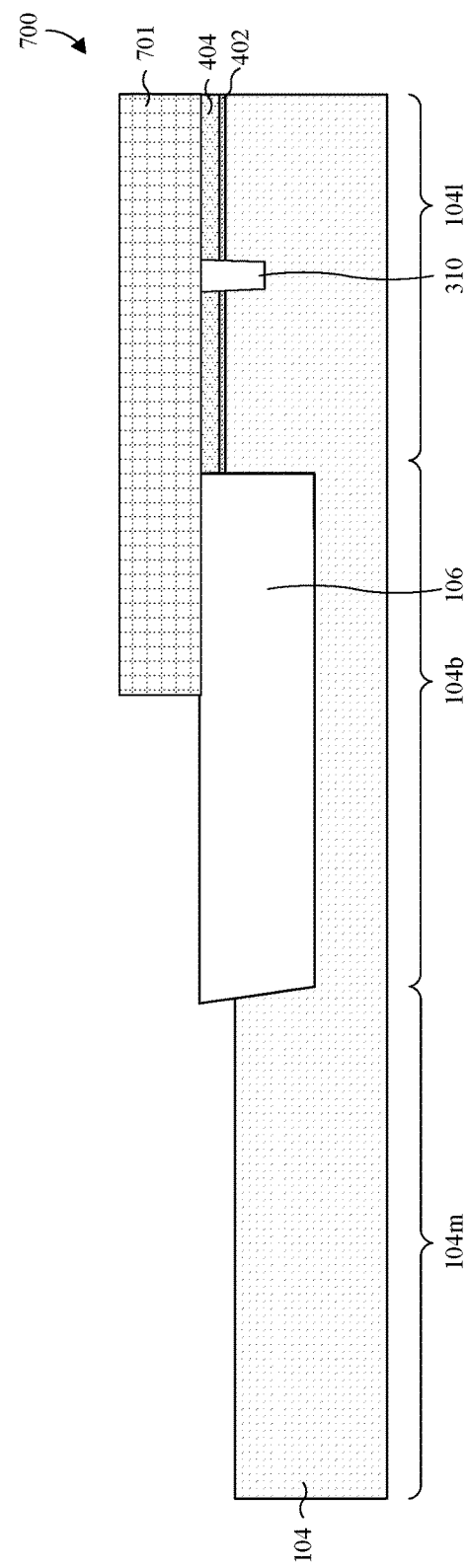
Fig. 6
Fig. 7

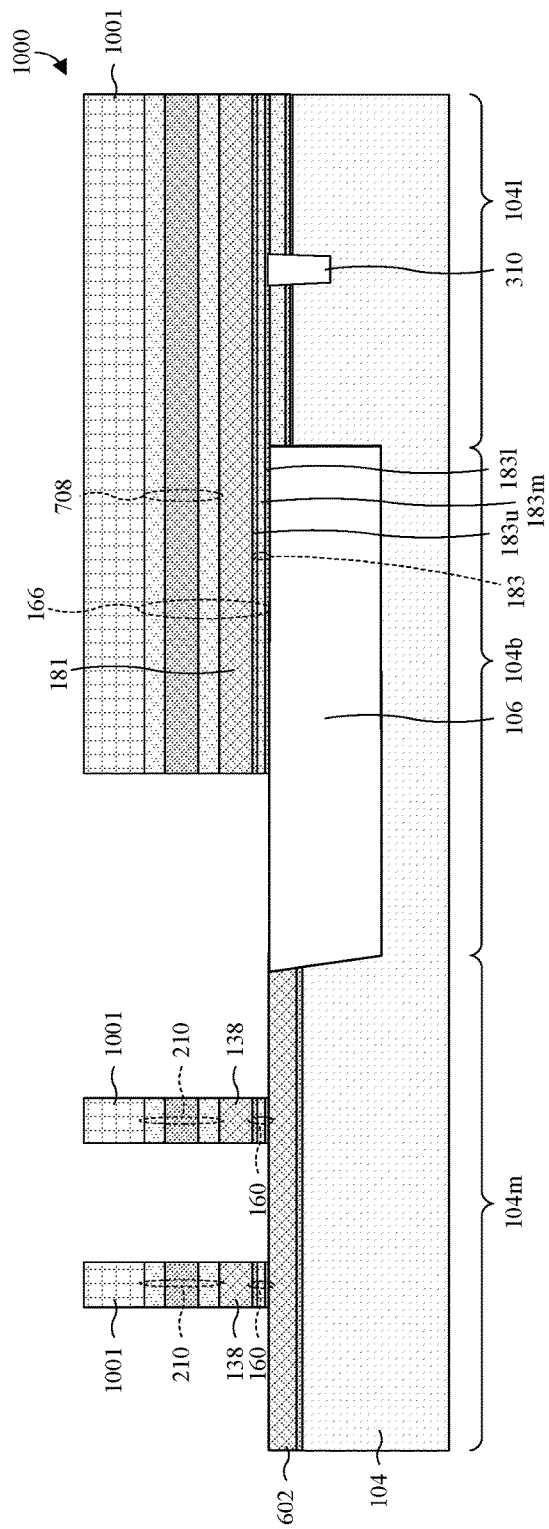
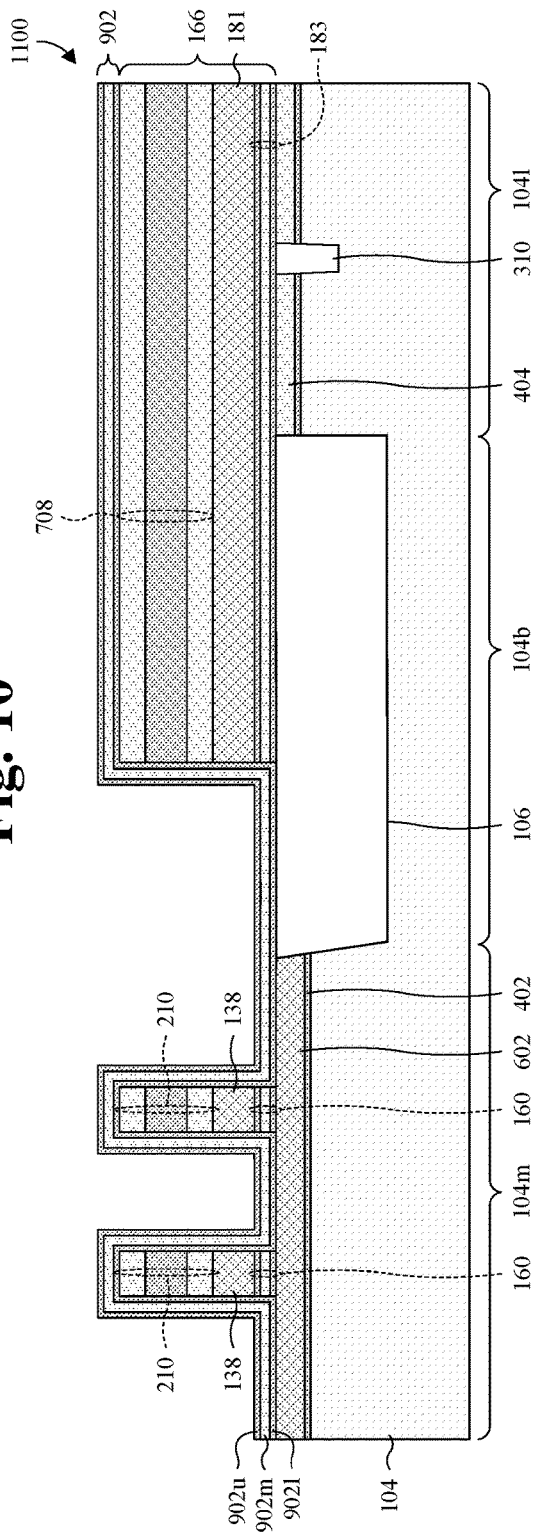

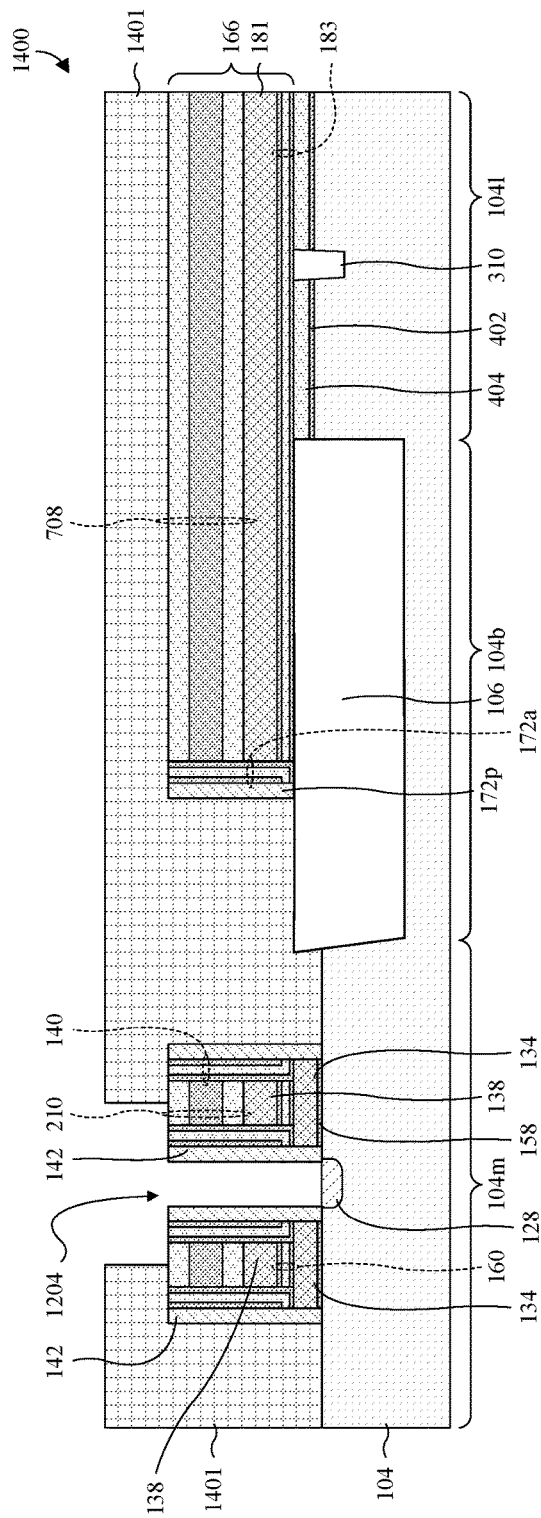
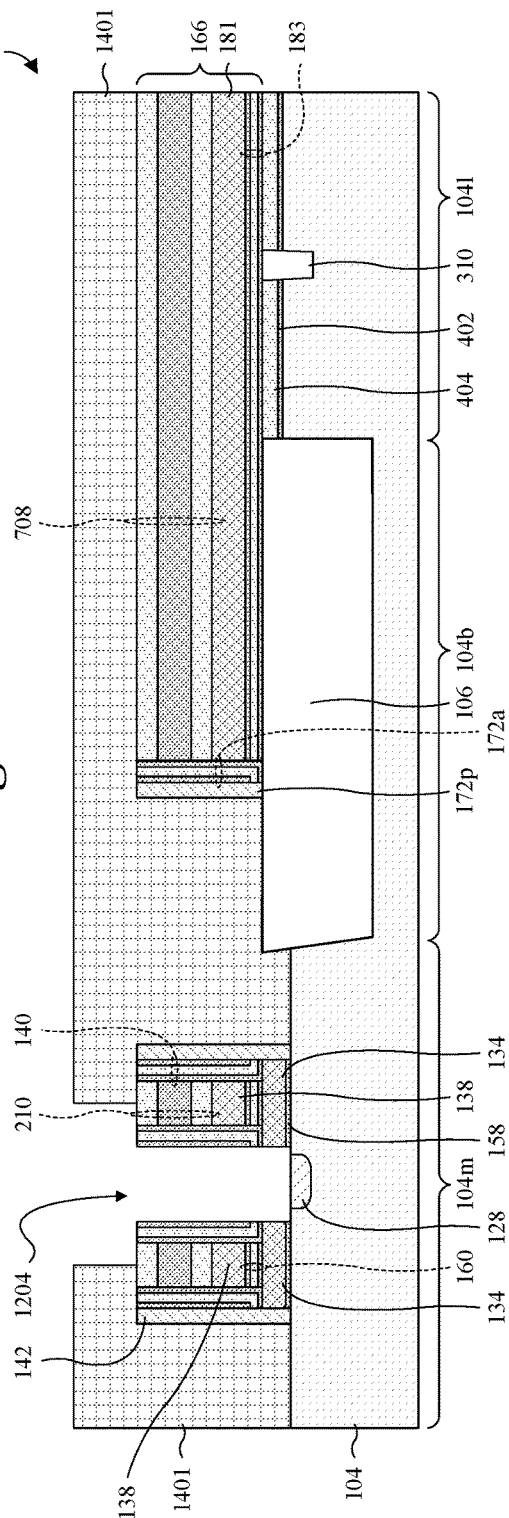
Fig. 14
Fig. 15

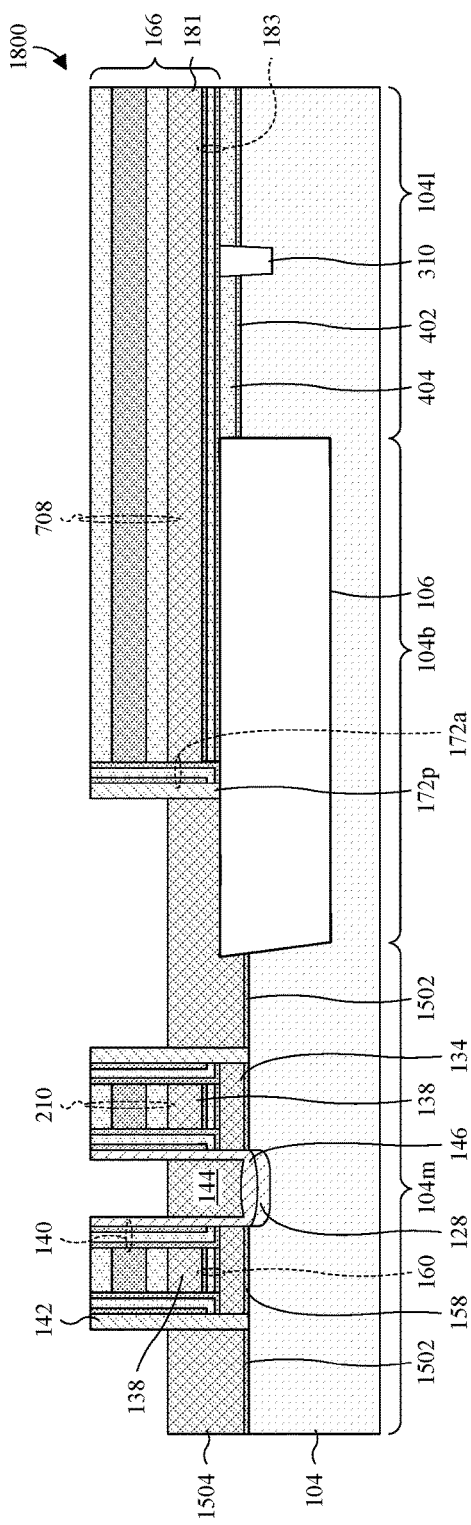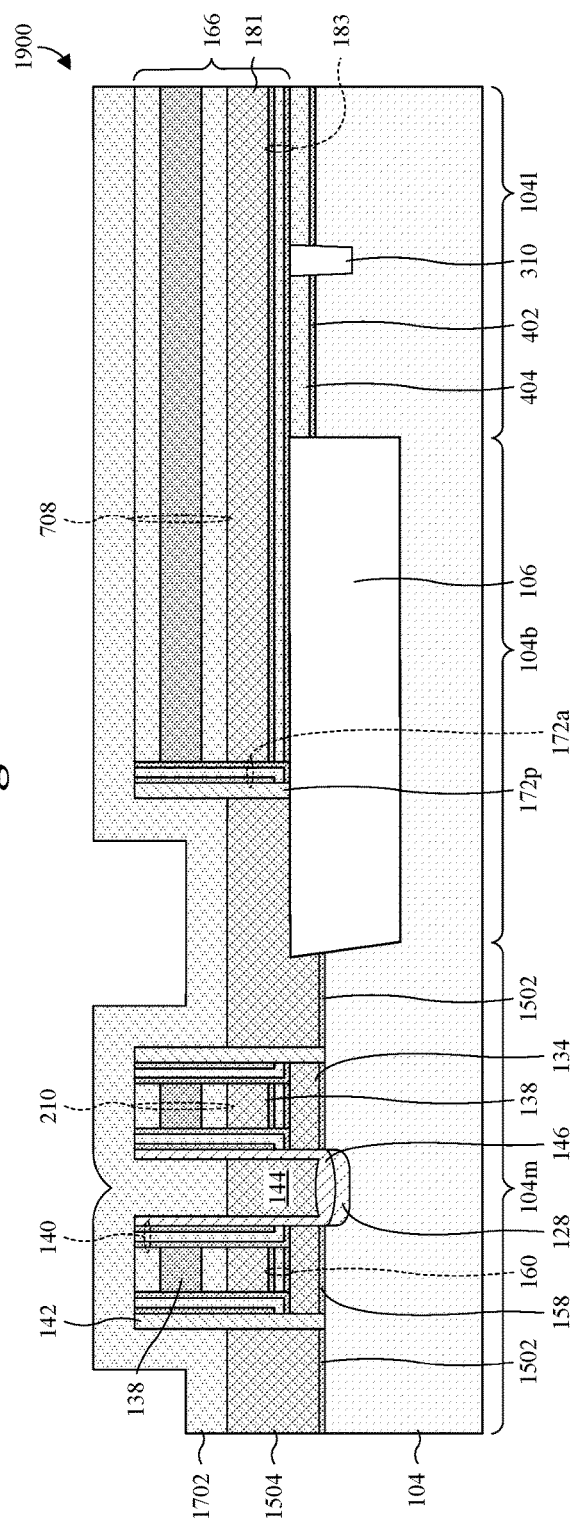
Fig. 18
Fig. 19

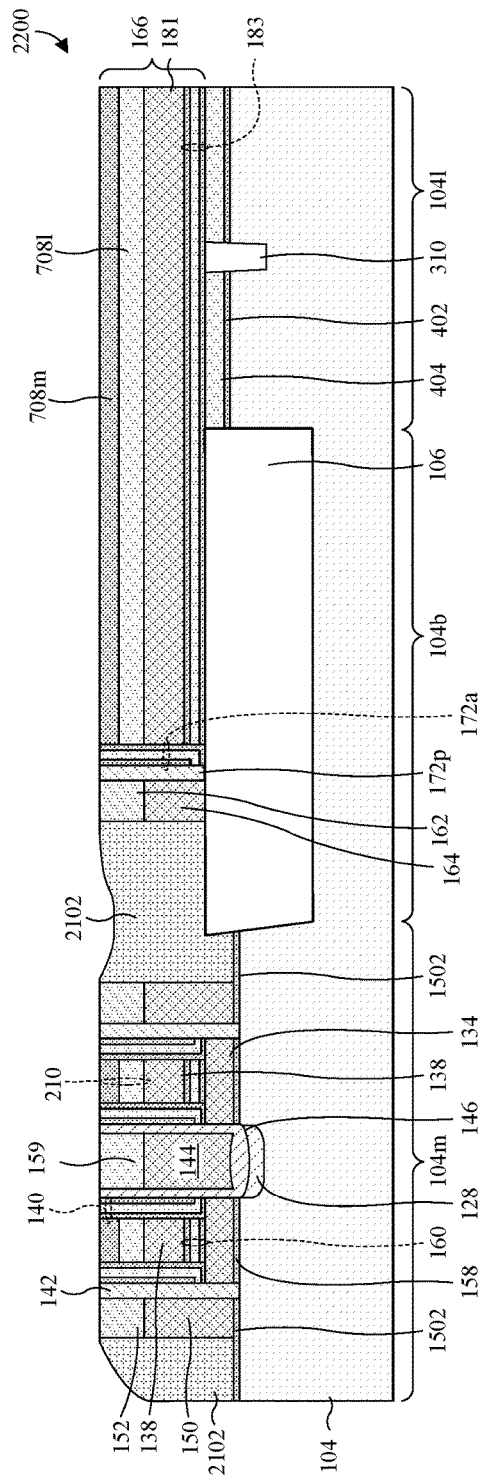
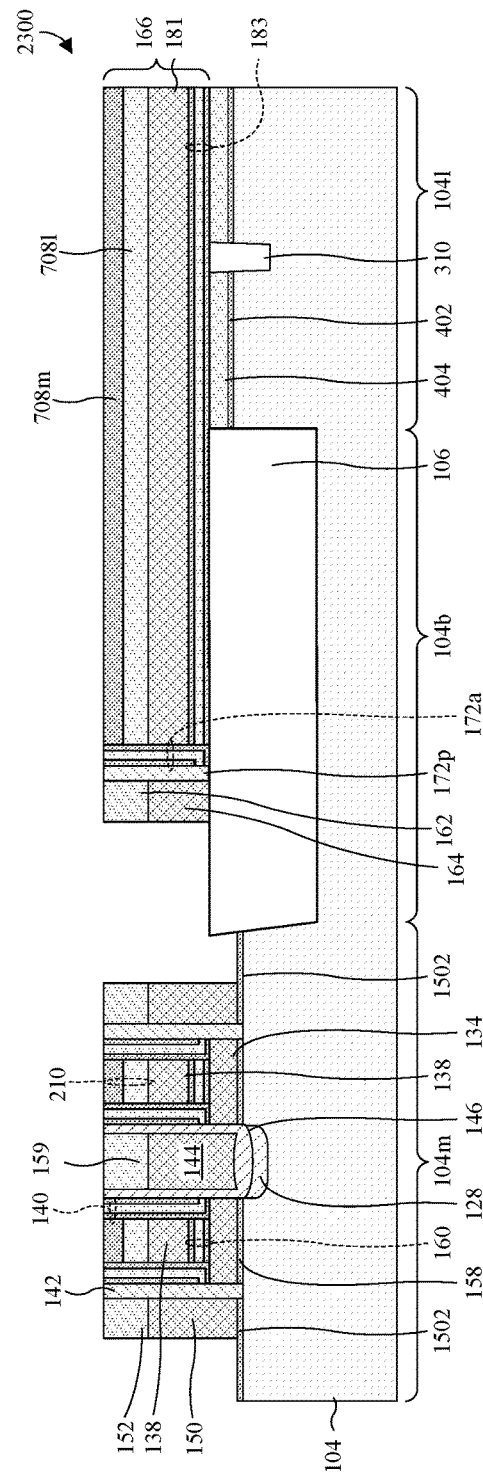
Fig. 22
Fig. 23

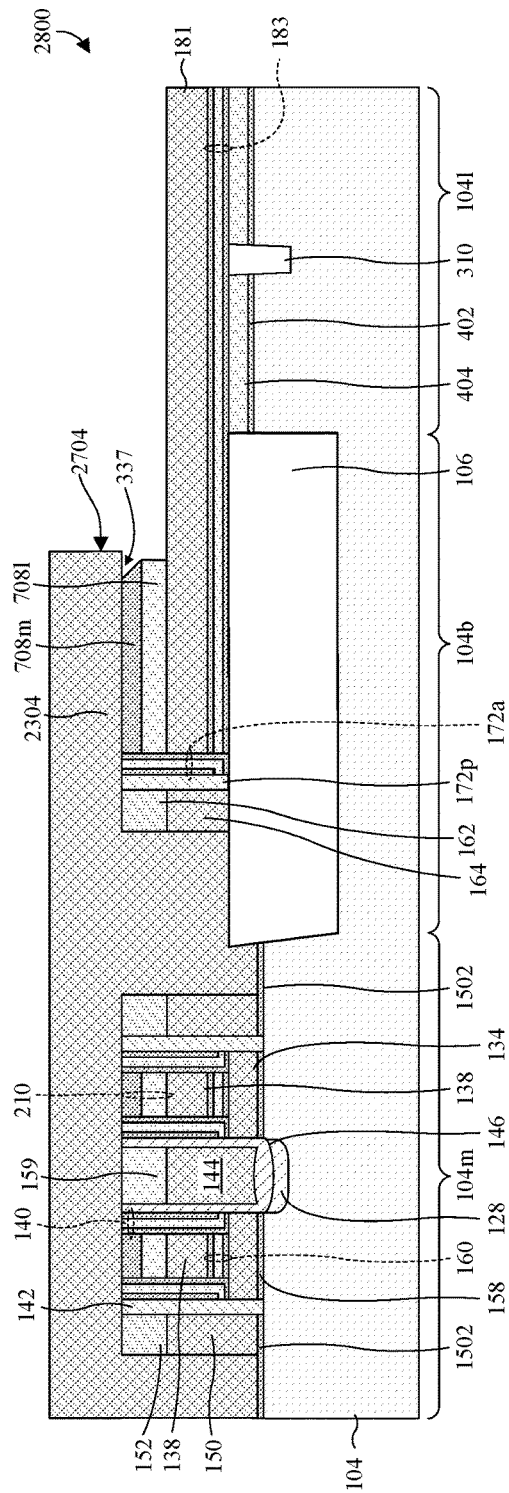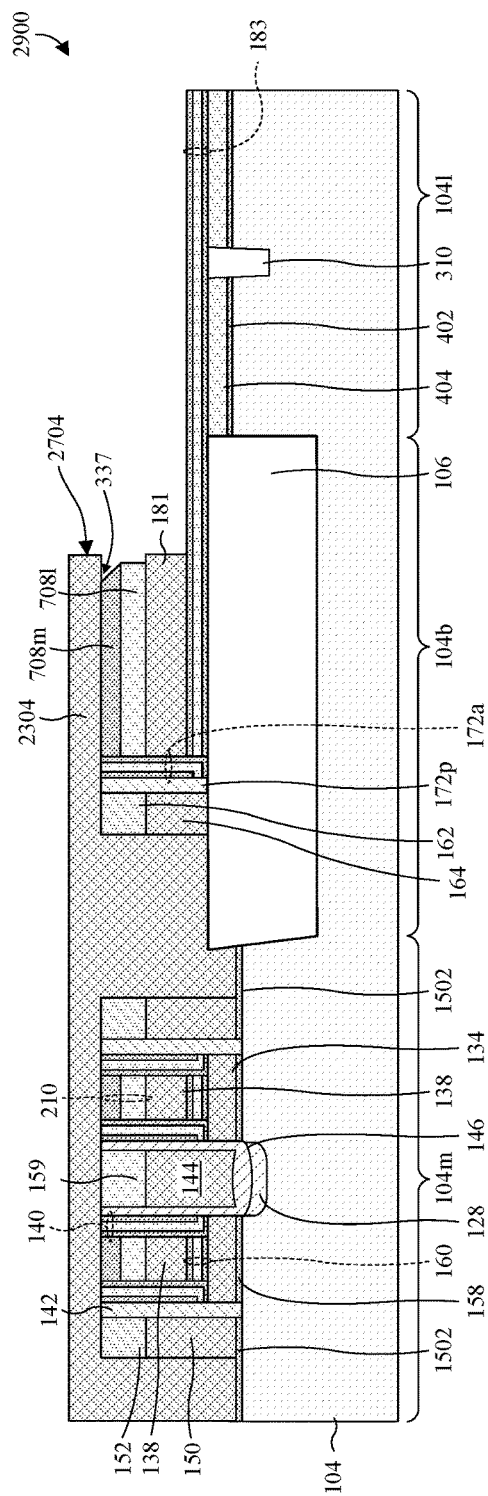
Fig. 28
Fig. 29

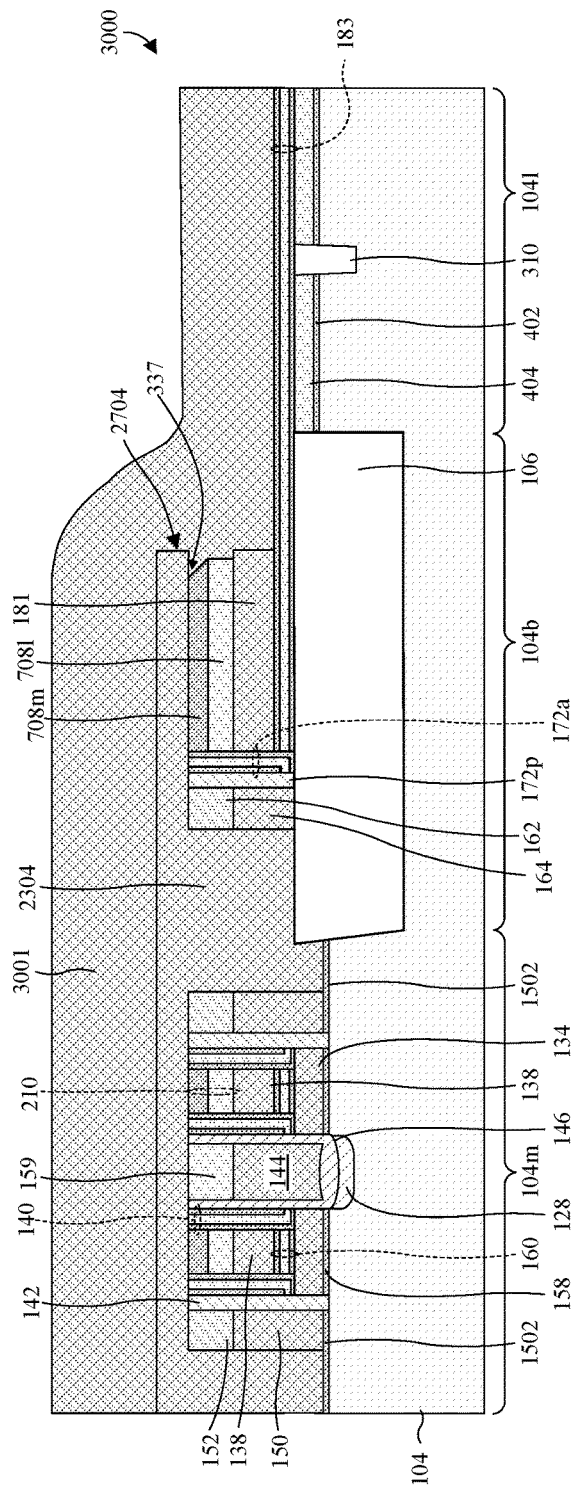
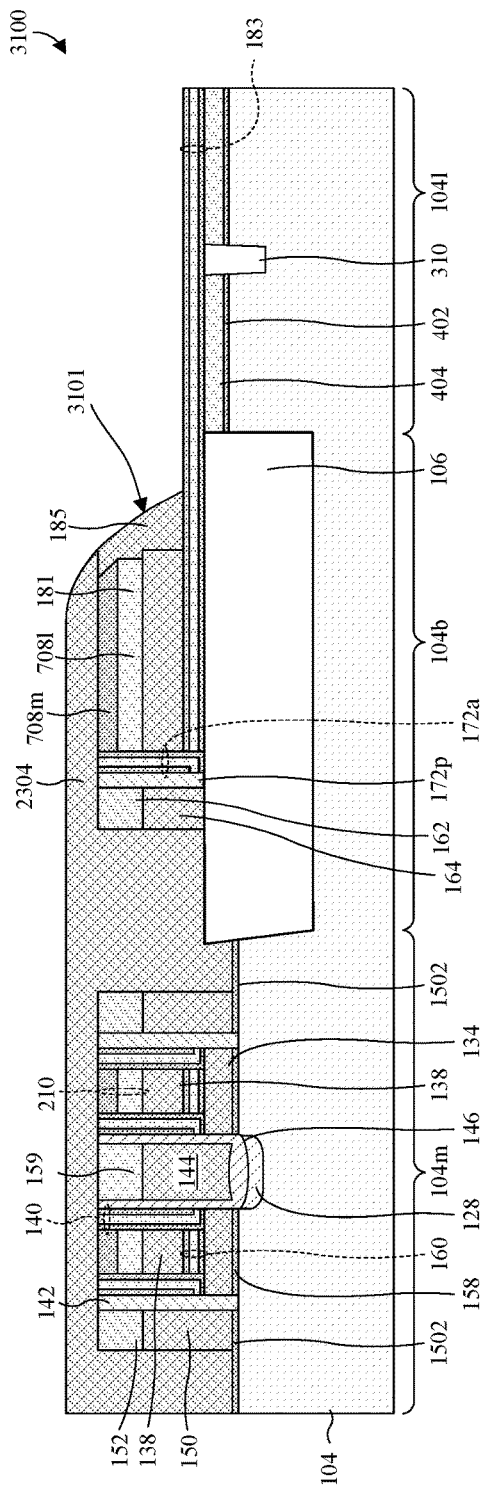
Fig. 30
Fig. 31

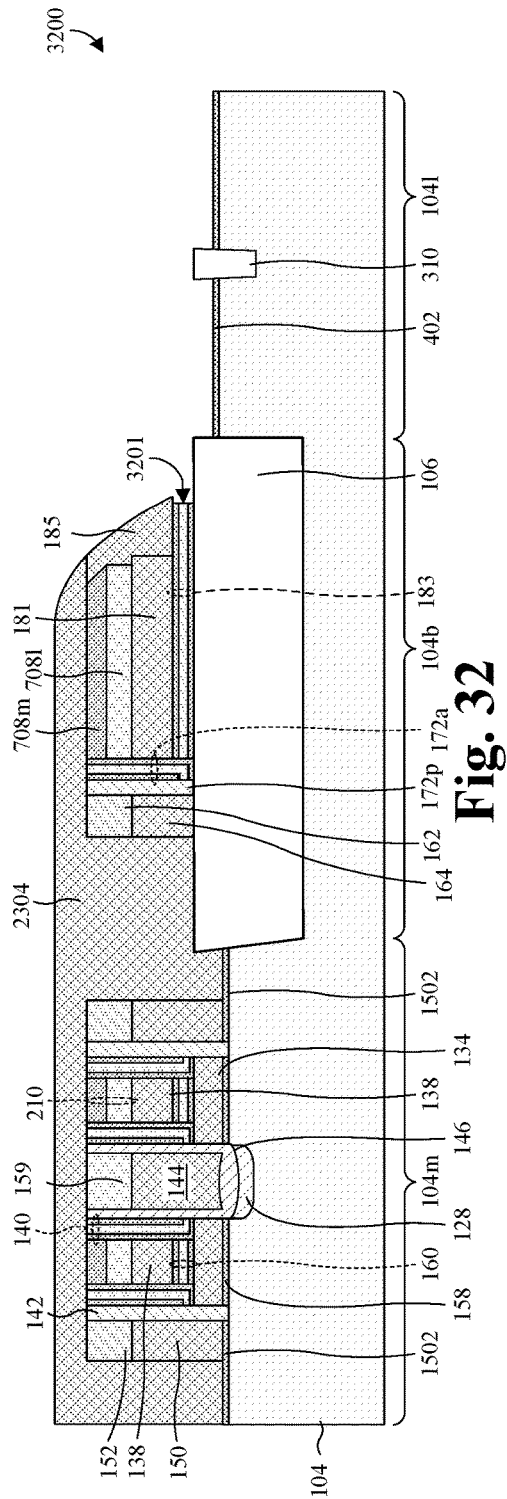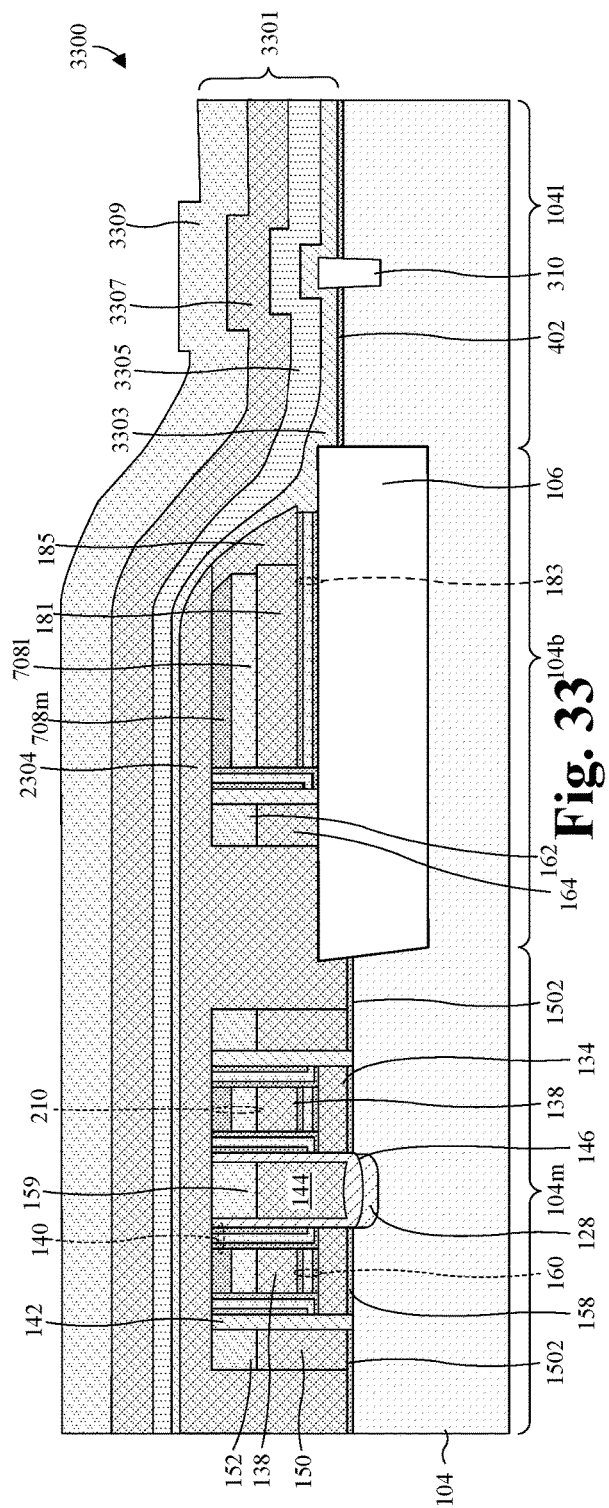

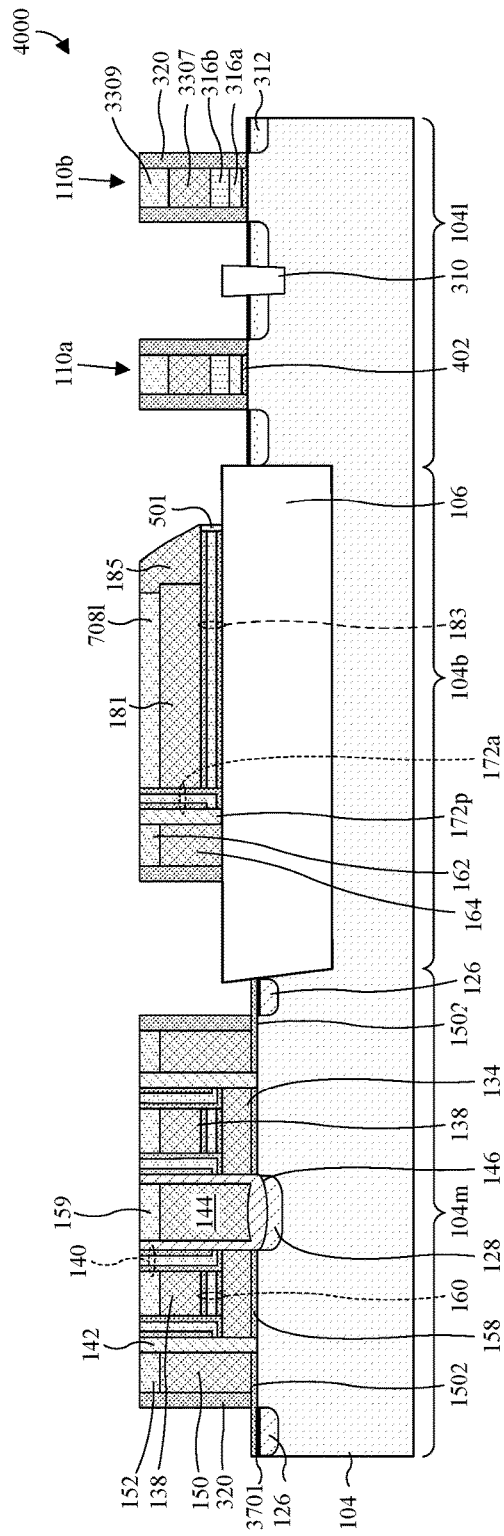
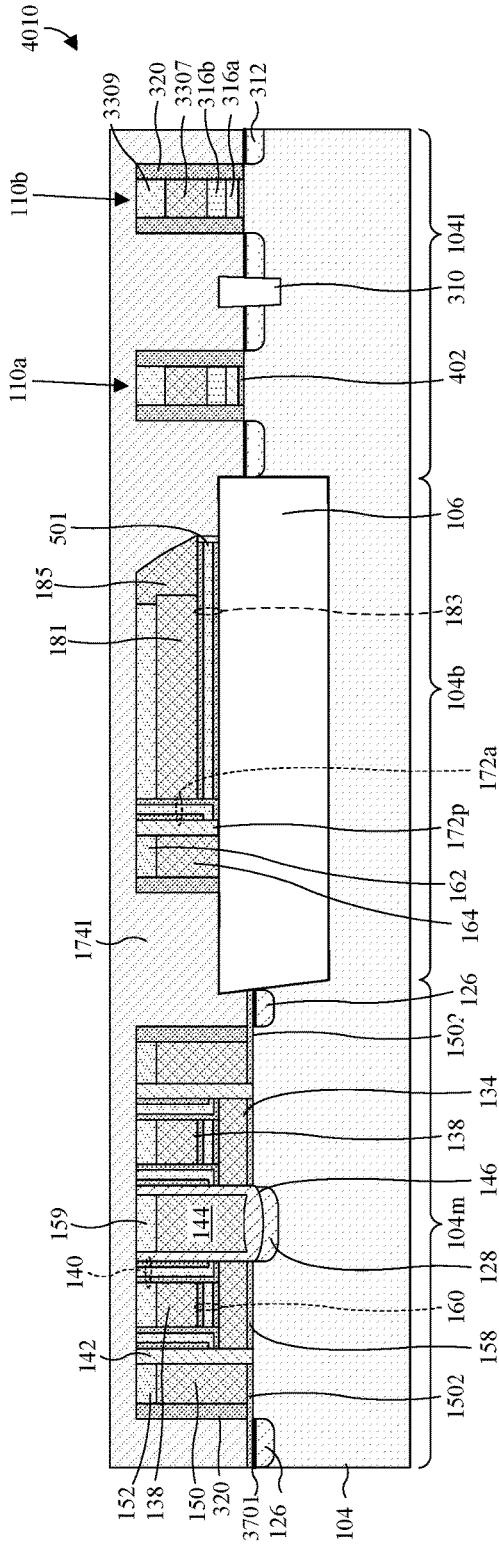
Fig. 40A
Fig. 40B

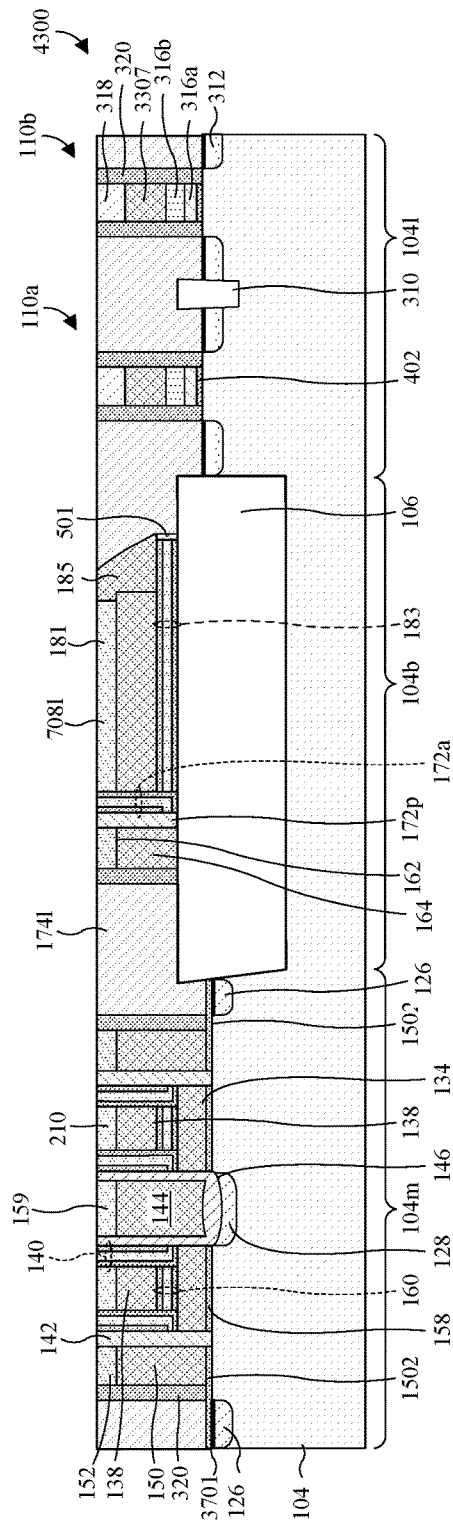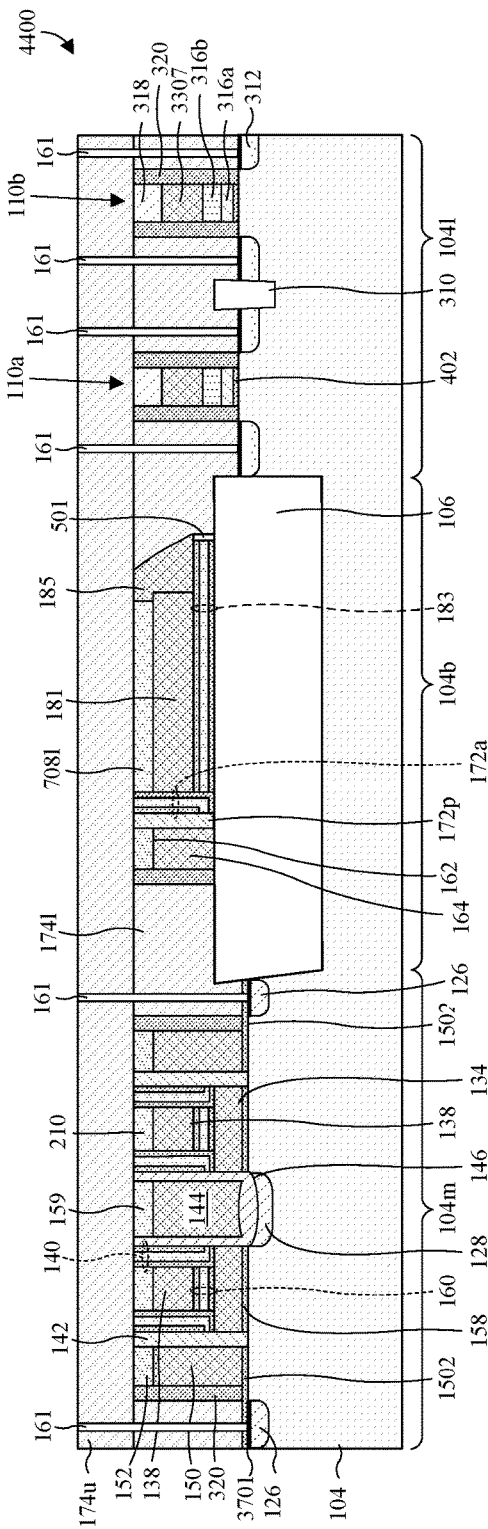

BOUNDARY STRUCTURE FOR EMBEDDED MEMORY

REFERENCE TO RELATED APPLICATION

This Application claims the benefit of U.S. Provisional Application No. 62/792,525, filed on Jan. 15, 2019, the contents of which are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has increased while feature sizes have decreased. Other advances have included the introduction of embedded memory technology and high κ metal gate (HKMG) technology. Embedded memory technology is the integration of memory devices with logic devices on the same semiconductor chip. The memory devices support operation of the logic devices and improve performance in comparison to using separate chips for the different types of devices. High κ metal gate (HKMG) technology is the manufacture of semiconductor devices using metal gate electrodes and high κ gate dielectric layers.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

FIG. 1A illustrates a cross-sectional view of an integrated circuit (IC) according to some aspects of the present disclosure.

FIG. 1B illustrates a partial top view of the IC of FIG. 1A.

FIG. 3 illustrates a cross-sectional view of an IC according to other aspects of the present disclosure.

FIG. 3A provides an expanded view of a portion of FIG. 3.

FIG. 3B provides a view that corresponds to FIG. 3A but for a different embodiment that relates to other aspects of the present disclosure.

FIGS. 6-44 illustrate a series of cross-sectional views of an IC according to some aspects of the present disclosure undergoing a manufacturing process according to some aspects of the present disclosure.

DETAILED DESCRIPTION

Figure 2:
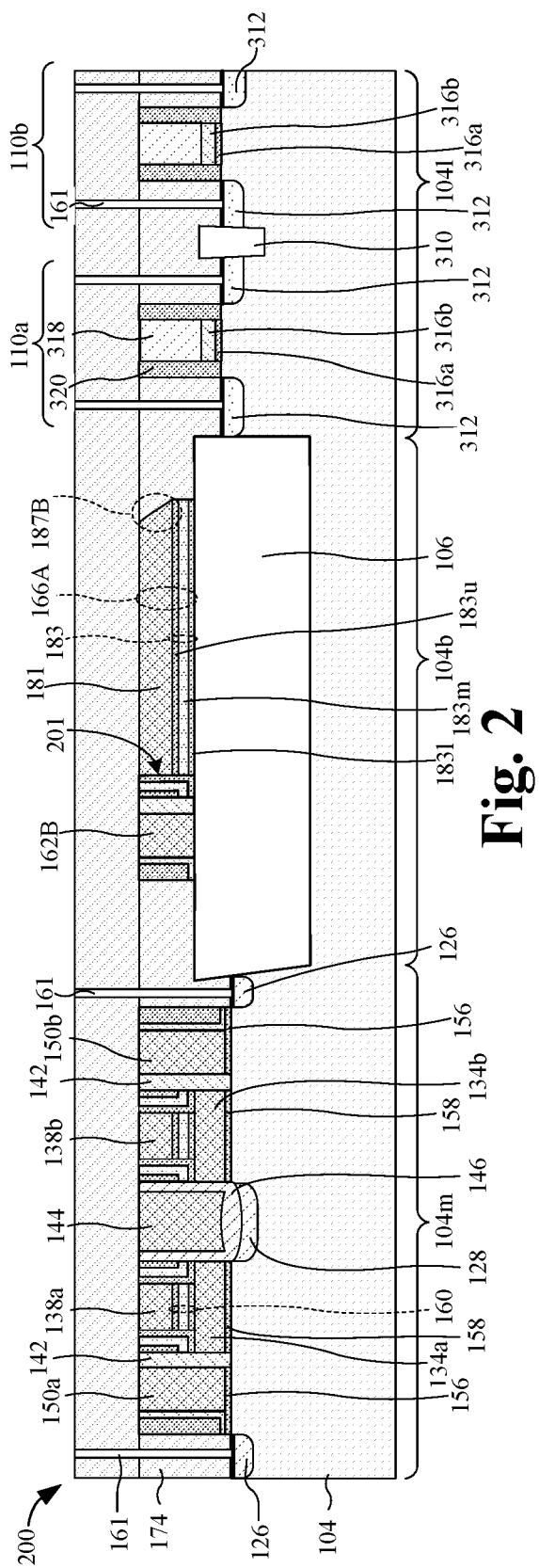
FIG. 2 illustrates a cross-sectional view of an IC according to other aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

The present disclosure relates to embedded memory devices. An embedded memory device may be a split gate flash memory device. In such a device, an array of memory cells is disposed in or over a semiconductor substrate. Peripheral circuitry, including logic devices such as address decoders and/or read write circuitry and/or microcontrollers, is arranged outside of the memory array and may control operation of the memory cells and/or perform other tasks. An isolation region with an isolation structure separates the memory array from the peripheral circuitry. Certain features of the memory array and a dummy gate stack on the isolation structure may be formed prior to the logic gates. These structures may create challenges managing materials used in the logic gates. For example, if crevices of a certain dimension are present in a sidewall of the dummy gate stack when high κ dielectric for logic gates is deposited, high κ dielectric that deposits along crevice walls may be unintentionally exposed at a later stage of processing. The exposed high κ dielectric may then become a source of contamination that affects doping levels in other areas of the device or causes contamination of processing equipment.

The present disclosure in various embodiments provides methods of forming smooth-surfaced tapered sidewall structures for dummy gate stacks and provides devices formed with these tapered sidewall structures. A dummy gate stack includes a dummy gate dielectric layer and a dummy gate electrode layer, which may correspond to a dielectric layer and an electrode of a control gate in the memory region. A tapered sidewall structure is formed on a side of the dummy gate stack opposite the memory region. The tapered sidewall structure is either adjacent to or contiguous with the dummy gate electrode layer. In some embodiments, the tapered sidewall structure has a single (homogeneous) composition. In some embodiments, the tapered sidewall structure is made of the same material as the dummy gate electrode layer. In other embodiments, the tapered sidewall structure is made of a material different from the dummy gate electrode layer.

The tapered sidewall structure is formed above at least a partial thickness of the dummy gate dielectric layer and is, accordingly, spaced above the isolation structure. The spacing may be on the order of the thickness of the dummy gate dielectric layer. In some embodiments, the spacing is equal to the thickness of the dummy gate electrode layer. In some embodiments, the spacing is less than the thickness of the dummy gate electrode layer. The tapered sidewall structure provides a smooth surface during stages of processing such as a stage at which high κ dielectric is being deposited. The formation of the tapered sidewall structure on top of the dummy gate dielectric layer or a partial thickness thereof relates to processing in which the dummy gate dielectric layer protects the logic region during etching used to form the tapered sidewall structure. That protection allows the use of an aggressive etch process without risking damage in the logic region.

A method of forming an IC according to the present disclosure includes forming an isolation structure in an upper surface of a semiconductor substrate. The isolation structure separates a memory region of the semiconductor substrate from a logic region of the semiconductor substrate. Subsequent steps may include forming a gate oxide over the semiconductor substrate in the memory region of the semiconductor substrate and forming a conductive floating gate layer over the gate oxide. A control gate dielectric layer is formed over the floating gate layer and a control gate electrode layer is formed over the control gate dielectric layer. Both the control gate dielectric layer and the control gate electrode layer extend over the isolation structure and the logic region. The control gate dielectric layer may be a multilayer structure. In some embodiments, the control gate dielectric layer is an oxide, nitride, oxide (ONO) multilayer structure. In some embodiments, the control gate electrode layer is polysilicon. A hard mask layer is formed over the control gate electrode layer and a capping layer is formed over the hard mask layer. Both the hard mask layer and the capping layer also extend over the isolation region and the logic region.

The hard mask layer may include one of more layers of dielectric material(s) that are formed over the control gate electrode layer. Additional dielectric barrier layers such as etch stop layers, liner layers, and the like, may be formed adjacent the hard mask layer, may have compositions and thicknesses similar to hard mask layers, and may be processed like hard mask layers within the stack over the isolation structure. The stack over the isolation structure includes, from the bottom up, the control gate dielectric layer, the control gate electrode layer, the hard mask layer and like layers, and the capping layer. In some embodiments, the hard mask layer and like layers includes an oxide layer (meaning a layer that is primarily silicon dioxide) over a nitride layer (meaning a layer that is primarily silicon nitride). In some of these teachings, the capping layer is of the same material as the control gate layer. In some embodiments, the capping layer is polysilicon.

Next, the capping layer and the hard mask layer are patterned with an etch process ("the first etch process") that forms a sidewall over the isolation structure. The sidewall faces the logic region and includes sidewalls of the capping layer and the hard mask layer. In the present disclosure the phrase "facing the logic region" is used to distinguish one side of the isolation structure from the other and the indication of side is the same as "facing away from the memory region" even if one region does not fully surround the other. In some embodiments, the first etch process stops in or on the control gate electrode layer. Stopping on the control gate electrode layer facilitates a hard mask etch back process described below. A layer of spacer material is subsequently deposited. The spacer material covers the sidewall. In some embodiments, the spacer material is the same material as the capping layer. In some embodiments, the spacer material is the same material as the control gate electrode layer. In some embodiments, the control gate electrode layer is etched through to extend the sidewall down to the control gate dielectric layer before depositing the spacer material. In some other embodiments, the spacer material is deposited over the control gate electrode layer.

The layer of spacer material is etched with a "second etch process." In some embodiments, the second etch process stops in or on the control gate dielectric layer and leaves a tapered sidewall structure covering the sidewall. The tapered sidewall structure may be composed of one or more of the spacer material, the control gate electrode layer, and the capping layer. In some embodiments, the second etch process removes the control gate electrode layer from the logic region while a portion of the control gate electrode layer remains to form the bottom of the tapered sidewall structure. The tapered sidewall structure formed by the second etch process has a sloped but smooth surface. The control gate dielectric is subsequently etched through in the logic region followed by formations of various structures in the logic region. Those structures may include metal gates with high κ dielectrics.

According to some aspects of the present teachings, an "etch back process" is employed prior to depositing the layer of spacer material or extending the sidewall through the control gate electrode layer. The etch back process causes portions of the hard mask to become recessed into the sidewall. If additional dielectric barrier layers such as an etch stop layer, a liner layer, or the like, are formed adjacent the hard mask layer, these may also be etched back to become recessed into the sidewall. In some embodiments, this process causes a recessing of the uppermost of the group of adjacent dielectric layers that includes the hard mask layer, that is, the dielectric layer immediately underneath the capping layer. This etch back process assures that the hard mask will be covered by the spacer material after the second etch process. If a portion of the hard mask were exposed, it could be etched back when the control gate dielectric layer is removed creating a void in which high κ dielectric might be deposited and subsequently exposed.

In some embodiments, the spacer material is a dielectric. In embodiments the spacer material is an oxide dielectric and the second etch process stops in or on a nitride layer of the control gate dielectric layer. In embodiments the spacer material is a nitride dielectric and the second etch process stop in or on an oxide layer of the control gate dielectric layer. Any suitable dielectric may be used for the spacer material and any suitable portion of the control gate dielectric layer may provide an etch stop.

FIG. 1A illustrates a cross-sectional view of an IC 100 according to some embodiments of the present disclosure. IC 100 includes a semiconductor substrate 104 that is divided into a memory region 104*m* and a logic region 104*l* by a boundary region 104*b* that includes an isolation structure 106. Isolation structure 106 is formed of dielectric material and laterally surrounds memory region 104*m*. A dummy gate stack 166A is formed over isolation structure 106. A tapered sidewall structure 187A borders dummy gate stack 166A and tapers toward logic region 104*l*. "Toward logic region 104*l*" may be understood as meaning away from memory region 104*m*.

Tapered sidewall structure 187A may have a profile of the type formed when material is deposited over a surface that undergoes a step change in height followed by plasma etching that leaves a layer of the material covering a sidewall of the step. The deposition produces a layer of material that has a vertical thickness that varies and is thickest adjacent the sidewall. The profile may develop from the variation in thickness without the influence of a mask. The plasma etching removes material where it is thinnest and the remaining material has a smoothly curved and tapering profile. Tapered sidewall structure 187A tapers to form an angle between with respect to an upper surface 102 of dummy gate stack 166A, which parallels a surface of semiconductor substrate 104. In some embodiments, the angle is between 20 and 80 degrees. In some embodiments, the angle is between 30 and 70 degrees. In some embodiments, this angle is realized for a portion of tapered sidewall structure 187A. In some embodiments, this angle is an average over the length of tapered sidewall structure 187A extending from the top of dummy gate stack 166A to where the taper ends proximate isolation structure 106.

Dummy gate stack 166A includes a dummy gate dielectric layer 183 and a dummy gate electrode layer 181. Dummy gate electrode layer 181 may be doped polysilicon, another suitable conductive material(s), any combination of the foregoing, or the like. Dummy gate dielectric layer 183 may have any suitable composition. Dummy gate dielectric layer 183 may be or otherwise comprise oxide, nitride, silicon oxynitride, another suitable dielectric(s), any combination of the foregoing, or the like. In some embodiments, dummy gate dielectric layer 183 forms a charge-trapping structure. In some embodiments, dummy gate dielectric layer 183 comprises a lower oxide layer 183*l*, middle nitride layer 183*m*, and upper oxide layer 183*u*, thereby establishing an oxide-nitride-oxide (ONO) film.

Tapered sidewall structure 187A may be part of a boundary sidewall spacer 185A that lies adjacent dummy gate electrode layer 181. The original top of boundary sidewall spacer 185A has been removed in a planarization process. As a result, boundary sidewall spacer 185 may have a substantially trapezoidal shape and tapered sidewall structure 187A may have a substantially triangular shape. In some embodiments, the smooth sidewall of tapered sidewall structure 187A does not reach the surface of isolation structure 106. In these embodiments, tapered sidewall structure 187A terminates above isolation structure 106. Nevertheless, tapered sidewall structure 187A may reach very close to isolation structure 106. In some embodiments, tapered sidewall structure 187 is spaced from isolation structure 106 by a distance that equals the thickness of dummy gate dielectric layer 183. In some embodiments tapered sidewall structure 187A is within a distance of isolation structure 106 that is less than the thickness of dummy gate dielectric layer 183. In some embodiments, the spacing of tapered sidewall structure 187 from isolation structure 106 is greater than or equal to the thickness of one or more layers of dummy gate dielectric layer 183. These spacing may also reflect the spacings of boundary sidewall spacer 185 from isolation structure 106.

A spacer 172 may be formed on isolation structure 106 on the side of dummy gate electrode layer 181 that is opposite boundary sidewall spacer 185A. In some embodiments, spacer 172 directly contacts a sidewall of dummy gate stack 166A and/or extends continuously along the dummy gate stack 166A from a bottommost edge of dummy gate dielectric layer 183 to a topmost edge of dummy gate stack 166. Spacer 172 may be or otherwise comprise oxide, nitride, silicon oxynitride, polysilicon another suitable spacer material(s), any combination of the foregoing, or the like. In some embodiments, spacer 172 comprises a charge-trapping dielectric structure. In some embodiments, spacer 172 comprises an oxide-nitride-oxide structure, with an outer oxide layer 172*o*, middle nitride layer 172*m*, and inner oxide layer 172*i*. Outer dummy gate spacer 172*p*, which may be an oxide (e.g., $SiO_2$), a nitride (e.g., $Si_3N_4$), another suitable dielectric material(s), any combination of the foregoing, or the like, may separate the oxide-nitride-oxide structure from dummy select gate electrode 162A.

FIG. 1B illustrates a top view of IC 100 with a line A-A' corresponding to the line A-A' in the cross-sectional view of FIG. 1A. Referring to FIG. 1B, IC 100 includes an array of memory cells disposed in or on memory region 104*m*. In the illustrated example, the array of memory cells includes a number of split gate flash memory cell pairs 108 that are arranged in 6 rows (R1-R6) and M columns (C1-CM). In general, the array can include any number of columns and any number of rows. A pair of split gate flash memory cells 108 resides at the intersection of each row and column. Column 1 and column M are the outermost columns and are nearest boundary region 104*b*, while column CN is a column in a central region of the memory array.

FIG. 1A's cross-section shows an example pair of split gate flash memory cells 108 located at the intersection of Column M and Row 4. The pair of split gate flash memory cells 108 includes a first memory cell 108*a* and a second memory cell 108*b*. First and second individual source/drain regions 126*a*, 126*b* (corresponding to the first and second memory cells 108*a*, 108*b*, respectively) are disposed in semiconductor substrate 104, and a common memory source/drain region 128 (shared between the first and second memory cells 108*a*, 108*b*) is disposed in the semiconductor substrate 104 and laterally spaced between the first and second individual source/drain regions 126*a*, 126*b*. First individual source/drain region 126*a* is separated from the common memory source/drain region 128 by a first channel region 130*a*, and common memory source/drain region 128 is separated from second individual source/drain region 126*b* by a second channel region 130*b*. An erase gate electrode 144 is disposed over common memory source/drain region 128 and is separated from common memory source/drain region 128 by erase gate dielectric 146. First and second floating gate electrodes 134*a*, 134*b* are located respectively over first and second channel regions 130*a*, 130*b*. First and second control gate electrodes 138*a*, 138*b* overlie first and second floating gate electrodes 134*a*, 134*b*. First and second select gate electrodes 150*a*, 150*b* overlie first and second channel regions 130*a*, 130*b* respectively, and are laterally spaced from erase gate electrode 144 by first and second floating gate electrodes 134*a*, 134*b*, respectively. A dummy select gate electrode 162A is formed adjacent isolation structure 106. Dummy gate stack 166A and boundary sidewall spacer 185A may have an upper surface 102 that is co-planar with an upper surface of at least one of control gate electrodes 138*a*, 138*b*; select gate electrodes 150*a*, 150*b*; and/or erase gate electrode 144.

A pair of control gate spacers 140 overlies each of the floating gate electrodes 134*a*, 134*b* and line opposite sidewalls of control gate electrodes 138*a*, 138*b*. Only one control gate spacer 140 is labeled. A select gate dielectric 156 separates select gate electrodes 150*a*, 150*b* from the semiconductor substrate 104, and a floating gate dielectric 158 separates the floating gate electrodes 134*a*, 134*b* from semiconductor substrate 104. A control gate dielectric 160 separates floating gate electrodes 134*a*, 134*b* from control gate electrodes 138*a*, 138*b*, respectively. In some embodiments, at least two of select gate dielectric 156, floating gate dielectric 158, and/or control gate dielectric 160 have the same composition and the same thickness as one another, but in other embodiments, each of select gate dielectric 156, floating gate dielectric 158, and control gate dielectric 160 have a different composition and/or a different thickness than the others.

Control gate electrodes 138a, 138b and floating gate electrodes 134a, 134b may be doped polysilicon, metal, another suitable conductive material(s), a combination of the foregoing, or the like. Control gate dielectric 160 may be or otherwise comprise, for example, nitride, oxide, another suitable dielectric(s), any combination of the foregoing, or the like. In some embodiments, control gate dielectric 160 comprises an ONO films, such that the control gate dielectric 160 includes a lower oxide layer, an upper oxide layer, and a middle nitride layer sandwiched between the lower an upper oxide layers. In some embodiments, control gate dielectric 160 is the same in thickness and composition as dummy gate dielectric layer 183. Likewise, in some embodiments, control gate electrodes 138 are the same in thickness and composition as dummy gate electrode layer 181.

Floating gate spacers 142 select gate electrodes 150a, 150b from floating gate electrodes 134a, 134b and control gate electrodes 138a, 138b. Floating gate spacers 142 overlie selectively-conductive memory channels 130a, 130b. Each floating gate spacers 142 lines a sidewall of one of the floating gate electrodes 134. Control gate spacers 140 and floating gate spacers 142 may have any suitable composition. Control gate spacers 140 may be or otherwise comprise, for example, nitride, oxide, another suitable dielectric(s), any combination of the foregoing, or the like. In some embodiments, control gate spacers 140 are each ONO films. Thus, control gate spacers 140 may include an oxide-nitride-oxide structure, with an outer oxide layer, middle-nitride layer, and an inner oxide layer. In other embodiments, control gate spacers 140 are homogeneous. Spacer 172 may have the same composition as control gate spacers 140.

Control gate spacers 140 may have lower most extents that extend below an uppermost surface of the floating gate electrodes 134a, 134b. Control gate spacers 140 may be conformal with respect to sidewalls of the floating gate electrodes 134a, 134b and control gate electrodes 138a, 138b, and may have rounded corners in the upper portion of the floating gate electrodes 134a, 134b. Sidewalls of spacers 140, 142 may be angled relative to an upper surface of the semiconductor substrate 104. In some embodiments, the angles are in the range between 25° and 89°. In some embodiments, the angles are in the range between 65° and 89°.

Select gate dielectric 156 may be or otherwise comprise, for example, oxide, nitride, another suitable dielectric(s), a combination of the foregoing, or the like. Select gate electrodes 150 may be or otherwise comprise, for example, doped polysilicon, metal, or another suitable conductive material(s), a combination of the foregoing, or the like. Erase gate dielectric layer 146 cups an underside of the erase gate electrode 144 to vertically space the erase gate electrode 144 from common memory source/drain region 128 and to laterally space erase gate electrode 144 from floating gate electrodes 134 and control gate spacers 140. Erase gate electrode 144 may have a concave upper surface, and may be doped polysilicon, metal, another suitable conductive material(s), a combination of the foregoing, or the like. Erase gate dielectric layer 146 may be or otherwise comprise, for example, oxide, nitride, or another suitable dielectric(s), a combination of the foregoing, or the like.

Semiconductor substrate 104 may be or otherwise comprise, for example, a bulk silicon substrate, a group III-V substrate, a silicon-on-insulator (SOI) substrate, another suitable semiconductor substrate(s), or the like. Isolation structure 106 is formed of dielectric material and may surround the memory region 104m. Isolation structure 106 may be a shallow trench isolation (STI) structure, a deep trench isolation (DTI) structure, another suitable isolation structure(s), a combination of the foregoing, or the like.

Logic region 104l of semiconductor substrate 104 includes a first logic device 110a and a second logic device 110b physically and electrically separated laterally by a logic isolation structure 310. Logic isolation structure 310 extends into a top of semiconductor substrate 104 and may be or otherwise comprise an STI structure, a DTI structure, or another suitable isolation structure(s). First and second logic devices 110a, 110b may be, for example, IGFET devices, MOSFET devices, DMOS devices, another suitable type of transistor, or another type of semiconductor device.

First and second logic devices 110a, 110b each comprise a pair of logic source/drain regions 312 and a selectively-conductive logic channel 322. The logic source/drain regions 312 associated with logic devices 110a, 110b are doped regions of semiconductor substrate 104 having a first doping type (e.g., p-type or n-type). The selectively-conductive logic channels 322 are in the top of the semiconductor substrate 104. Each selectively-conductive logic channels 322 is between and adjoins two logic source/drain regions 312. Selectively-conductive logic channels 322 have a second doping type (e.g., p-type or n-type) opposite the first doping type associated with logic source/drain regions 312 witch which the logic channels 322 are paired.

Logic gate dielectric layers 316a, logic gate dielectric layers 316b, and logic gate electrodes 318 are stacked over selectively-conductive logic channels 322. Second logic gate dielectric layers 316b overlie first logic gate dielectric layers 316a. Logic gate electrodes 318 overlie second logic gate dielectric layers 316b. Logic gate electrodes 318 may be or otherwise comprise, for example, doped polysilicon, metal, another suitable conductive material(s), any combination of the foregoing, or the like. First and second logic gate dielectric layer 316a, 316b may be or otherwise comprise, for example, nitride, oxide, a high κ dielectric, another suitable dielectric(s), any combination of the foregoing, or the like. In some embodiments, first logic gate dielectric layers 316a are oxides. In some embodiments, second logic gate dielectric layers 316b are a high κ dielectric. In some embodiments, logic gate electrodes 318 are metal. As used herein, a high κ dielectric is a dielectric material with a dielectric constant greater than about 7. A high κ dielectric may be a metal oxide or a silicate of hafnium (Hf), aluminum (Al), zirconium (Zr), lanthanum (La), magnesium (Mg), barium (Ba), titanium (Ti), lead (Pb), or the like. Examples of high κ dielectrics include $TiO_2$, $HfZrO$, $Ta_2O_3$, $HfSiO_4$, $ZrO_2$, and $ZrSiO_2$, or the like.

In some embodiments, logic sidewall spacers 320 line sidewalls of the logic gate electrodes 318 and second logic gate dielectric layer 316b. Logic sidewall spacers 320 may help contain a high κ dielectric used in logic devices 110. A dummy logic gate structure 189 is formed on isolation structure 106. Dummy logic gate structure 189 may include one or more layers corresponding in composition and/or thickness to layers in first and second logic devices 110a, 110b. Dummy logic gate structure 189 may have sidewall spacers 191 of the same composition as logic sidewall spacers 320. Dummy logic gate structure 189 may contribute to achieving uniform doping levels between logic source/drain regions 312 that are adjacent to isolation structure 106 and logic source/drain regions 312 that are more distant from isolation structure 106.

In some embodiments, contact vias 161 extend through an ILD layer 174 to source/drain regions 126 and 312. Contact vias 161 are conductive and may be tungsten, aluminum copper, copper, aluminum, another suitable metal(s) or other conductive material(s), a combination of the foregoing, or the like. The ILD layer 174 may be or otherwise comprise, for example, oxide, nitride, a low κ dielectric, another suitable dielectric(s), a combination of the foregoing, or the like. As used herein, a low κ dielectric is a dielectric material with a dielectric constant κ less than about 3.9.

Through tapered sidewall structure 187A, boundary sidewall spacer 185A provides a smooth sidewall for dummy gate stack 166A. If this smooth sidewall were not provided, voids in the side of dummy gate stack 166A might form during manufacturing and prevent containment of materials such as high κ dielectric used in second logic gate dielectric layer 316b. Boundary sidewall spacer 185A is formed above one or more layers of dummy gate dielectric layer 183. This structure allows dummy gate dielectric layer 183 to protect logic region 104l during processing to form tapered sidewall structure 187A. Processes that etch through dummy gate dielectric layer 183 may partially undermine boundary sidewall spacer 185A. But dummy gate dielectric layer 183 is very thin and any voids thereby created are easily closed by depositing a thin layer of dielectric such as a layer deposited to form logic gate dielectric layer 316a, particularly if that layer is for high voltage gates in logic region 104l. In some embodiments, some dielectric having the composition of first logic gate dielectric layers 316a is found underneath tapered sidewall structure 187A.

FIG. 2 provide a cross-sectional view an IC 200 that includes tapered sidewall structure 187B in accordance with some embodiments of the present disclosure. The description of IC 100 generally applies to IC 200 except for the following differences. While tapered sidewall structure 187B of IC 200 may have the same shape as tapered sidewall structure 187A of IC 100, tapered sidewall structure 187B is part of dummy gate electrode layer 181 rather than a distinct boundary sidewall spacer 185. Accordingly, tapered sidewall structure 187B terminates above isolation structure 106 by a distance approximately equal to the thickness of dummy gate dielectric layer 183. Memory region-facing side 201 of dummy gate electrode layer 181 may have been shaped by a masked etch whereas tapered sidewall structure 187B may have been shaped by an unmasked etch. Accordingly, in some embodiments tapered sidewall structure 187B has a much steeper profile than the logic region-facing side 201 of dummy gate electrode layer 181. In some embodiments, tapered sidewall structure 187B has a greater curvature than memory region-facing side 201 of dummy gate electrode layer 181. In some embodiments, dummy gate dielectric layer 183 separates at least some of the tapered portion of dummy gate electrode layer 181 that forms tapered sidewall structure 187B from isolation structure 106.

Although IC 200 may include a dummy logic gate 189 as shown in FIG. 1A, in this example IC 200 does not. On the other hand, IC 200 includes a dummy select gate electrode 162B that is formed on isolation structure 106 whereas IC 100 of FIG. 1A includes a dummy select gate electrode 162A that is adjacent to isolation structure 106. Forming dummy select gate electrode 162B on isolation structure 106 may reduce dishing during chemical mechanical polishing (CMP). Both a dummy select gate electrode 162A and a dummy logic gate 189 may be formed on isolation structure 106.

FIG. 3 provides a cross-sectional view of an IC 300 that includes a tapered sidewall structure 187C in accordance with another embodiments of the present disclosure. FIG. 3A provides an enlarged view of a portion of IC 300 identified in FIG. 3 that includes tapered sidewall structure 187C. The descriptions of IC 100, 200 generally apply to IC 300 excepting differences highlighted in the following description. In some embodiments, tapered sidewall structure 187C is part of a boundary sidewall spacer 185C and provides a smooth surface on a logic region-facing side of dummy gate stack 166C Like dummy gate stack 166A, dummy gate stack 166C is formed on isolation structure 106.

Dummy gate stack 166C includes one or more additional layers in comparison to dummy gate stack 166A. Those additional layers may include one or more hard mask layers. In this example, dummy gate stack 166C includes a lower hard mask layer 324 and an upper hard mask layer 326. Lower hard mask layer 324 and an upper hard mask layer 326 may be formed of any suitable materials. In some embodiments, lower hard mask layer 324 is a nitride hard mask. In some embodiments, upper hard mask layer 326 is an oxide hard mask. In some embodiments, these same hard mask layers are also found over control gate electrodes 138. These hard mask layers may also be formed over one or both of erase gate electrode 144 and select gate electrodes 150. For purposes of this description and the claims that follow, any dielectric layers that are stacked on dummy gate electrode layer 181 and are not inter-level dielectric layers may be considered hard mask layers. Dummy gate stack 166C may have additional dielectric barrier layers adjacent to or in place lower hard mask layer 324 and upper hard mask layer 326. These addition dielectric barrier layers may be etch stop layers, liner layers, or the like.

Boundary sidewall spacer 185C abuts, covers, and conforms to the shape of logic-region facing sidewalls of dummy gate stack 166C. With reference to FIG. 3A, these sidewalls include sidewall 331 of dummy gate electrode layer 181, sidewall 333 of lower hard mask layer 324, and sidewall 335 of upper hard mask layer 326. In some embodiments, dummy gate electrode layer 181 is set back (toward memory region 104m) relative to dummy gate dielectric layer 183. In some embodiments, one or both of sidewall 333 and sidewall 335, which are sidewalls of lower hard mask layer 324 and upper hard mask layer 326, are set back by a distance "d" relative to sidewall 331 of dummy gate electrode layer 181. In some embodiments, the setback distance "d" is between 100 and 5000 Angstroms. In some embodiments, at least part of sidewall 335 of upper hard mask layer 326 is set back relative to sidewall 335 of upper hard mask layer 326. In some embodiments, an upper corner 337 of sidewall 335, which is at the top of dummy gate stack 166C, is set back furthest. If these sidewalls were flush, upper corner 337 would be most likely to be exposed during etching to form boundary sidewall spacer 185C.

Like boundary sidewall spacer 185A, boundary sidewall spacer 185C is spaced above isolation structure 106. Tapered sidewall structure 187C terminates at a height that is above isolation structure 106 by a distance less than or equal to the thickness of dummy gate dielectric layer 183. In some embodiments, tapered sidewall structure 187C is formed of a single layer of material. FIG. 3B shows an IC 350 having a tapered sidewall structure 187D that is essentially the same tapered sidewall structure 187C of FIG. 3A but formed of two materials. In this case the lower portion of tapered sidewall structure 187D is formed by an extension of dummy gate electrode layer 181 while its upper portion is formed by a spacer 185D.

Where a tapered sidewall structure 187 according to the present disclosure is formed by multiple layers, the materials of the different layers are either the same or sufficiently similar in composition as to have nearly the same etch susceptibilities. The similarity in etch susceptibilities contributes to tapered sidewall structure 187 forming with a smooth profile. In some embodiments, the materials forming tapered sidewall structure 187 are dielectric. In some embodiments, the materials forming a tapered sidewall structure 187 are oxide (SiO$_2$). In some embodiments, the materials forming tapered sidewall structure 187 are nitride (SN). In some embodiments, the materials forming tapered sidewall structure 187 are silicon oxynitride. In some embodiments, the materials forming tapered sidewall structure 187 are conductive. In some embodiments, the materials forming tapered sidewall structure 187 are polysilicon. For example, both boundary sidewall spacer 185 and dummy control gate layer 181 may be polysilicon or the like. The materials of dummy gate electrode layer 181 form no part of tapered sidewall structure 187.

Figure 4:
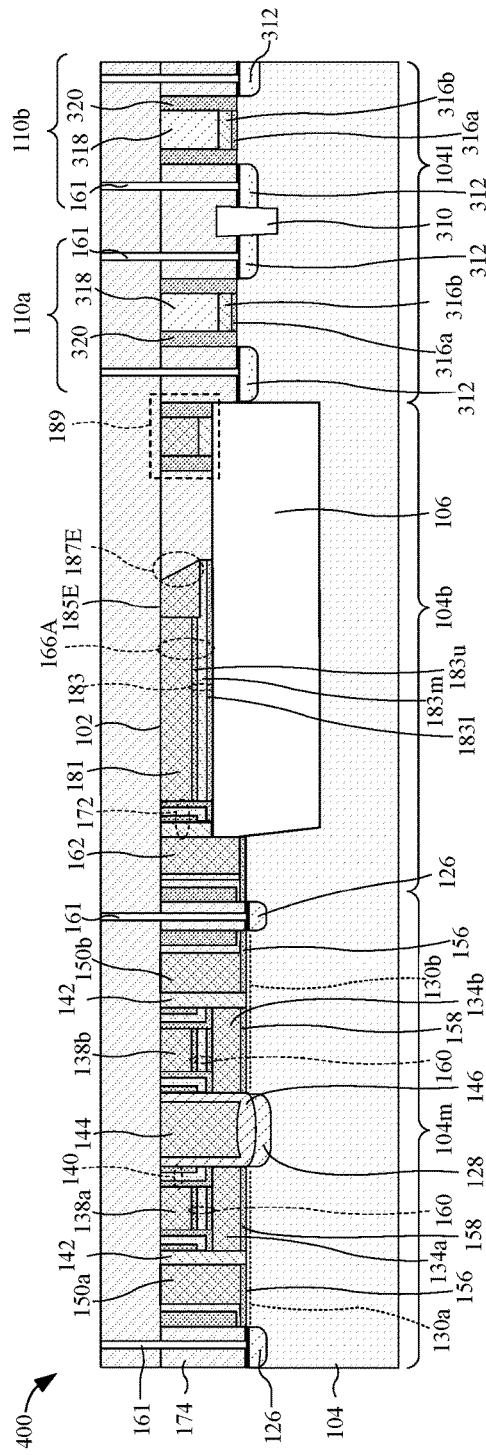
FIG. 4 illustrates a cross-sectional view of an IC according to other aspects of the present disclosure.

FIG. 4 illustrates a cross-sectional view of an IC 400 according to another embodiments of the present disclosure. The description of IC 100 generally applies to IC 400 excepting differences highlighted in the following description. IC 400 includes a boundary sidewall spacer 185E that forms a tapered sidewall structure 187E that provides a smooth sidewall for dummy gate stack 166A. In some embodiments, boundary sidewall spacer 185E is formed of a dielectric material. In some embodiments, dummy gate dielectric layer 183 includes a lower oxide layer 183*l*, an upper oxide layer 183*u*, and a middle nitride layer 183*m*. In some of embodiments, boundary sidewall spacer 185E comprises oxide and is on and in contact with middle nitride layer 183*m*. Upper oxide layer 183*u* has been removed to expose middle nitride layer 183*m* with an etch stopping on middle nitride layer 183*m*. The etch has removed a portion of middle nitride layer 183*m* as a result of which boundary sidewall spacer 185E appears sunken into nitride layer 183*m*. In some of embodiments, boundary sidewall spacer 185E comprises nitride and is on and in contact with upper oxide layer 183*u*. In some of embodiments, boundary sidewall spacer 185E comprises nitride and is on and in contact with lower oxide layer 183*l*.

Figure 5:
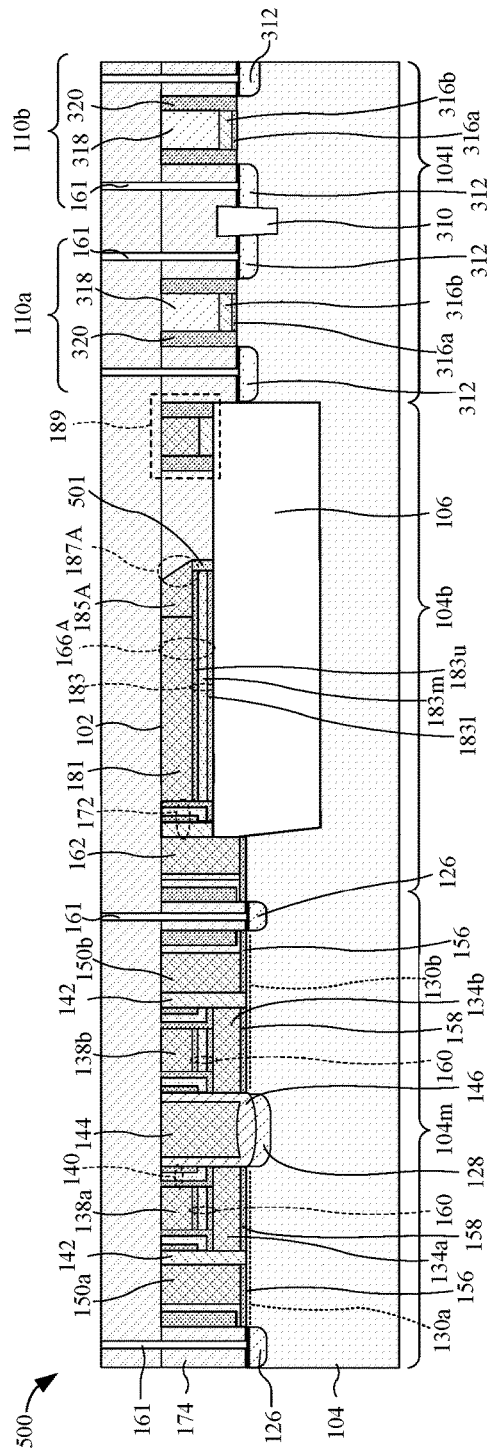
FIG. 5 illustrates a cross-sectional view of an IC according to other aspects of the present disclosure.

FIG. 5 illustrates a cross-sectional view of IC 500 according to another embodiments of the present disclosure. The description of IC 100 generally applies to IC 500 excepting differences highlighted in the following description. IC 500 includes a boundary sidewall spacer 185A that forms a tapered sidewall structure 187A that provides a smooth sidewall for dummy gate stack 166A. Boundary sidewall spacer 185A and tapered sidewall structure 187A are spaced from isolation structure 106 by a thickness less than or equal to the thickness of dummy gate dielectric layer 183. Boundary sidewall spacer 185A may be partially on dummy gate dielectric layer 183. In some embodiments, however, boundary sidewall spacer 185A and tapered sidewall structure 187A have been partially undermined by removal of some portion of dummy gate dielectric layer 183 after formation of boundary sidewall spacer 185A. In some embodiments, dielectric 501 has been deposited to fill space underneath tapered sidewall structure 187A from which dummy gate dielectric layer 183 has been removed. In some embodiments, dielectric 501 fills a space underneath boundary sidewall spacer 185A adjacent the logic region-facing side of dummy gate dielectric layer 183, which is the side furthest from memory region 104*m* and corresponds to the end toward which tapered sidewall structure 187A tapers. In some embodiments, dielectric 501 has the same composition as a dielectric 316*a* found in logic devices 110. In some embodiments, dielectric 501 is a dielectric used in high voltage gates found in logic region 104*l*.

FIGS. 6-44 provide a series of cross-sectional views 600-4400 that illustrate an integrated circuit device according to the present disclosure at various stages of manufacture according to a process of the present disclosure. Although FIGS. 6-44 are described in relation to a series of acts, it will be appreciated that the order of the acts may in some cases be altered and that this series of acts are applicable to structures other than the ones illustrated. In some embodiments, some of these acts may be omitted in whole or in part. Furthermore, FIGS. 6-44 are described in relation to a series of acts, it will be appreciated that the structures shown in FIGS. 6-44 are not limited to a method of manufacture but rather may stand alone as structures separate from the method.

As illustrated by the cross-sectional view 600 of FIG. 6, a isolation structure 106 is formed in a boundary region 104*b* of a semiconductor substrate 104. Boundary region 104*b* separates a memory region 104*m* of the semiconductor substrate 104 from a logic region 104*l* of the semiconductor substrate 104. Isolation structure 106 provides electrical separation between semiconductor devices in memory region 104*m* and semiconductor devices in logic region 104*l*. Semiconductor substrate 104 may have a stepped surface stepping up from the memory region 104*m* to the logic region 104*l*. In some cases, isolation structure 106 may have sidewalls that are angled differently from one another. This difference in angle may arise when an etch is performed to form a trench in semiconductor substrate 104 for isolation structure 106. When this etch is carried out, differences in dopant concentration on opposite sidewalls of the trench can cause one sidewall to be more vertical than the other. Isolation structure 106 may be or otherwise comprise, for example, a STI structure, a DTI structure, or another suitable isolation structure(s). Semiconductor substrate 104 may be or otherwise comprise, for example, a bulk silicon substrate, a SOI substrate, a group III-V substrate, another suitable semiconductor substrate(s). Semiconductor substrate 104 may also be a binary semiconductor substrate (e.g., GaAs), a tertiary semiconductor substrate (e.g., AlGaAs), a higher order semiconductor substrate.

Also illustrated by cross-sectional view 600 of FIG. 6, a logic isolation structure 310 is formed in logic region 104*l* to divide logic region 104*l* into a first logic region 104*l*/1 and a second logic region 104*l*/2. First logic region 104*l*/1 is laterally between isolation structure 106 and second logic region 104*l*/2. Second logic region 104*l*/2 may support core logic devices formed hereafter, whereas the first logic region 104*l*/1 may support high voltage logic devices formed hereafter. The high voltage logic devices may be logic devices configured to operate at higher voltages (e.g., an order of magnitude higher) than the core logic devices. Logic isolation structure 310 may be formed of dielectric material and may be a STI structure, a DTI structure, or another suitable isolation structure(s).

In some embodiments, a process of forming isolation structure 106 and logic isolation structure 310 includes forming a lower pad layer 402 covering semiconductor substrate 104 and an upper pad layer 404 covering lower pad layer 402. Lower and upper pad layers 402, 404 are of different materials and may be formed by chemical vapor deposition (CVD), physical vapor deposition (PVD), sputtering, thermal oxidation, or another suitable growth or deposition process(es). As used herein, a term (e.g., process) with a suffix of "(es)" may be singular or plural. Lower pad layer 402 may be oxide or another suitable dielectric(s).

Upper pad layer 404 may be nitride or another suitable dielectric(s). Lower and upper pad layers 402, 404 may be formed in trenches patterned with isolation structures 106, 310 providing masks. The trenches may be filled with dielectric(s) followed by planarization to produce the structure shown in cross-sectional view 600 of FIG. 6. The dielectric layers may be deposited by CVD, PVD, sputtering, or another suitable deposition process(es). The planarization process may be chemical mechanical polish (CMP) or another suitable planarization process(es).

As illustrated by the cross-sectional view 700 of FIG. 7, an etch may be performed to remove upper pad layer 404 and lower pad layer 402 from memory region 104m. A process for performing the removal may include forming and patterning a photoresist layer 701 to cover logic region 104l while leaving memory region 104m followed by etching with photoresist layer 701 in place to remove upper pad layer 404 and lower pad layer 402 from the memory region 104m. Thereafter, photoresist layer 701 may be stripped.

Figure 8:
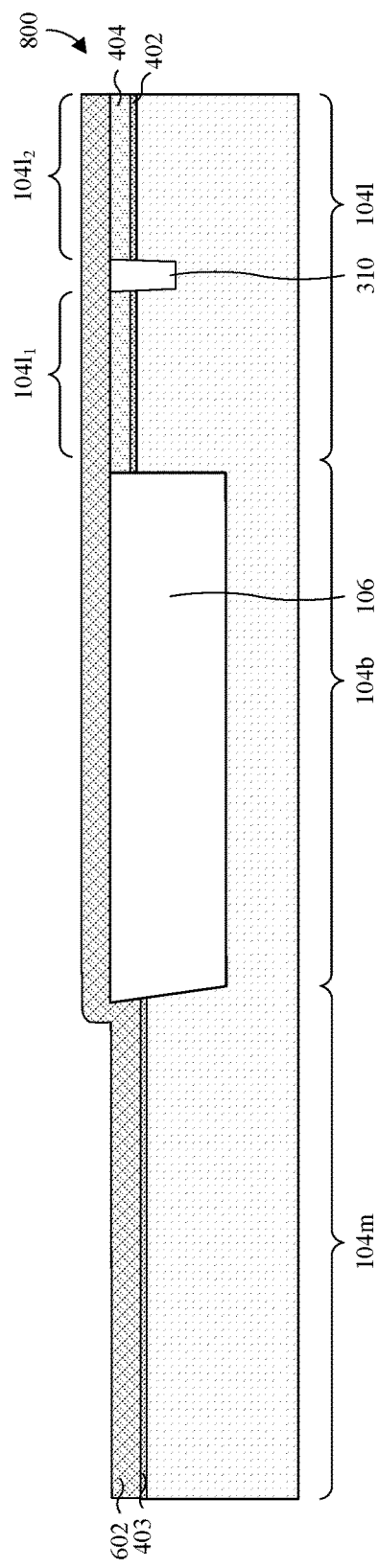

As illustrated by the cross-sectional view 800 of FIG. 8, a gate oxide 403 may then be grown on the exposed portion of semiconductor substrate 104 in memory region 104m. A floating gate layer 602 may then be formed covering memory region 104m, boundary region 104b, and logic region 104l. Floating gate layer 602 may be formed conformally and may be doped polysilicon or another suitable conductive material(s). Floating gate layer 602 may be formed by CVD, PVD, sputtering, or another suitable deposition process(es).

Figure 9:
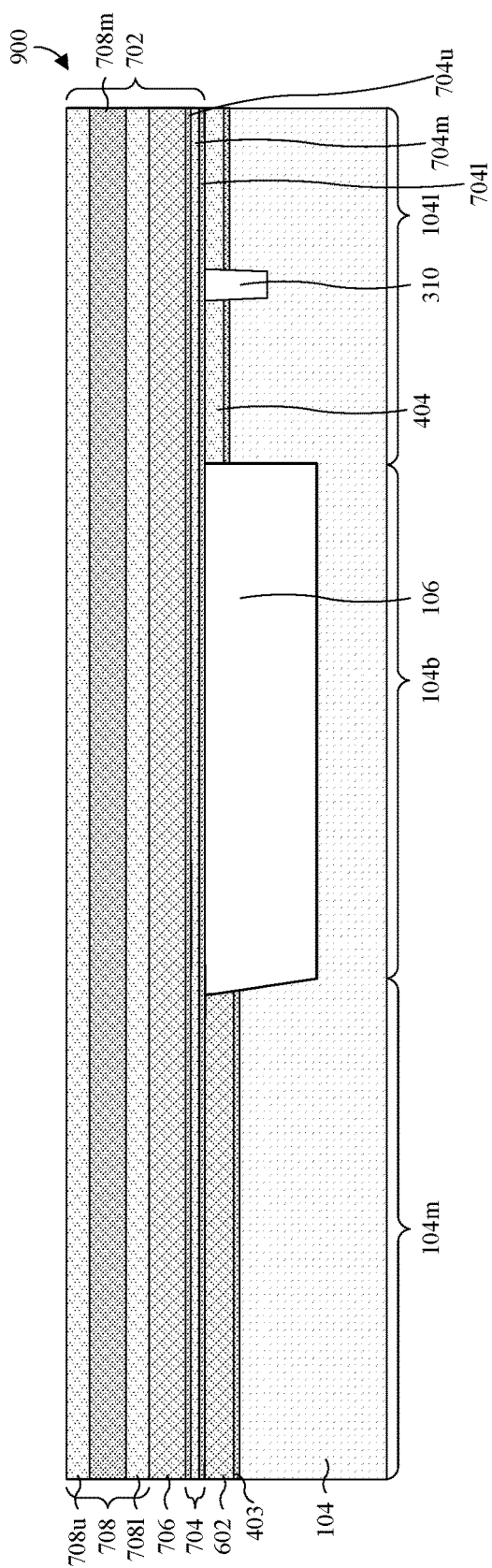

As illustrated by the cross-sectional view 900 of FIG. 9, a planarization may be performed stopping on isolation structure 106 to remove floating gate layer 602 from isolation structure 106 and logic region 104l. The planarization recesses a topmost surface of floating gate layer 602 to about even with a topmost surface of isolation structure 106 and upper pad layer 404 in logic region 104l. The planarization may be CMP or another suitable planarization process(es).

As further illustrated by cross-sectional view 900 of FIG. 9, a control gate stack 702 may be formed over the planarized surface in memory region 104m, boundary region 104b, and logic region 104l. Control gate stack 702 includes a control gate dielectric layer 704, a control gate electrode layer 706, and a control gate hard mask 708. Control gate dielectric layer 704 covers floating gate layer 602. Control gate dielectric layer 704 may include oxide, nitride, another suitable dielectric(s), any combination of the foregoing, or the like. Control gate dielectric layer 704 may include multiple layers of different dielectrics. In some embodiments, control gate dielectric layer 704 is a charge trapping dielectric. In some embodiments, control gate dielectric layer 704 includes an ONO film having a lower oxide layer 704l, a middle nitride layer 704m covering lower oxide layer 704l, and an upper oxide layer 704u covering middle nitride layer 704m. Control gate dielectric layer 704 may be formed by CVD, PVD, another suitable deposition process(es), any combination of the foregoing, or the like.

Control gate dielectric layer 704 is very thin. In some embodiments, lower oxide layer 704l has a thickness in the range from 10-100 Angstroms. In some embodiments, lower oxide layer 704l has a thickness in the range from 20-50 Angstroms. In some embodiments, lower oxide layer 704l has a thickness of about 40 Angstroms. In some embodiments, middle nitride layer 704m has a thickness in the range from 25-200 Angstroms. In some embodiments, middle nitride layer 704m has a thickness in the range from 50-100 Angstroms. In some embodiments, middle nitride layer 704m has a thickness of about 80 Angstroms. In some embodiments, upper oxide layer 704u has a thickness in the range from 10-100 Angstroms. In some embodiments, upper oxide layer 704u has a thickness in the range from 20-50 Angstroms. In some embodiments, upper oxide layer 704u has a thickness of about 40 Angstroms. In some embodiments, the total thickness of dielectric layer 704 is in the range from 25-400 Angstroms. In some embodiments, the total thickness of dielectric layer 704 is in the range from 50-200 Angstroms.

Control gate electrode layer 706 may be formed conformally and may be formed of doped polysilicon or another suitable conductive material(s). In some embodiments, a process of forming control gate electrode layer 706 includes depositing a material, implanting dopants into the material, and annealing to activate the dopants. The material of control gate electrode layer 706 may be deposited by CVD, PVD, or another suitable deposition process(es). In some embodiments, control gate electrode layer 706 has a thickness in the range from 600-2000 Angstroms. In some embodiments, control gate electrode layer 706 has a thickness in the range from 300-1000 Angstroms. In some embodiments, control gate electrode layer 706 has a thickness of about 600 Angstroms.

Control gate hard mask 708 may include multiple layers of differing materials. Control gate hard mask 708 may include oxide, nitride, or other suitable materials. In some embodiments, control gate hard mask 708 includes an oxide layer 708m over a first nitride layer 708l. In some embodiments, the thicknesses of these layers are in the range from 100 to 1400 Angstroms. In some embodiments, the thicknesses of these layers are in the range from 200 to 700 Angstroms for example. In some embodiments, these layers are about 400 Angstroms thick. In some embodiments, control gate hard mask 708 further includes a second nitride layer 708u over oxide layer 708m. Control gate hard mask 708 may be formed by CVD, PVD, another suitable deposition process(es), any combination of the foregoing, or the like.

As illustrated by the cross-sectional view 1000 of FIG. 10, a selective etch may be performed to remove portions of control gate stack 702 from memory region 104m, thereby forming a pair of a pair of control gate hard masks 210, a pair of control gate electrodes 138, and a pair of control gate dielectric 160 over floating gate layer 602. The selective etch leaves a dummy gate stack 166 on isolation structure 106. In some embodiments, a process for performing the selective etch includes forming and patterning a photoresist layer 1001. Photoresist layer 1001 may be patterned to cover logic region 104l, a portion of boundary region 104b, and portions of memory region 104m that form a negative image of control gate electrodes 138. Etch processes may then be applied with photoresist layer 1001 in place until floating gate layer 602 is exposed. Photoresist layer 1001 may then be stripped.

The dummy gate stack 166 left on isolation structure 106 includes a dummy gate electrode layer 181 and a dummy gate dielectric layer 183. Dummy gate electrode layer 181 has the same thickness and composition as control gate electrodes 138 and dummy gate dielectric layer 183 has the same thickness and composition as control gate dielectric 160. In some embodiments, dummy gate dielectric layer 183 include an upper oxide layer 183u corresponding to upper oxide layer 704u, a middle nitride layer 183m corresponding to middle nitride layer 704m, and a lower oxide layer 183l corresponding to lower oxide layer 704l.

As illustrated by the cross-sectional view 1100 of FIG. 11, a control gate spacer layer 902 may be formed covering and lining the structure illustrated by the cross-sectional view 1000 of FIG. 10. Control gate spacer layer 902 may be formed conformally over control gate electrodes 138 and the dummy gate stack 166. Control gate spacer layer 902 may have any suitable composition. Control gate spacer layer 902 may be of oxide, nitride, another suitable dielectric(s), any combination of the foregoing, or the like. In some embodiments, control gate spacer layer 902 is or includes an ONO film, for example, a lower oxide layer 902*l*, a middle nitride layer 902*m*, and an upper oxide layer 902*u*. Control gate spacer layer 902 may be formed by CVD, PVD, or another suitable deposition process(es).

Figure 12:
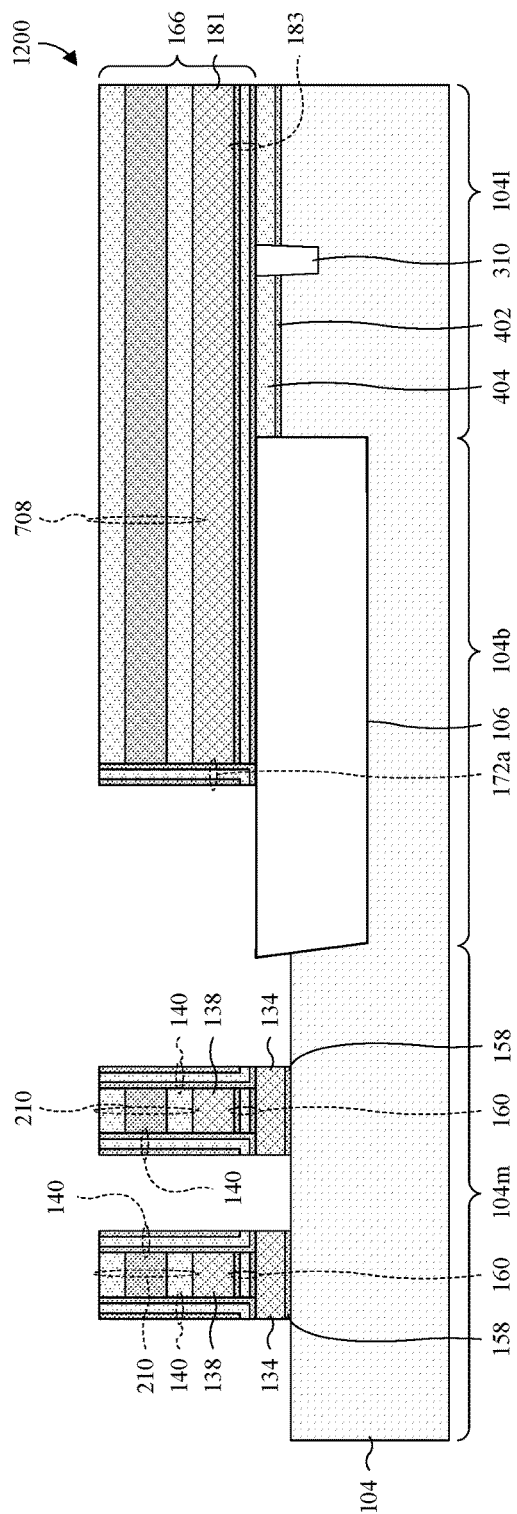

As illustrated by the cross-sectional view 1200 of FIG. 12, an etch is performed to form control gate spacers 140 from control gate spacer layer 902 (see FIG. 11). Control gate spacers 140 cover sidewall of control gate electrodes 138. The etch also forms a sidewall spacer 172*a* along a sidewall of dummy gate stack 166 that faces memory region 104*m*. In some embodiments, sidewall spacer 172*a* overlies isolation structure 106. The etch process may include plasma etching or any other suitable etch process(es) that selectively removes control gate spacer layer 902 where it is thinnest with respect to the vertical. Control gate spacers 140 and sidewall spacer 172*a* are shown with vertical sidewalls for ease of illustration. More typically, these spacers are rounded at the top and form smoothly tapering sidewall surfaces. Also illustrated by the cross-sectional view 1200 of FIG. 12, an etch may be performed into floating gate layer 602 (see FIG. 11) and gate oxide 403 to form a pair of floating gate electrodes 134 and a pair of floating gate dielectric 158. Control gate spacers 140 and control gate hard masks 210 may serve as a mask for this etch.

Figure 13:
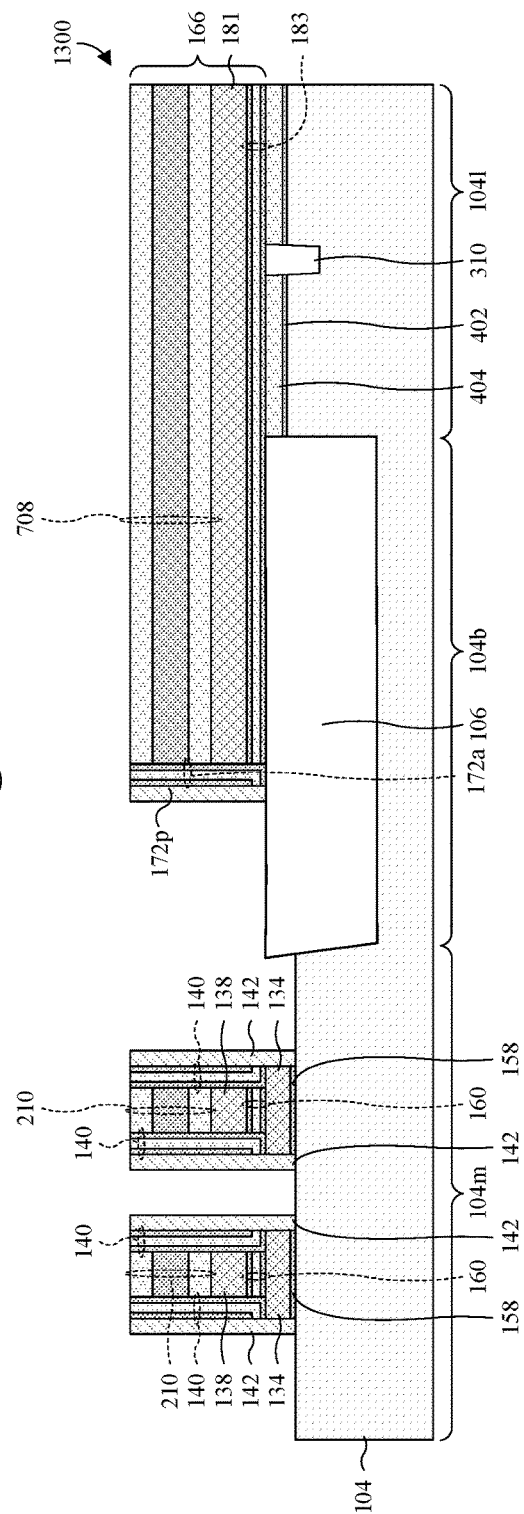

As illustrated by the cross-sectional view 1300 of FIG. 13, floating gate spacers 142 may be formed on sidewalls of floating gate electrodes 134 and control gate spacers 140. An outer dummy gate spacer 172*p* may also be formed on an outer sidewall of sidewall spacer 172*a*. Floating gate spacers 142 and outer dummy gate spacer 172*p* may be oxide or another suitable dielectric(s). A process of forming floating gate spacers 142 and outer dummy gate spacer 172*p* may include depositing a floating gate spacer layer over the structure illustrated by the cross-sectional view 1200 of FIG. 12 followed by plasma etching or any other suitable etch process(es) that selectively removes the floating gate spacer layer where it is thinnest with respect to the vertical. The floating gate spacer layer may be deposited conformally by CVD, PVD, or another suitable deposition process(es). Floating gate spacers 142 and outer dummy gate spacer 172*p* are shown with vertical sidewalls for ease of illustration. More typically, these sidewalls are rounded at the top and form smoothly tapering sidewall surfaces.

As illustrated by the cross-sectional view 1400 of FIG. 14, a common memory source/drain region 128 may be formed in semiconductor substrate 104 laterally between floating gate electrodes 134. A process of forming common memory source/drain region 128 may include forming and patterning a photoresist layer 1401 covering logic and boundary regions 104*l*, 104*b*, and further covering memory region 104*m* outside a common source/drain gap 1204. Ion implantation or another suitable doping process(es) may be performed with photoresist layer 1401 in place. Photoresist layer 1401 may be patterned using photolithography.

As illustrated by the cross-sectional view 1500 of FIG. 15, floating gate spacers 142 within common source/drain gap 1204 may be removed. A process for removing floating gate spacers 142 may include etching with photoresist layer 1401 in place. Photoresist layer 1401 may thereafter be stripped.

Figure 16:
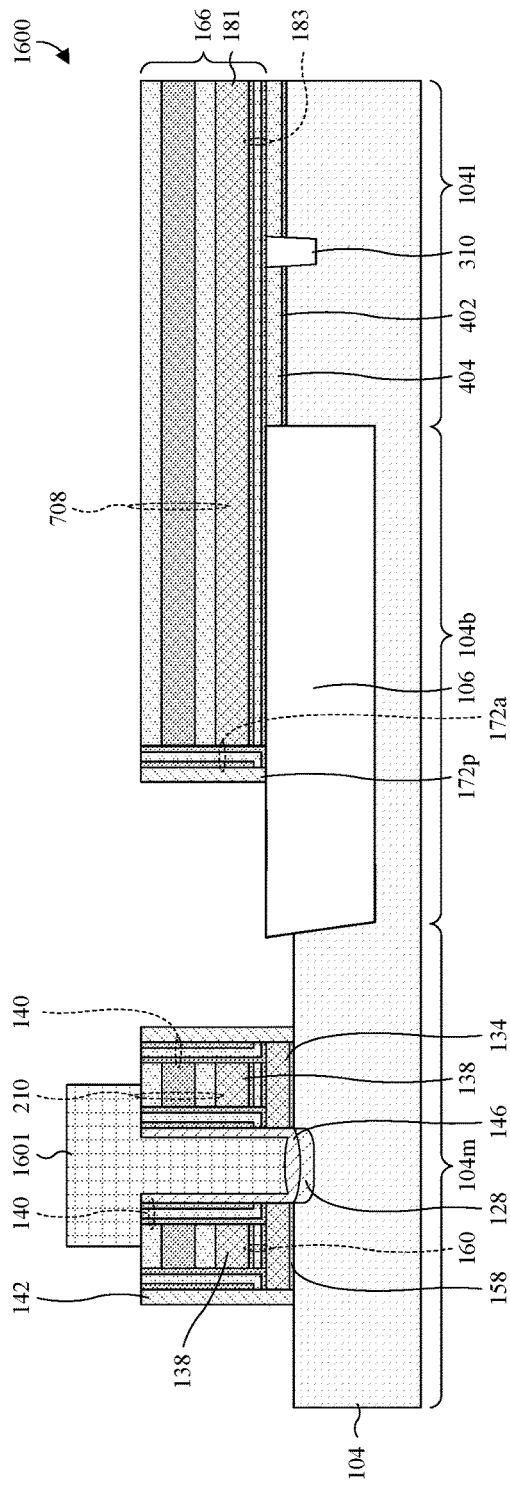

As illustrated by the cross-sectional view 1600 of FIG. 16, an erase gate dielectric layer 146 may be formed covering common memory source/drain region 128 and lining sidewalls of floating gate electrodes 134 and sidewalls of control gate spacers 140 within common source/drain gap 1204 (see FIG. 15). Erase gate dielectric layer 146 may be formed of oxide, nitride, or another suitable dielectric(s). A process of forming erase gate dielectric layer 146 may include high temperature oxidation (HTO), in situ steam generation (ISSG) oxidation, another suitable deposition or growth process(es), any combination of the foregoing, or the like. In some embodiments, erase gate dielectric 146 develops a curved or bulbous surface profile due to ion implantation in common memory source/drain region 128. The central region of common memory source/drain region 128 receives a larger dose of dopants and as a result undergoes more damage than the peripheral region of the common memory source/drain region 128. The oxide may consequentially grow more rapidly in the central region as compared to the peripheral region. The dielectric material that forms outside common source/drain gap 1204 may be removed with a selective etch. A photoresist layer 1601 for this etch may be formed and patterned to cover common memory source/drain region 128 and overhanging control gate hard masks 210. After etching, photoresist layer 1601 may be stripped.

Figure 17:
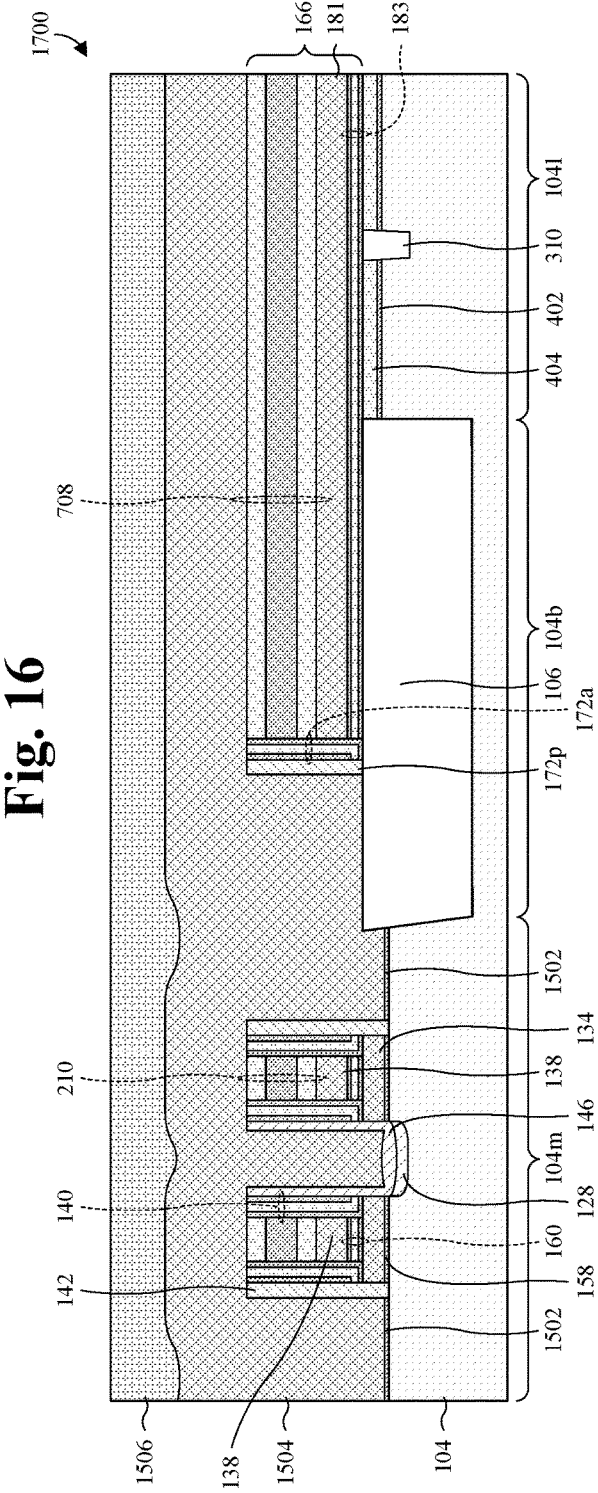

As illustrated by the cross-sectional view 1700 of FIG. 17, a memory dielectric layer 1502 may be formed over portions of memory region 104*m* outside floating gate electrodes 134 and common memory source/drain region 128. Memory dielectric layer 1502 may be oxide, nitride, or another suitable dielectric(s). Memory dielectric layer 1502 may be formed by HTO, ISSG oxidation, another suitable deposition or growth process(es), any combination of the foregoing, or the like.

Also illustrated by the cross-sectional view 1700 of FIG. 17, a select gate layer 1504 may be formed covering memory dielectric layer 1502 and other structures in memory, logic, and boundary regions 104*m*, 104*l*, 104*b*. Select gate layer 1504 may be formed of doped polysilicon, metal, or another suitable conductive material(s) and may be formed by CVD, PVD, or another suitable deposition process(es). Cross-sectional view 1700 of FIG. 17 also illustrates a memory antireflective coating (ARC) 1506 formed over select gate layer 1504. Memory ARC 1506 may be formed with a top surface that is planar or substantially planar. Memory ARC 1506 may be deposited, for example, via a spin-on process where a wafer of semiconductor substrate 104 is spun about its center while a liquid ARC coating is on the wafer surface. Because of its flowability, the liquid ARC coating tends to develop a level surface. After the liquid ARC coating is spun-on, a baking step may be carried out to harden memory ARC 1506.

As illustrated by the cross-sectional view 1800 of FIG. 18, a process(es) may be carried out to remove memory ARC 1506 (see FIG. 17) and to thin select gate layer 1504 until its upper surface is about even with the upper surfaces of control gate electrodes 138. This process forms erase gate electrode 144. The removal and thinning may be carried out with an etch process(es) for which memory ARC 1506 and select gate layer 1504 have approximately equal susceptibilities. Memory ARC 1506 may be etched back until select gate layer 1504 is exposed after which select gate layer 1504 and memory ARC 1506 may be etched back together until memory ARC 1506 is completely removed. Select gate layer 1504 may then be etched back until its top surface is about even with top surfaces of the control gate electrodes 138. The etch process leaves the recessed select gate layer 1504 with a substantially planar surface. Dopants may be implanted into the select gate layer 1504 after the etch followed by an anneal to activate the dopants.

As illustrated by cross-sectional view 1900 of FIG. 19, a memory hard mask layer 1702 may be formed conformally over the structure illustrated by cross-sectional view 1800 of FIG. 18. Memory hard mask layer 1702 may be formed of nitride, oxide, or another suitable hard mask material(s). Memory hard mask layer 1702 may be formed by CVD, PVD, or another suitable deposition process(es).

Figure 20:
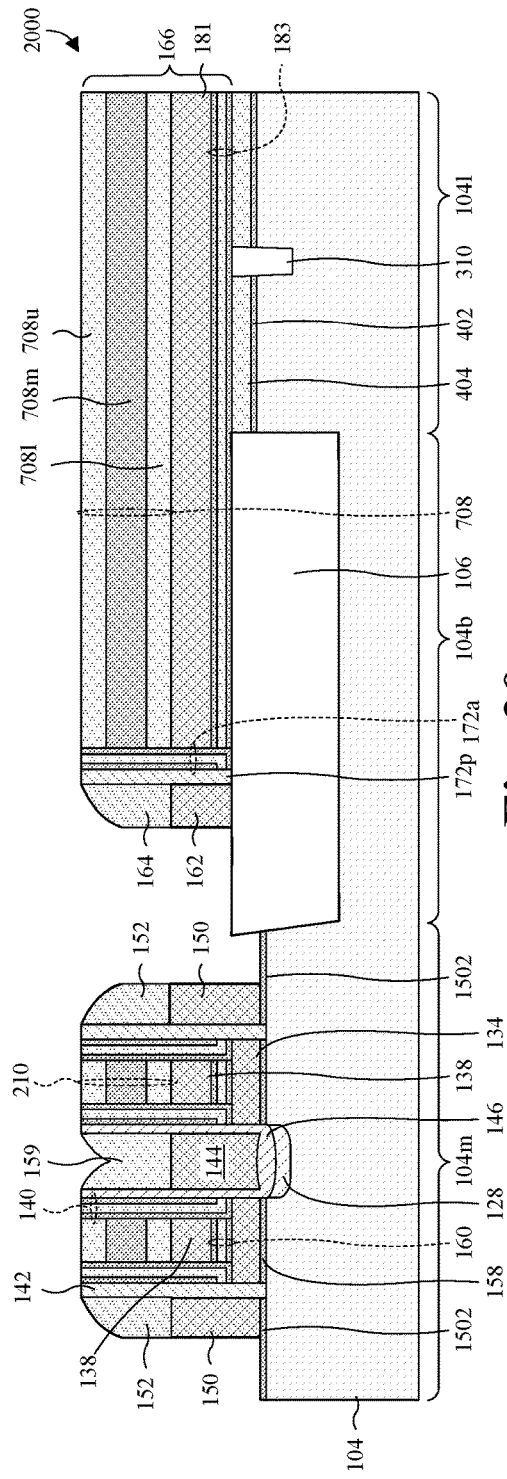

As illustrated by the cross-sectional view 2000 of FIG. 20, an etch may be used to form a pair of select gate hard masks 152, an erase gate hard mask 159, and a dummy select gate hard mask 164 from memory hard mask layer 1702 (see FIG. 19). Select gate hard masks 152 cover sides of floating gate electrodes opposite common memory source/drain region 128. Erase gate hard mask 159 covers common memory source/drain region 128. Dummy select gate hard mask 164 forms over isolation structure 106. The etch process does not require a mask. The desired structure may be formed by removing memory hard mask layer 1702 where it is thinnest with respect to the vertical.

Also illustrated by the cross-sectional view 2000 of FIG. 20, another etch may be performed to pattern select gate electrodes 150 and a dummy select gate electrode 162 from select gate layer 1504 (see FIG. 19). Select gate hard masks 152, erase gate hard mask 159, and dummy select gate hard mask 164 may provide masks for this etch. Although not shown in the illustrations, this etching may partially remove the hard masks.

Figure 21:
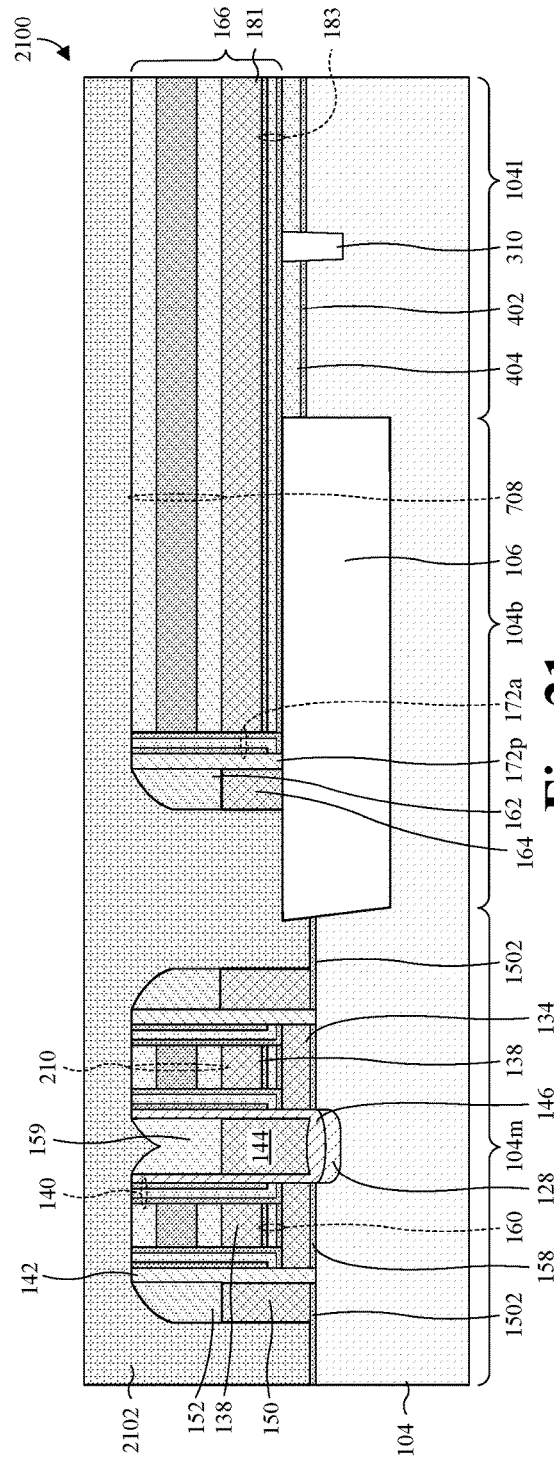

As illustrated by the cross-sectional view 2100 of FIG. 21, a first hard mask ARC 2102 may be formed over the structure illustrated by the cross-sectional view 2000 of FIG. 20. First hard mask ARC 2102 may be formed with a top surface that is planar or substantially planar. As shown by the cross-sectional view 2200 of FIG. 22, a non-selective etch back process may then be used to recesses an uppermost portion of the structure illustrated by the cross-sectional view 2000 of FIG. 20. The etch back process may stop on or in control gate hard mask 708. In some embodiments, control gate hard mask 708 includes a second nitride layer 708$u$ that is completely removed by the etch back process. In some embodiments, the etch back proceeds stopes in oxide layer 708$m$ as shown by cross-sectional view 2200 of FIG. 22. In some embodiments, the etch back proceeds through oxide layer 708$m$ and stops on or in first nitride layer 708$l$. After the etch back process, first hard mask ARC 2102 may be removed as shown by the cross-sectional view 2300 of FIG. 23.

Figure 24:
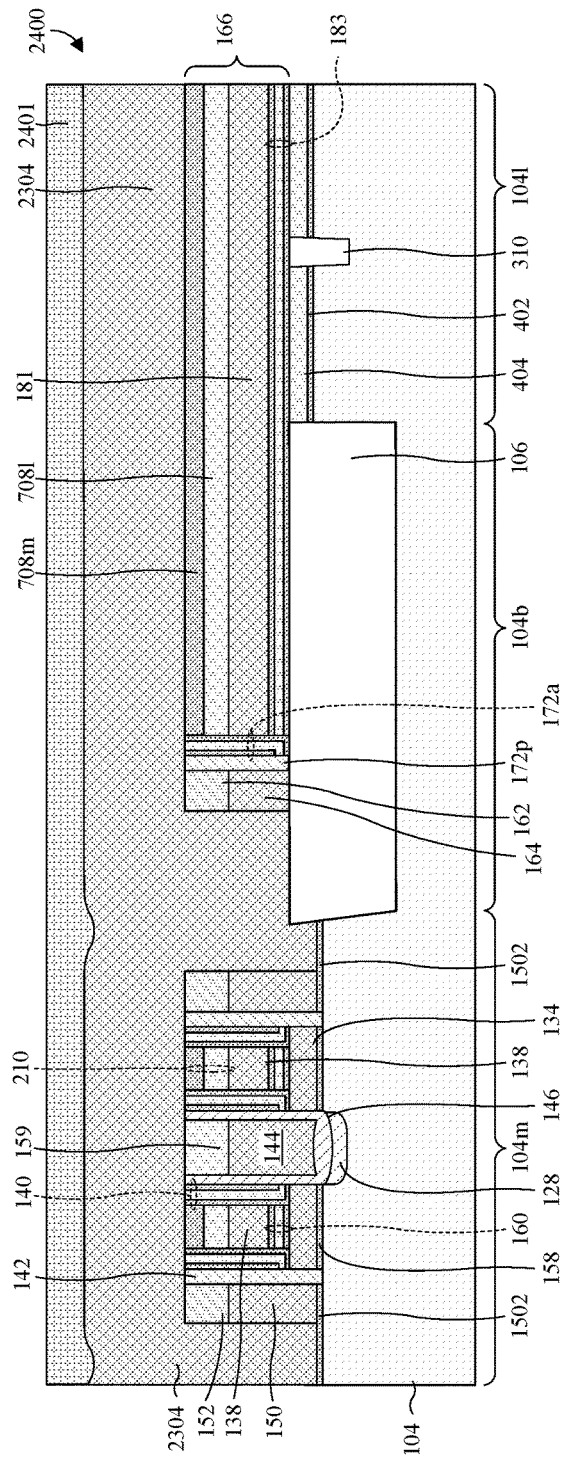

As illustrated by the cross-sectional view 2400 of FIG. 24, a first dummy capping layer 2304 over the structure illustrated by cross-sectional view 2300 of FIG. 23 and a bottom anti-reflective coating (BARC) 2401 may be formed over first dummy capping layer 2304. In some embodiments, first dummy capping layer 2304 is polysilicon, although another suitable material(s) may be used instead. First dummy capping layer 2304 may partially conform to the surface it covers. Dummy capping layer 2304 may be formed by CVD, PVD, another suitable deposition process(es), any combination of the foregoing, or the like. BARC 2401 may be formed from a liquid coating that is spun on over dummy capping layer 2304 to provide a top surface that is planar or substantially planar. After dummy BARC 2401 is spun-on, a baking step may be carried out to harden the dummy BARC 2401.

Figure 25:
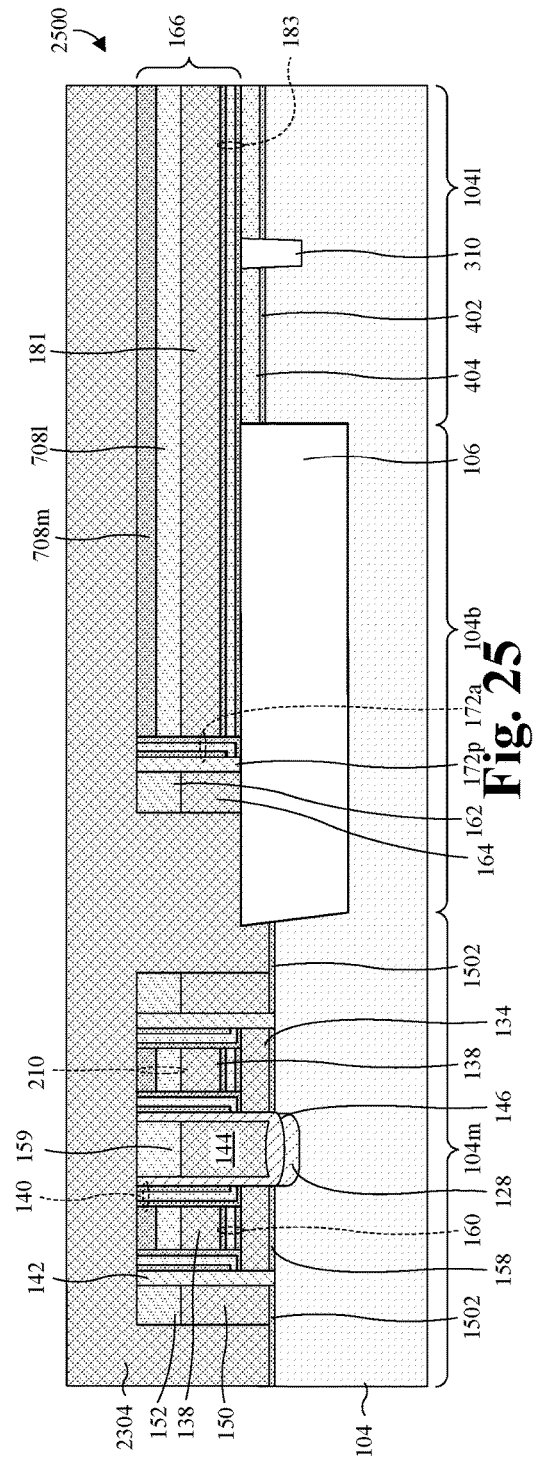

As illustrated by the cross-sectional view 2500 of FIG. 25, a process may be carried out to remove dummy BARC 2401 (see FIG. 24) and leave first dummy capping layer 2304 with a substantially planar surface. The process may be an etch under which dummy BARC 2401 and first dummy capping layer 2304 have very similar etch rates. Initially, the etch proceeds through dummy BARC 2401 until first dummy capping layer 2304 is exposed. The etch continues simultaneously etching dummy BARC 2401 and first dummy capping layer 2304 until dummy BARC 2401 is completely removed. This etch process may leave first dummy capping layer 2304 with a well-defined thickness over control gate stack 702. In some embodiments, that thickness is in the range from 100 to 10,000 Angstroms, e.g., 1600 Angstroms.

Figure 26:
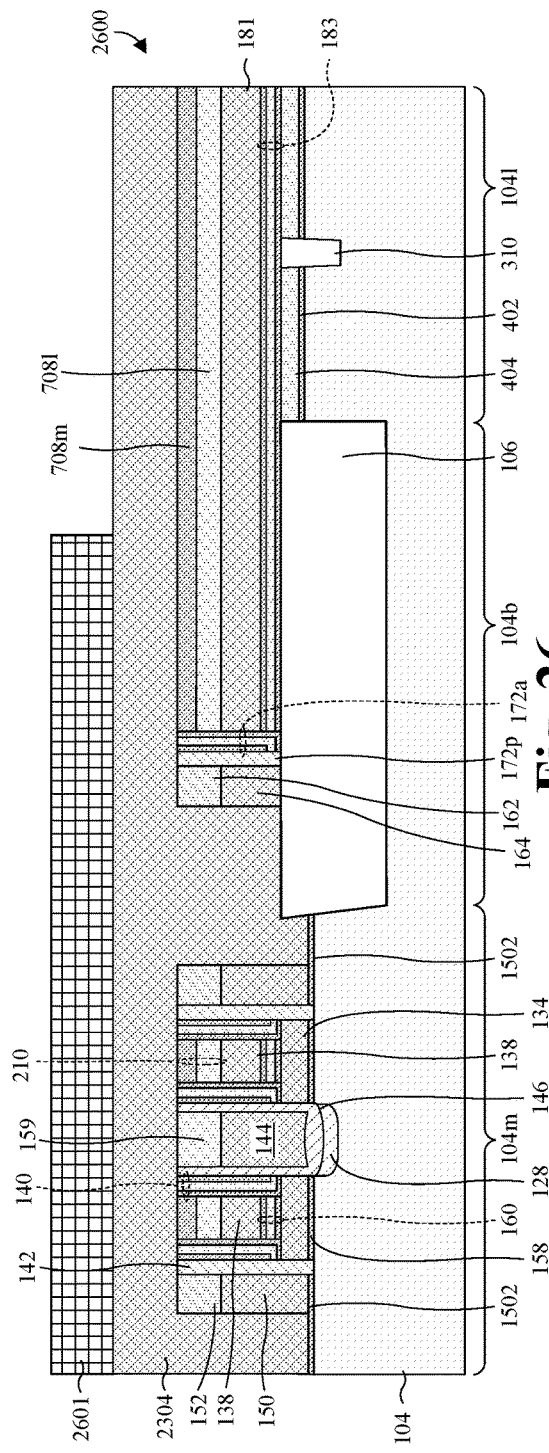

As illustrated by the cross-sectional view 2600 of FIG. 26, a photoresist mask 2601 may be formed and patterned over first dummy capping layer 2304. Like other photoresist masks, photoresist mask 2601 may be formed by a process that includes spin-coating or otherwise forming a photoresist on a surface of the structure, selectively exposing the photoresist to light through a reticle or other photolithographic mask, and removing the exposed or unexposed portion using a chemical developer.

Figure 27:
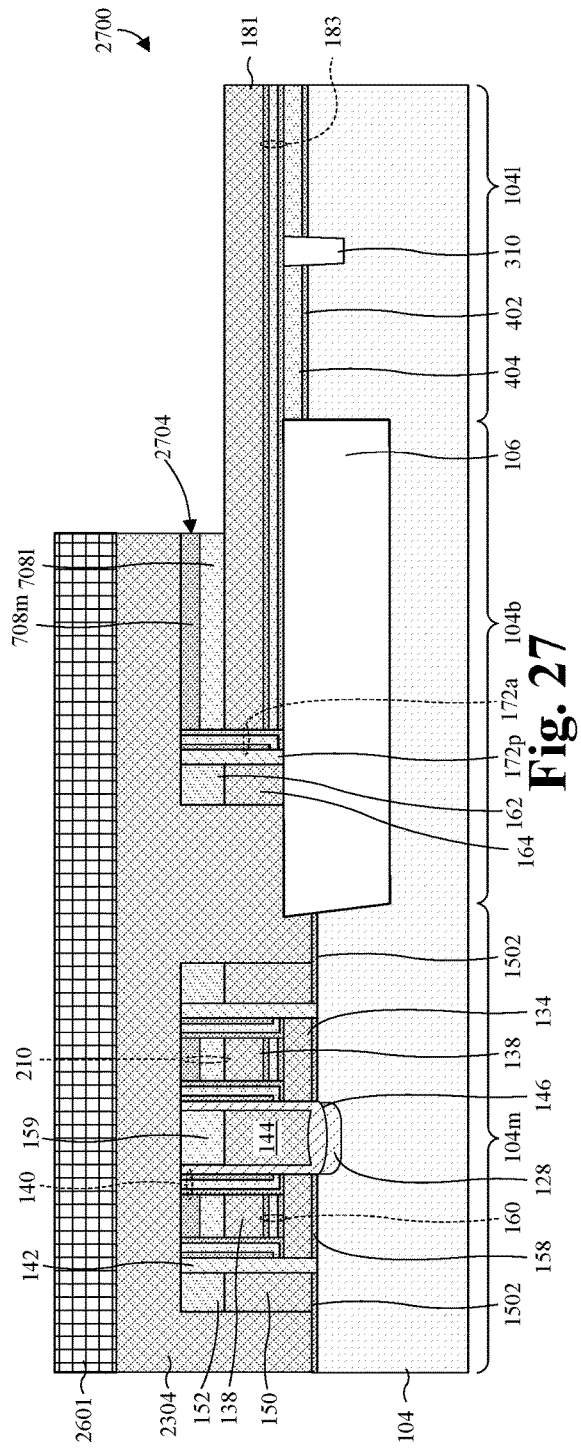

As illustrated by the cross-sectional view 2700 of FIG. 27, an etch may be performed through first dummy capping layer 2304, dummy liner layer 304, and into dummy gate stack 166. This etch may include one or more isotropic etch process(es). Photoresist mask 2601 may restrict the etching to logic region 104$l$ and a portion of boundary region 104$b$ on the side of logic region 104$l$. The etch proceeds through as many layers of control gate hard mask 708 as remain after the planarization process illustrated by the transition from cross-sectional view 2100 of FIG. 21 to cross-sectional view 2200 of FIG. 22. The etch produces sidewall 2704 over isolation structure 106. In some embodiments, sidewall 2704 includes a lower nitride layer and an oxide layer over the nitride layer. In the example illustrated by cross-sectional view 2700 of FIG. 27, the lower nitride layer is first nitride layer 708$l$ of control gate hard mask 708 and the oxide layer over that nitride layer is oxide layer 708$m$. In some embodiments, sidewall 2704 includes first nitride layer 708$l$ and an oxide liner layer formed after etching through oxide layer 708$m$. Sidewall 2704 may have additional dielectric barrier layers adjacent to or in place first nitride layer 708$l$ and oxide layer 708$m$. The dielectric layers may be hard mask layers, etch stop layers, liner layers, or the like. In some embodiments, these layers have thicknesses in the range from 100 Angstroms to 1000 Angstroms. After the etching that forms sidewall 2704, photoresist mask 2601 may be removed. Like other photoresist masks, photoresist mask 2601 may be removed by full exposure and development, etching, ashing, or any other suitable removal process(es).

As illustrated by the cross-sectional view 2800 of FIG. 28, in accordance with some aspects of the present disclosure, an etch may be performed to recess the layers between first dummy capping layer 2304 and dummy gate electrode layer 181 into sidewall 2704. In some embodiments, oxide and nitride layers are recessed relative to first dummy capping layer 2304, which may be polysilicon. In some embodiments, the recessed layers include oxide and nitride layers. The recess nitride layers may include first nitride layer 708$l$ of control gate hard mask 708. The recess oxide layer may include oxide layer 708$m$ of control gate hard mask 708 and/or dummy liner layer 304. According to some aspects of the present teachings, the etch back process is an anisotropic etch process. In some embodiments the etch process is a wet etch process. A suitable wet etch process may include etching with hydrofluoric acid (HF). Another example of a suitable anisotropic etch process is an etch with vapors of HF for the oxide and $H_3PO_4$ for the nitride. The etch process may have a higher etch rate for the uppermost of the layers being etched back to produce a recessed upper corner 337 shown in FIG. 28. For example, recessed upper corner 337 may be produced by an etch process for which oxide layers have a greater susceptibility that nitride layer. The etch process may provide conditions under which oxides may have two or more times the etch rate of the nitrides. Recessing these layers may prevent their being exposed at a later stage of processing.

In some embodiments, as illustrated by the cross-sectional view 2900 of FIG. 29, another etch is carried out at this stage of processing to extend sidewall 2704 through dummy gate electrode layer 181 and to remove dummy gate electrode layer 181 from logic region 104*l*. In some embodiments, this etch step is skipped and dummy gate electrode layer 181 is removed from logic region 104*l* at a later stage of processing. This etch may reduce the thickness of first dummy capping layer 2304, but does not remove first dummy capping layer 2304. This etch may be an isotropic etch such as a dry etch with plasma, whereby dummy gate electrode layer 181 does not recess significantly into sidewall 2704. The etch process stops on or in dummy gate dielectric layer 183. Where dummy gate dielectric layer 183 is constituted by multiple layers of differing materials, the etch may stop on any suitable layer. When an etch stops on a layer, that layer is often etched into to some degree before the etch process concludes.

If dummy gate electrode layer 181 is polysilicon, a suitable etch process may use fluorine chemistry. Fluorine chemistry may use a plasma generated with tetrafluoromethane (CF4), fluoroform (CHF3), difluoromethane (e.g., CH2F2), sulfur hexafluoride (SF6), hexafluoroethane (C2F6), hexafluoropropylene (C3F6), octafluorocyclobutane (C4F8), perfluorocyclopentene (C5F8), another suitable fluorine compound(s), any combination of the foregoing, or the like. Argon, oxygen, and other suitable gases may also be included in the etch chemistry.

As illustrated by the cross-sectional view 3000 of FIG. 30, a sidewall spacer layer 3001 may be formed covering sidewall 2704, first dummy capping layer 2304, isolation structure 106, and logic region 104*l*. Sidewall spacer layer 3001 may be formed of any suitable material(s). In some embodiments, sidewall spacer layer 3001 is polysilicon. In some embodiments, sidewall spacer layer 3001 is dielectric material. In some embodiments, sidewall spacer layer 3001 is oxide, nitride, or silicon oxynitride. In some embodiments, sidewall spacer layer 3001 is the same material as the first dummy capping layer 2304. In some embodiments, sidewall spacer layer 3001 is the same material as the dummy gate electrode layer 181. A native oxide layer generally forms over the exposed portion dummy gate electrode layer 181 prior to deposition of sidewall spacer layer 3001 allowing the two layers to be distinguished even if they are the same material. Sidewall spacer layer 3001 may be formed conformally by CVD, PVD, another suitable deposition process(es), any combination of the foregoing, or the like.

As illustrated by the cross-sectional view 3100 of FIG. 31, an etch is performed to remove the thinnest portions of sidewall spacer layer 3001 (see FIG. 30) including the portion of that layer that covers logic region 104*l* while leaving a portion of sidewall spacer layer 3001 forming boundary sidewall spacer 185. In some embodiments, boundary sidewall spacer 185 has a smooth surface and a profile that tapers off in the direction of logic region 104*l*. A surface 3101 of boundary sidewall spacer 185 may arc smoothly along the length of this taper. Boundary sidewall spacer 185 is shown resting on dummy gate dielectric layer 183 and spaced above isolation structure 106 by the thickness of that layer, however, if an etch was used to extend sidewall 2704 through dummy gate electrode layer 181, that etch may have progressed into dummy gate dielectric layer 183 to some degree in which case boundary sidewall spacer 185 sits slightly lower then illustrated by the cross-sectional view 3100 of FIG. 31.

In some embodiments, the etch that forms boundary sidewall spacer 185 is a dry etch. In some embodiments, the etch process is one for which first dummy capping layer 2304 and sidewall spacer layer 3001 have similar susceptibilities. The identification of such a process is facilitated if both those layers are formed of the same material. The dry etch may use any suitable chemistry. In some embodiments, sidewall spacer layer 3001 is polysilicon and the dry etch uses fluorine chemistry. Fluorine chemistry may use a plasma generated with tetrafluoromethane (CF4), fluoroform (CHF3), difluoromethane (CH2F2), sulfur hexafluoride (SF6), hexafluoroethane (C2F6), hexafluoropropylene (C3F6), octafluorocyclobutane (C4F8), perfluorocyclopentene (C5F8), another suitable fluorine(s), any combination of the foregoing, or the like. In some embodiments, sidewall spacer layer 3001 is dielectric and the dry etch uses chlorine or bromine chemistry. A chlorine or bromine chemistry may use a plasma generated with chlorine ($Cl_2$), hydrogen bromide (HBr), other suitable halogen compound(s), any combination of the foregoing, or the like. In both cases, argon, oxygen, and other suitable gases may also be included in the etch chemistry. At least a partial thickness of dummy gate dielectric layer 183 may remain over logic region 104*l* through the conclusion of this etch process.

As illustrated by the cross-sectional view 3200 of FIG. 32, further etching may be carried out to remove dummy gate dielectric layer 183 from logic region 104*l*. This etch process(es) may also remove upper pad layer 404 (see FIG. 31) from logic region 104*l*. The etching may conclude with an etch process for which upper pad layer 404 has a higher susceptibility than lower pad layer 402 and may stop on lower pad layer 402. As illustrated in FIG. 32, this etching tends to create an area 3201 in which dummy gate dielectric layer 183 is recessed relative to boundary sidewall spacer 185. Accordingly, the smooth surface 3101 defined by boundary sidewall spacer 185 is not continued by dummy gate dielectric layer 183. Due to the scaling used in these drawings, the recessed area 3201 is represented as having a width less than its height, however, dummy gate dielectric layer 183 is very thin and the depth of this recess may greatly exceed its width.

As illustrated by the cross-sectional view 3300 of FIG. 33, a logic gate stack 3301 may then be formed over the structure illustrated by cross-sectional view 3200 of FIG. 32. Logic gate stack 3301 may include a first logic gate dielectric layer 3303, a high κ logic gate dielectric layer 3305, a logic gate electrode layer 3307, and a logic gate hard mask layer 3309. In general, the logic gate dielectrics may include any suitable number and combination of dielectric layers and may be made with thickness and/or compositions that vary among the different devices in logic region 104*l*. As illustrated by cross-sectional view 3300 of FIG. 33, in accordance with some embodiments of the present disclosure, a first logic gate dielectric layer 3303 fills in any recessed area 3201 under boundary sidewall spacer 185 before high κ logic gate dielectric layer 3305 is deposited. Logic gate electrode layer 3307 may be doped or undoped polysilicon or another suitable material(s). Logic gate electrode layer 3307 may be a dummy gate layer to be replaced by metal at a later stage of processing. Logic hard mask layer 3309 may be nitride, oxide, another suitable dielectric(s), any combination of the foregoing, or the like. The layers of logic gate stack 3301 may be formed conformally by CVD, PVD, electroless plating, electroplating, another suitable growth or deposition process(es), any combination of the foregoing, or the like.

Figure 34:
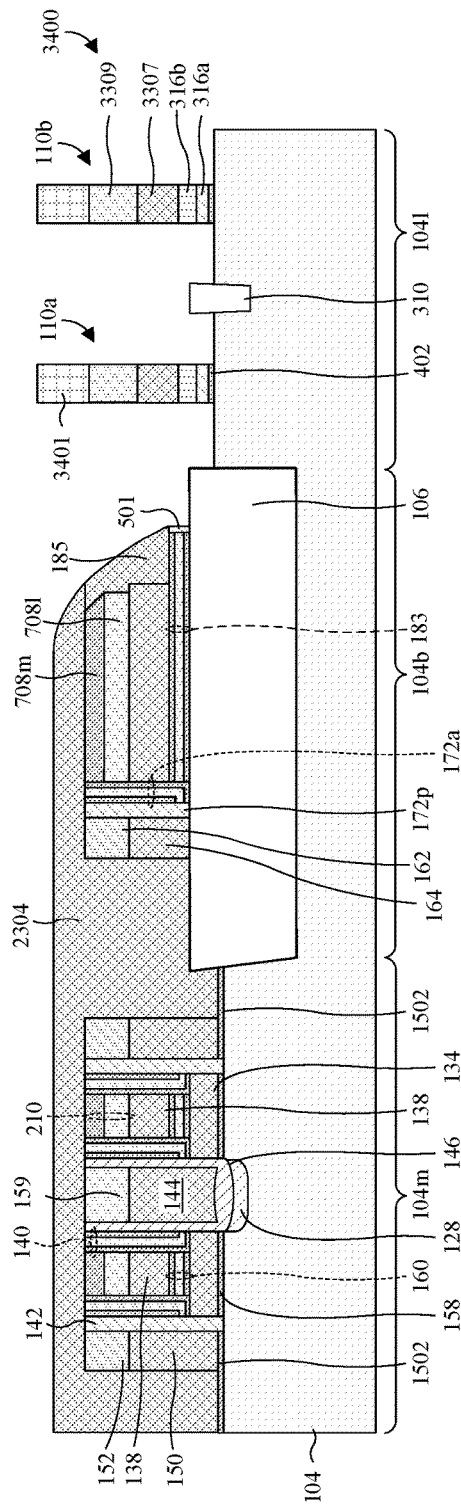

As illustrated by the cross-sectional view 3400 of FIG. 34, a photoresist 3401 may be formed, patterned, and then used to selectively etch logic gate stack 3301 to form logic devices 110*a*, 110*b*. Each of the logic devices 110*a*, 110*b* may include a first logic gate dielectric layer 316*a*, a second logic gate dielectric layer 316*b*, a dummy logic gate electrode 3307, and a logic gate hard mask 3309. A small portion of first logic gate dielectric layer 3303 (see FIG. 33) may be left forming dielectric 501 under boundary sidewall spacer 185. The selective etching may include a series of plasma etches to remove the unmasked portions of the various layers of logic gate stack 3301. Etching may also proceed through capping layer 402. Photoresist 3401 may be removed at the conclusion of this process or another time after logic gate hard mask 3309 has been patterned.

Figure 35:
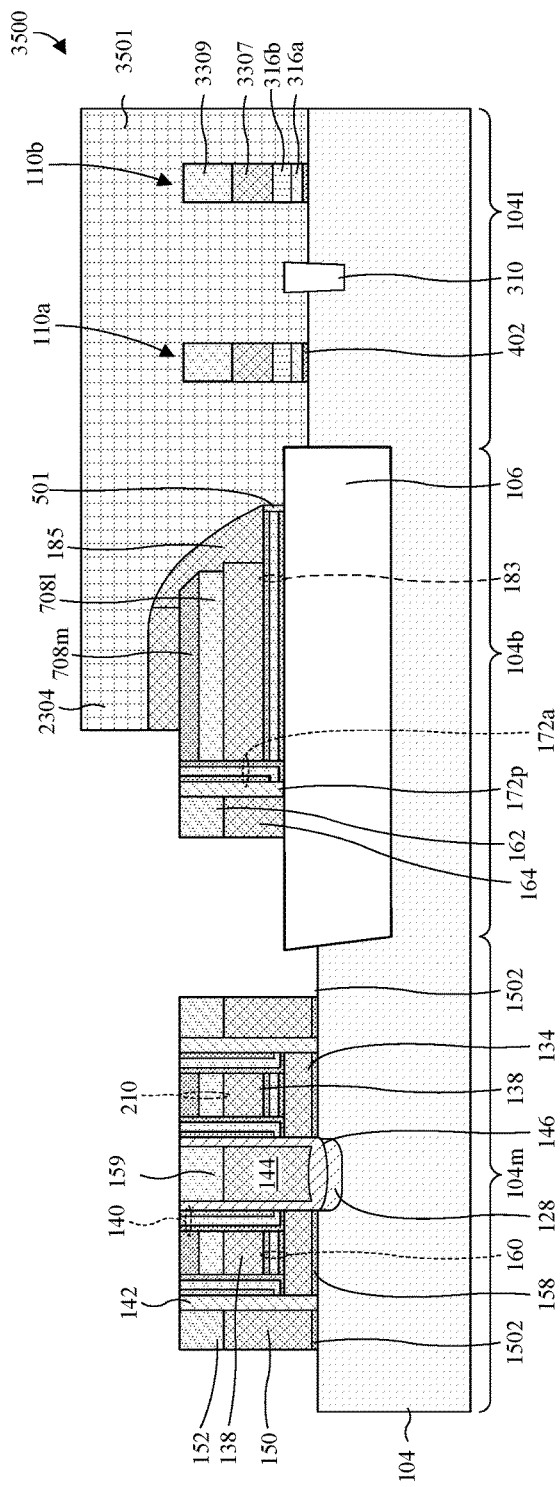

As illustrated by the cross-sectional view 3500 of FIG. 35, a photoresist 3501 may then be formed and patterned to cover logic region 104*l* while leaving memory region 104*m* exposed. An etch process may then be applied to remove dummy capping layer 2304 from memory region 104*m*. After the etch process, photoresist 3501 may be stripped.

Figure 36:
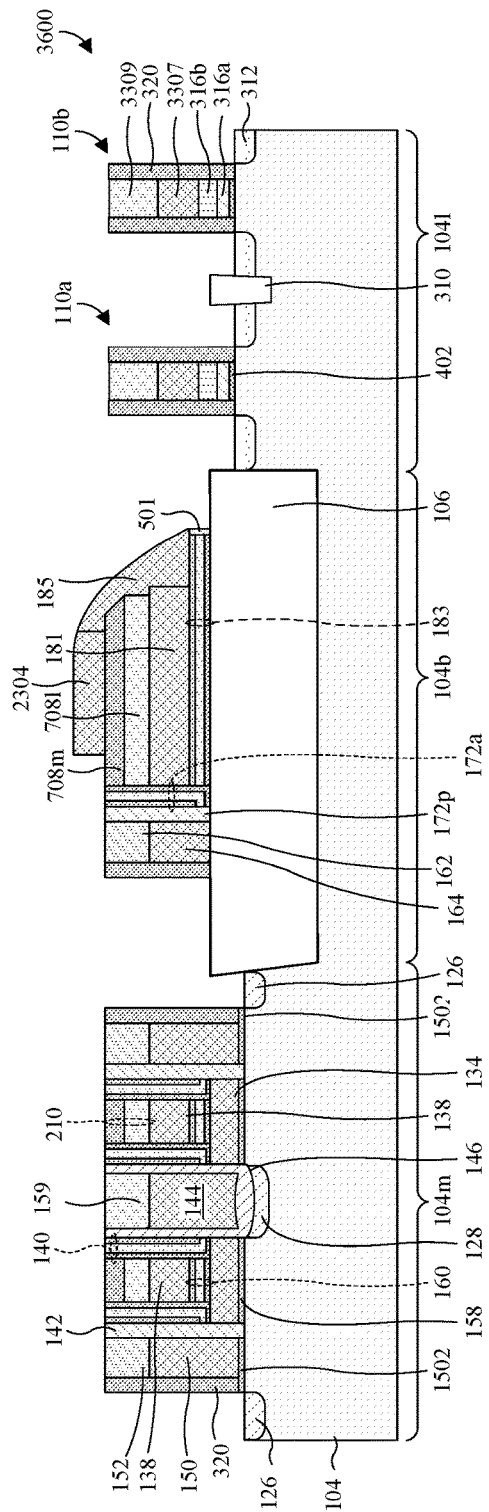

As illustrated by the cross-sectional view 3600 of FIG. 36, logic sidewall spacers 320 may then be formed along outer sidewalls of select gate electrodes 150, logic devices 110*a*, 110*b*, and dummy select gate electrode 162. Logic sidewall spacers 320 may be oxide, nitride, another suitable dielectric(s), any combination of the foregoing, or the like. Logic sidewall spacers 320 may be formed by depositing the spacer material followed by etching to remove the spacer material from where it is thinnest. The spacer material may be deposited conformally by CVD, PVD, another suitable deposition process(es), any combination of the foregoing, or the like. The spacer material may be etched to form logic sidewall spacers 320 by any suitable etch process.

Also illustrated by the cross-sectional view 3600 of FIG. 36, dopants may then be implanted to form individual memory source/drain regions 126 in memory region 104*m* and logic source/drain regions 312 in the logic region 104*l*. Processes for forming individual memory source/drain regions 126 and logic source/drain regions 312 may include ion implantation into semiconductor substrate 104. Dopants and/or implant energy may be selected to perform the ion implantation through layers such as dummy liner layer 304 and memory dielectric layer 1502. Ion implantation may be carrier out in a series of steps with masking to provide doping levels that vary among source/drain regions.

Figure 37:
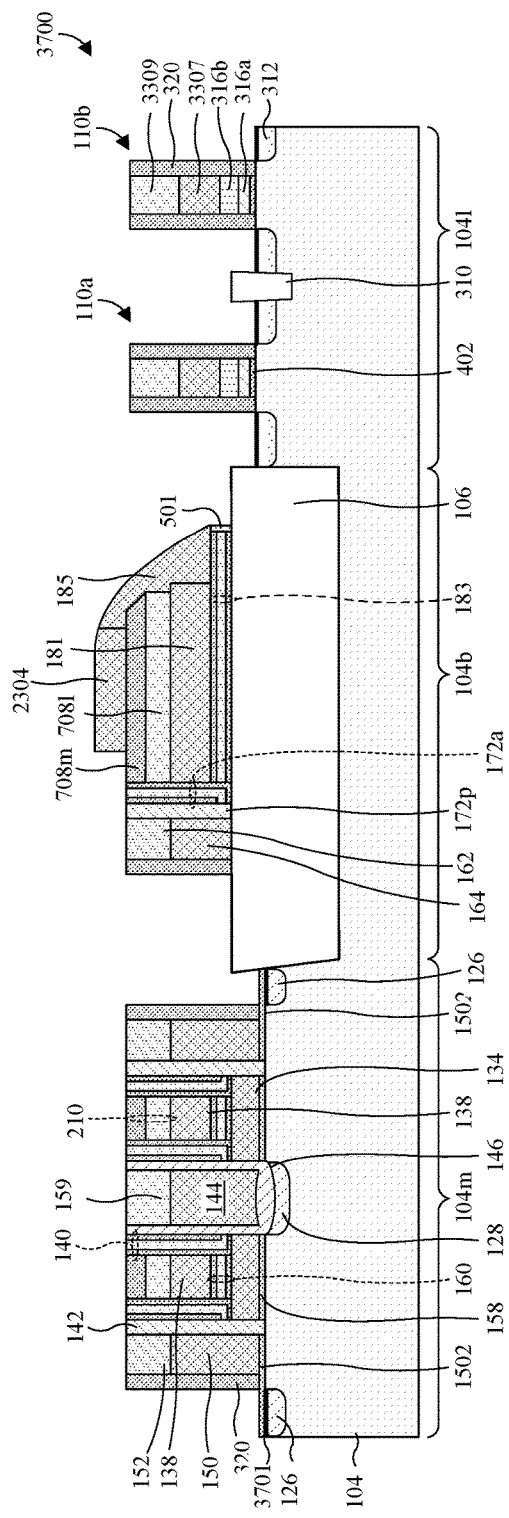

As illustrated by the cross-sectional view 3700 of FIG. 37, dummy liner layer 304 and memory dielectric layer 1502 may then be removed from memory source/drain regions 126 followed by siliciding to form silicide pads 3701. Dummy liner layer 304 and memory dielectric layer 1502 may be removed by etching followed by cleaning to remove etch residue. A suitable cleaning process may include applying a sulfuric acid hydrogen peroxide mixture (SPM) or another suitable cleaning solution(s) or mixture(s). Silicide pads 3701 may be nickel silicide or another suitable silicide(s) and may be formed by any suitable saliciding process(es).

Figure 38:
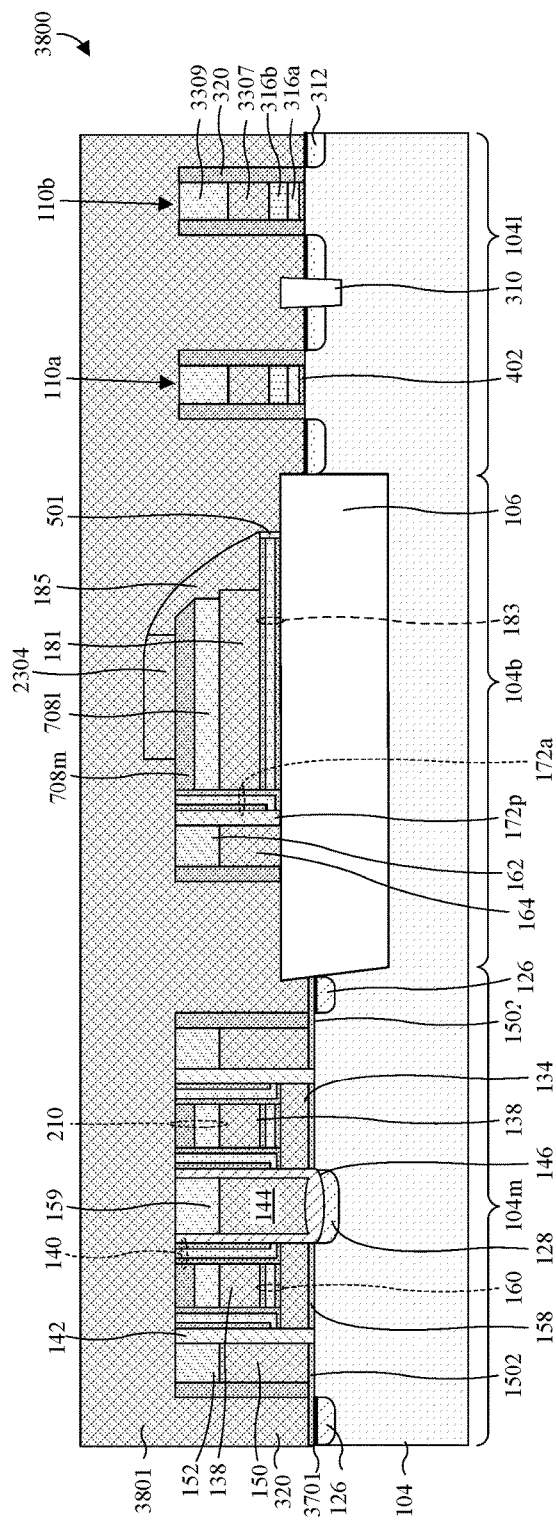

As illustrated by the cross-sectional view 3800 of FIG. 38, a second hard mask ARC 3801 may then be formed over the structure illustrated by the cross-sectional view 3700 of FIG. 37. Second hard mask ARC 3801 may be formed with a top surface that is planar or substantially planar. A process of forming the second hard mask ARC 3801 may include spinning on an organic ARC coating.

Figure 39:
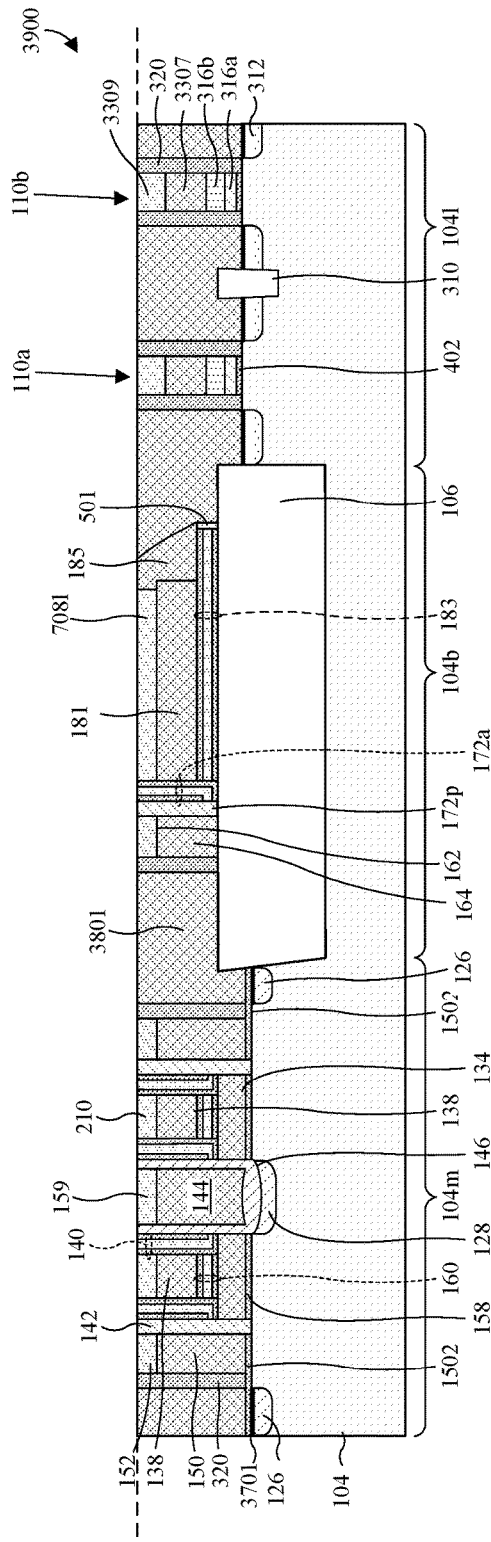

As illustrated by the cross-sectional view 3900 of FIG. 39, an etch may be performed to remove an upper layer from the structure illustrated by cross-sectional view 3800 of FIG. 38. This may be accomplished with a CMP process. In some embodiments, however, the removal is accomplished with etching using process(es) for which the various materials being removed have similar susceptibilities whereby the upper surface remains substantially planar. A suitable etch process may be a dry etch that includes plasma from fluorocarbon and He etchants. In some embodiments, etching stops on one of the hard mask layers 708*m*, 708*l*. In some embodiments, etching stops on dummy gate electrode layer 181 and removes the hard masks 708*m*, 708*l*.

As illustrated by the cross-sectional view 4000 of FIG. 40A, second hard mask ARC 3801 (see FIG. 39) may then be removed followed by formation of a lower ILD layer 174*l* as illustrated by the cross-sectional view 4010 of FIG. 40B. Lower ILD layer 174*l* may be oxide, a low κ dielectric, another suitable dielectric(s), any combination of the foregoing, or the like. Second hard mask ARC 3801 may be removed by etching or any other suitable removal process(es). A process of forming lower ILD layer 174*l* may include depositing lower ILD layer 174*l*. Lower ILD layer 174*l* may be deposited by CVD, PVD, sputtering, or any other suitable process(es).

Figure 41:
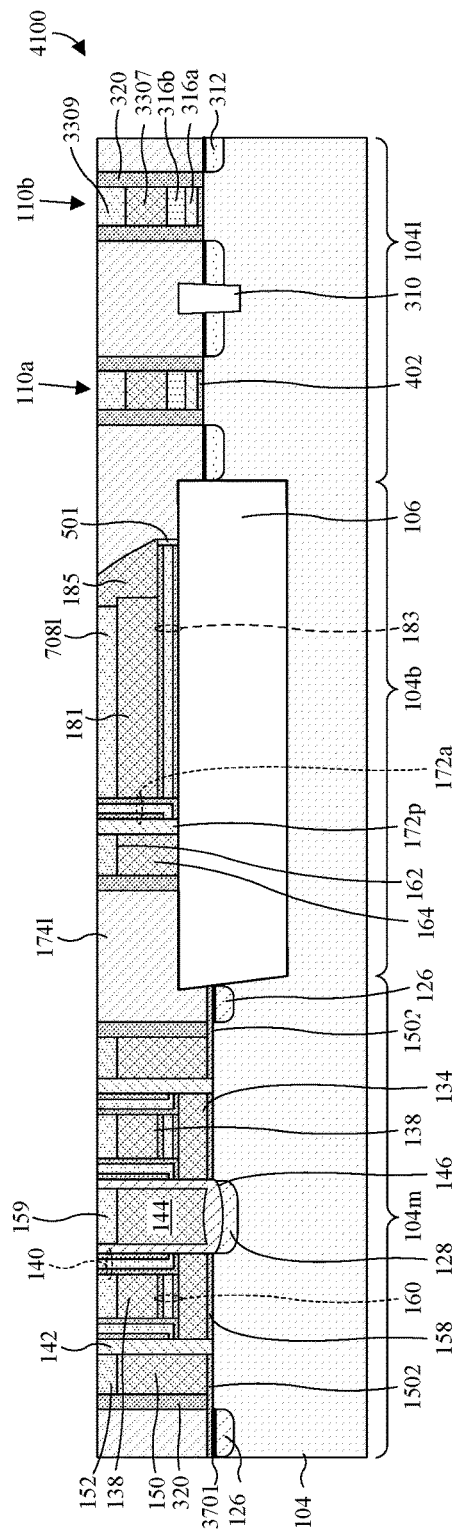

As illustrated by the cross-sectional view 4100 of FIG. 41, lower ILD layer 174*l* may be planarized and its top surface recessed to expose dummy logic gate electrodes 3307. Planarization and recessing may be by CMP or any other suitable process or combination of process(es).

Figure 42:
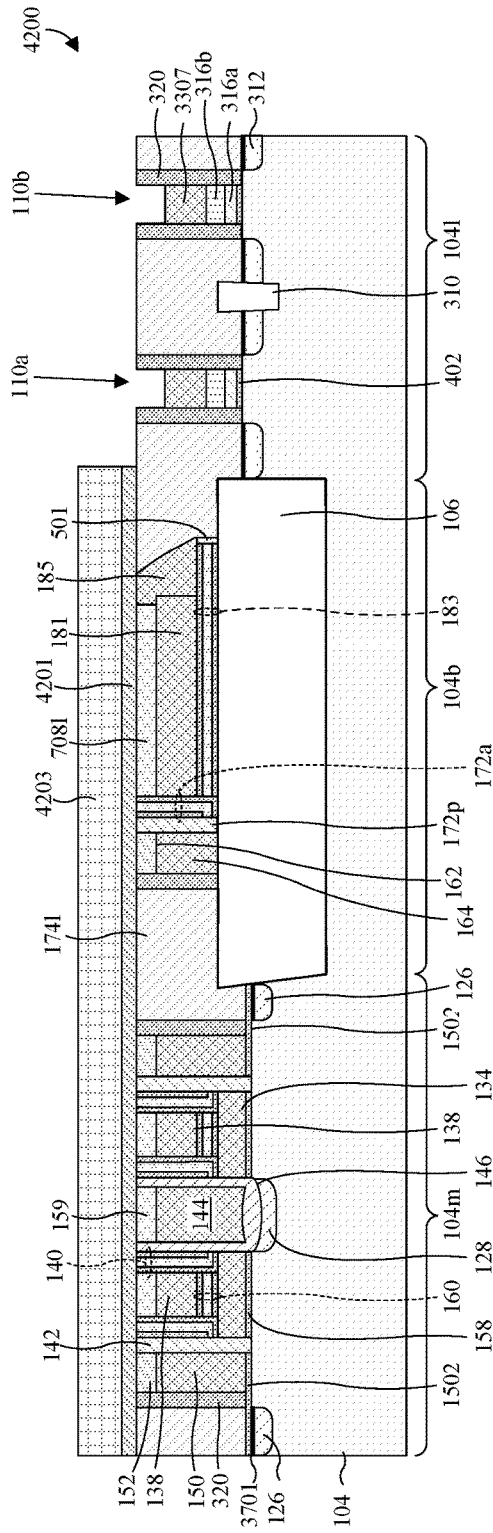

As illustrated by the cross-sectional view 4200 of FIG. 42, a second dummy capping layer 4201 may be formed over memory region 104*m* and isolation structure 106. Second dummy capping layer 4201 may be oxide, nitride, or any other suitable dielectric, or combination of the foregoing, or the like. A process of forming second dummy capping layer 4201 may include depositing the material of second dummy capping layer 4201 by CVD, PVD, or any other suitable deposition process(es) and subsequently patterning second dummy capping layer 4201 using photoresist mask 4203 to remove second dummy capping layer 4201 from logic region 104*l*. Photoresist mask 4203 may then be stripped. Also illustrated by the cross-sectional view 4200 of FIG. 42, an etch may be performed to remove dummy logic gate electrodes 3307 (see FIG. 41). A process for removing dummy logic gate electrode 3307 may be an etch process for which second dummy capping layer 4201 serves as a mask.

As illustrated by the cross-sectional view 4300 of FIG. 43, logic gate electrodes 318 may be formed in the openings left by removing dummy logic gate electrodes 3307. Logic gate electrodes may be any suitable material(s). In some embodiments, logic gate electrodes 318 are metal. A process of forming logic gate electrodes 318 may include forming a layer of the electrode material that fills openings in logic region 104*l* followed by planarization. The conductive layer may be formed by CVD, PVD, electroless plating, electroplating, or another suitable growth or deposition process(es). Planarization may remove the conductive layer from outside the openings in logic region 104*l* and may also remove second dummy capping layer 4201. The planarization process may be CMP or any other suitable planarization process(es).

As illustrated by the cross-sectional view 4400 of FIG. 44, an upper ILD layer 174*u* may be formed over the structure illustrated by the cross-sectional view 4300 of FIG. 43. Upper ILD layer 174*u* may be oxide, a low κ dielectric, another suitable dielectric, any combination of the foregoing, or the like. Upper ILD layer 174*u* may be deposited by CVD, PVD, sputtering, or any other suitable process and may be planarized after deposition. The planarization process may be CMP or any other suitable planarization process(es).

Also illustrated by the cross-sectional view 4400 of FIG. 44, contact vias 161 may be formed extending through the upper ILD layer 174*u* and the lower ILD layer 174*l* to individual memory source/drain regions 126, logic source/drain regions 312, and to any other suitable locations. Contact vias 161 may be formed by any suitable process, for example, by patterning opening through upper ILD layer 174*u* and the lower ILD layer 174*l* then filling those openings with conductive material.

Figure 45:
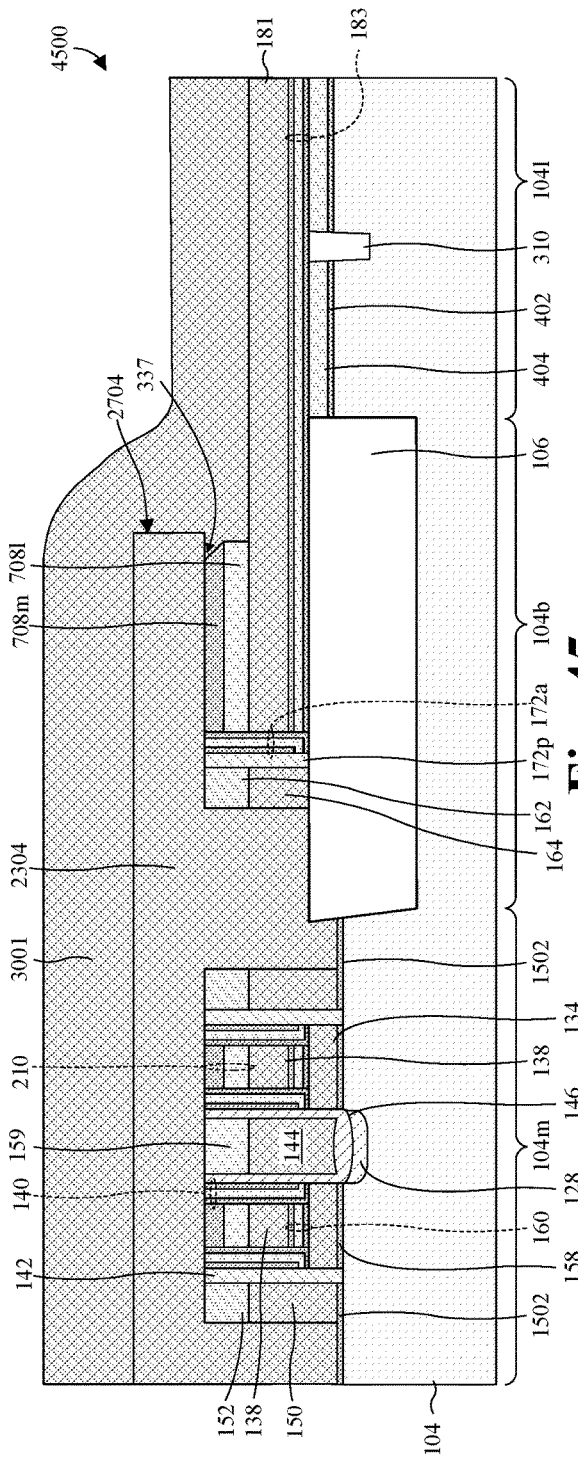
FIGS. 45-46 illustrate cross-sectional views corresponding to a variation according to some aspects of the present disclosure on the IC and manufacturing process illustrated by FIGS. 6-44.
Figure 46:
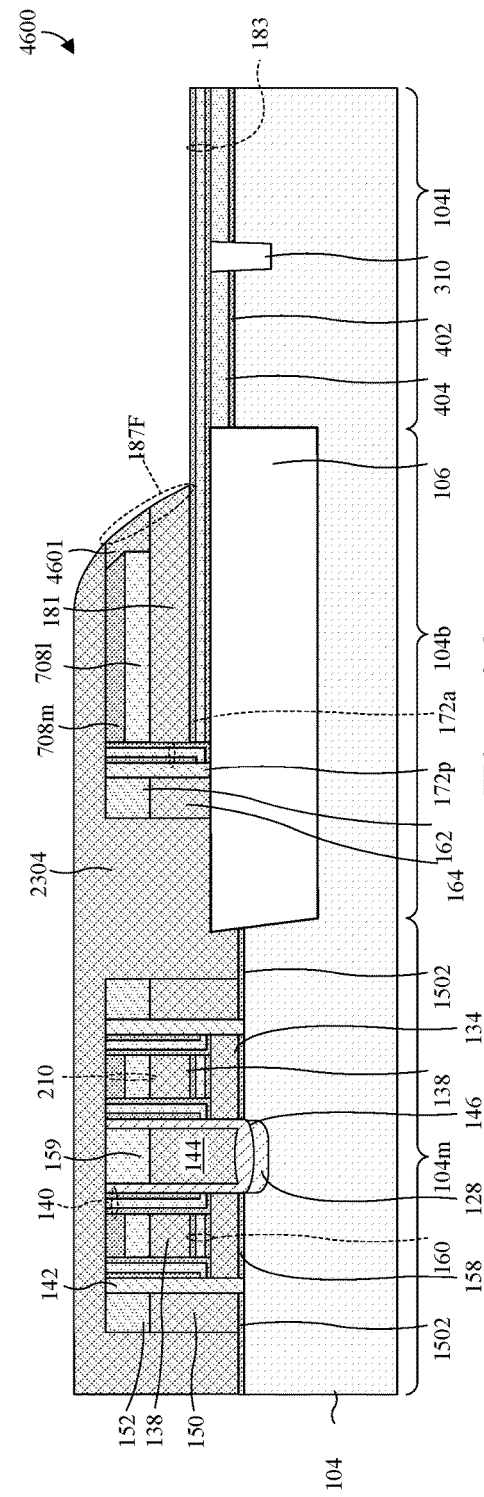

FIGS. 45-46 provide cross-sectional views illustrating an integrated circuit device according to some other embodiments of the present disclosure at various stages of manufacture. These views show an integrated circuit resulting from a variation of the manufacturing process illustrated by FIGS. 6-44. FIG. 45 illustrates a cross-sectional view 4500 showing the result if sidewall spacer layer 3001 is formed over the structure illustrated by cross-sectional view 2800 of FIG. 28 without first etching through dummy gate electrode layer 181 as illustrated by cross-sectional view 2800 of FIG. 29. FIG. 46 illustrates a cross-sectional view 4600 that results when the etch process illustrated by cross-sectional view 3100 of FIG. 31 is applied to the structure illustrated by cross-sectional view 4500 of FIG. 45. Comparing FIGS. 31 and 45 shows that the resulting structure may be very similar except that in the case of FIG. 45 tapered sidewall structure 187F is formed in large part by an extension of dummy gate electrode layer 181 and what remains of sidewall spacer layer 3001 is a small spacer 4601 that is above dummy gate electrode layer 181. Spacer 4601 may be removed by a planarization process such as the one illustrated by cross-sectional view 3900 of FIG. 39.

Figure 47:
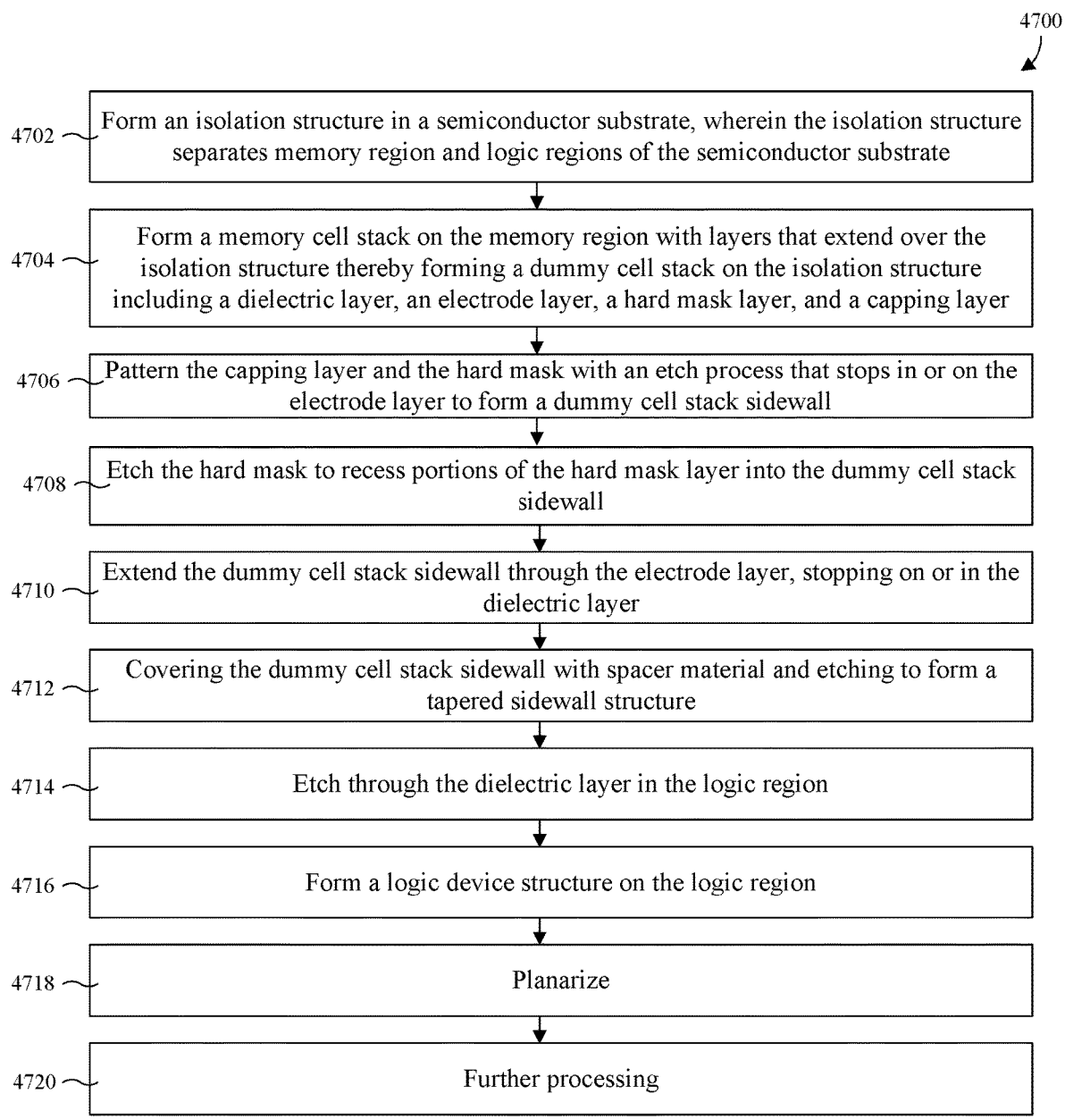
FIG. 47 provides a flowchart of a manufacturing process according to some aspects of the present disclosure.

FIG. 47 provides a flow chart of a process 4700 according to some aspects of the present disclosure that may be used to produce integrated circuit devices according to the present disclosure. While process 4700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 4700 begins with act 4702, forming an isolation structure 106 in a semiconductor substrate 104 to electrically isolate a logic region 104*l* from a memory region 104*m* as shown in FIG. 6.

Process 4700 continues with act 4704, forming a control gate stack 702 on the memory region 104*m* with layers that extend over isolation structure 106 to form dummy gate stack 166 including dummy gate dielectric layer 183, dummy gate electrode layer 181, control gate hard mask 708, and first dummy capping layer 2304, examples of which are illustrated by FIG. 9-25. As a result of this process, layers of dummy gate stack 166 may correspond to layers of control gates that overlay floating gate electrodes 134 in memory region 104*m*.

Process 4700 continues with act 4706, patterning first dummy capping layer 2304 and control gate hard mask 708 with an etch process that stops in or on dummy gate electrode layer 181 to form a sidewall 2704 as shown in FIG. 27. In some embodiments, this patterning is with a anisotropic dry etch process(es). Stopping on dummy gate electrode layer 181 facilitates the following step, act 4708, etching to recess layers of control gate hard mask 708 and/or other layers between first dummy capping layer 2304 and dummy gate electrode layer 181 into sidewall 2704 as shown in FIG. 28. In some embodiments, the etching to recess these layers is an isotropic etch process. In some embodiments, the etching to recess these layers is a wet etch process.

Process 4700 continues with act 4710, etching to extend sidewall 2704 through dummy gate electrode layer 181 as shown in FIG. 29. The etch of act 4710 stops on dummy gate dielectric layer 183 or on one of the layers making up dummy gate dielectric layer 183. This act is optional. In some embodiments, act 4710 is anisotropic etch process. In some embodiments, act 4710 is a dry etch process.

Process 4700 continues with act 4712, forming a sidewall spacer layer 3001 that cover sidewall 2704 and etching to form a spacer 185, 4601 and a tapered sidewall structure 187. This act is illustrated by FIGS. 30 and 31 if act 4710 is used. Otherwise, this act is illustrated by FIGS. 45 and 46.

Process 4700 continues with act 4714, etching to remove dummy gate dielectric layer 183 from logic region 104*l* as illustrated by FIG. 32. Next, a logic device structure 110 is formed in logic region 104*l* with act 4716. An example of logic device structure 110 formation is illustrated by FIGS. 33-37. There follows act 4718, planarization, which may remove control gate hard mask 708 as shown in FIG. 39.

Process 4700 concludes with act 4720, further process to complete formation of an IC device. Further processing may include such acts as a replacement gate process, as illustrated by FIGS. 41-43, and forming interconnect structures, as illustrated by FIG. 44.

Some aspects of the present disclosure relate to an IC that includes a semiconductor substrate having a logic region and a memory region separated by an isolation region having an isolation structure of dielectric material. A memory device is formed on the memory region and includes a gate electrode over a gate dielectric. A dummy gate structure is formed on the isolation structure. The dummy gate structure has a dummy gate electrode layer corresponding to the gate electrode and a dummy gate dielectric layer corresponding to the gate dielectric. A tapered sidewall structure is formed on a logic region-facing side of the dummy gate structure. The tapered sidewall structure is spaced above the isolation structure and either adjacent to or contiguous with the dummy gate electrode layer. The tapered sidewall structure that is spaced above the isolation structure is indicative of the IC being a product of a process according to some aspects of the present disclosure.

In some embodiments, the tapered sidewall structure is on top of a portion of the dummy gate electrode layer. In some embodiments, the dummy gate dielectric layer has a thickness and the tapered sidewall structure is spaced above the isolation structure by a distance less than or equal to that thickness. In some embodiments, the tapered sidewall structure has a taper in the direction of the logic region and the dummy gate dielectric layer does not extend beyond the taper. In some embodiments, one or more layers of the dummy gate dielectric layer stop short of extending fully beneath the tapered sidewall structure to create an area between the isolation structure and the tapered sidewall structure from which the dummy gate dielectric layer is absent and the area between the isolation structure and the tapered sidewall structure from which the dummy gate dielectric layer is absent is filled with a dielectric having a different composition or structure from the dummy gate dielectric layer. These embodiments reflect the tapered sidewall structure having been formed over the dummy gate dielectric layer and the dummy gate dielectric layer being etched through in the logic region only after the tapered sidewall structure has been formed, whereby the tapered sidewall structure reduces contamination and the dummy gate dielectric layer protects the logic region while the tapered sidewall structure is being formed.

In some embodiments, the dummy gate structure includes one or more dielectric layers that are above the dummy gate electrode layer and form part of a sidewall of the dummy gate structure that is covered by the tapered sidewall structure. In some embodiments, the one or more dielectric layers that are above the dummy gate electrode layer are hard mask layers. In some embodiments the one or more dielectric layers are recessed from the logic region relative to the dummy gate electrode layer. In some of these embodiments, the tapered sidewall structure is formed by a spacer that covers a logic region-facing sidewall of the dummy gate electrode layer and sidewalls of the one or more dielectric layers that are above the dummy gate electrode layer. In some of these embodiments, the tapered sidewall structure is formed in part by a spacer that rests on the dummy gate electrode layer and covers the sidewalls of the one or more dielectric layers that are above the dummy gate electrode layer.

In some embodiments, the tapered sidewall structure is formed of conductive material. In some embodiments, the tapered sidewall structure is provided by a spacer separated from the dummy gate electrode layer structure by native oxide formed on the dummy gate electrode layer. In some embodiments, at least part of the tapered sidewall structure is formed by an extension of the dummy gate electrode layer. In some embodiments, the tapered sidewall structure is formed entirely of one material. In some embodiments, the tapered sidewall structure is formed from one layer of material.

In some embodiments, the dummy gate dielectric layer includes a nitride layer between two oxide layers. In some embodiments, the dummy gate structure includes one or more dielectric layer above the dummy gate electrode layer and the uppermost of those layers is recessed from the logic region relative to the dummy gate electrode layer. In some embodiments, the gate electrode and the gate dielectric are above a floating gate electrode and provide a control gate for a memory cell. In some embodiments, the tapered sidewall structure and the dummy gate electrode are both polysilicon. In some embodiments, the tapered sidewall structure is formed of dielectric material. In some embodiments, an upper surface of the gate dielectric and an upper surface of the dummy gate dielectric layer have equal heights as measured from the top surface of the semiconductor substrate. In some embodiments, a high κ dielectric-containing device is formed in the logic region. In some embodiments, the tapered sidewall structure has a surface that tapers to form an angle between 20 and 85 degrees with respect to a surface of the substrate. In some embodiments, the tapered sidewall structure has a surface that tapers to form an angle between 20 and 85 degrees with respect to a surface of the isolation structure. The surface of the isolation structure and the surface of the substrate may be parallel.

Some aspects of the present disclosure relate to an IC that includes a semiconductor substrate having a logic region and a memory region separated by an isolation region having an isolation structure of dielectric material. A logic device is formed in the logic region and a memory device is formed in the memory region. The memory device includes a control gate structure above a floating gate electrode. The control gate structure includes a control gate electrode and a control gate dielectric separating the control gate electrode from the floating gate electrode. The dummy control gate structure on the isolation region is the product of a dummy control gate process that includes forming a dummy control gate dielectric layer over the isolation structure, wherein the dummy control gate dielectric layer is of the same material as the control gate dielectric, forming a dummy control gate electrode layer over the isolation structure, wherein the dummy control gate electrode layer is of the same material as the control gate electrode, forming a hard mask over the dummy control gate electrode layer, forming a capping layer over the hard mask, patterning the capping layer and the hard mask with a first etch process that forms a sidewall that face the logic region and comprises the capping layer and the hard mask, forming a layer of spacer material over the sidewall, and etching the layer of spacer material with a second etch process, wherein the second etch process stops on or in the dummy control gate dielectric layer but leaves a portion of the layer of spacer material covering the sidewall.

In some embodiments, the dummy control gate process further includes a planarization process that removes the hard mask. In some embodiments, the dummy control gate process further includes etching the dummy control gate sidewall with a fourth etch process taking place after patterning the capping layer and the hard mask. The fourth etch process is selective whereby portions of the dummy control gate dielectric layer become recessed into the dummy control gate sidewall relative to the capping layer. In some embodiments, the dummy control gate process further includes etching through the dummy control gate electrode layer to extend the sidewall prior to forming the layer of spacer material over the sidewall. In some embodiments, the second etch process etches through a portion of the dummy control gate electrode layer while another portion of the dummy control gate electrode layer remains beneath the spacer material.

Some aspects of the present disclosure relate to a method of forming an IC that includes forming a gate dielectric layer over an isolation structure that is between a memory region and a logic region of a semiconductor substrate. The gate dielectric layer extends over the memory region and the logic region. The method further includes forming a gate electrode layer over the gate dielectric layer, forming a hard mask over the gate electrode layer, and forming a capping layer over the hard mask. The capping layer and the hard mask are patterned with a first etch process that stops in or on the gate electrode layer and forms a sidewall over the isolation region. The sidewall faces the logic region and includes sidewalls of the capping layer and the hard mask that. A layer of spacer material is formed over the capping layer and the sidewall and then etched with a second etch process. The second etch process stops on or in the control gate dielectric layer in the logic region but leaves a portion of the layer of spacer material covering the sidewall.

In some embodiments, the process further includes etching through the gate dielectric layer in the logic region with a third etch process that takes place after the second etch process. In some embodiments, the first and third etch processes are dry etch processes. In some embodiments, the process further includes etching the sidewall with a fourth etch process. The fourth etch process takes place after patterning the capping layer and the hard mask with the first etch process and before forming the layer of spacer material. The fourth etch process is selective whereby portions of the hard mask become recessed into the sidewall relative to the capping layer. In some embodiments the fourth etch process is a wet etch. In some embodiments, the sidewall is extended by etching through the gate electrode layer before the layer of spacer material is deposited.

In some embodiments, the second etch process etches through the gate electrode layer in the logic region. In some embodiments, the spacer material is polysilicon. In some embodiments, the capping layer is made of the spacer material. In some embodiments, the spacer material is dielectric. In some embodiments, the gate dielectric layer comprises a nitride layer between two oxide layers. In some of these embodiments, the spacer material is a nitride and the second etch process stops on the uppermost of the two oxide layers. In some of these embodiments, the spacer material is an oxide and the second etch process stops on the nitride layer.

Some aspects of the present disclosure relate to a method of forming an IC that includes forming a gate dielectric layer over an isolation structure that is between a memory region and a logic region of a semiconductor substrate. A gate electrode layer is formed over the gate dielectric layer, a hard mask is formed over the gate electrode layer, and a capping layer is formed over the hard mask. The capping layer and the hard mask are patterned with a first etch process that defines a sidewall over the isolation region, wherein the sidewall faces the logic region and includes the capping layer and the hard mask. The hard mask is etched to be at least partially laterally set back within the sidewall. In some embodiments, the etch process that defines the sidewall is an anisotropic etch process and the etching that laterally sets back the hard mask is an isotropic etch process. In some embodiments, the etch process that defines the sidewall is a dry etch process and the etching that laterally sets back the hard mask is a wet etch process. A layer of spacer material is formed over the capping layer and the sidewall and etch with a second etch process to form a spacer that covers the sidewall. In some embodiments, the first etch process stops on the gate electrode layer. In some embodiments after etching the hard mask to be laterally set back within the sidewall and before forming the layer of spacer material, the gate electrode layer is etched through to extend the sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor substrate including a logic area and a memory area;
a shallow trench isolation structure on the semiconductor substrate between the logic area and the memory area, wherein the shallow trench isolation structure comprises a dielectric material;
a memory device on the memory area, wherein the memory device includes a gate electrode directly over a gate dielectric;
a dummy gate structure directly over the shallow trench isolation structure, the dummy gate structure comprising a dummy gate electrode layer directly over a dummy gate dielectric layer; and
a tapered sidewall structure on a side of the dummy gate structure that faces the logic area, wherein the tapered sidewall structure is directly and entirely over the shallow trench isolation structure, is spaced above the shallow trench isolation structure, and is either adjacent to or contiguous with the dummy gate electrode layer;
wherein the tapered sidewall structure is above the dummy gate dielectric layer;
the dummy gate electrode layer has a composition of the gate electrode; and
the dummy gate dielectric layer has a composition of the gate dielectric.

2. The IC of claim 1, wherein the tapered sidewall structure is directly over the dummy gate electrode layer.

3. The IC of claim 1, wherein:
the dummy gate dielectric layer has a thickness; and
the tapered sidewall structure is spaced above the shallow trench isolation structure by a distance less than or equal to the thickness of the dummy gate dielectric layer.

4. The IC of claim 1, wherein:
the tapered sidewall structure tapers toward the logic area; and
the dummy gate dielectric layer is confined below the tapered sidewall structure.

5. An integrated circuit (IC) comprising:
a semiconductor substrate including a logic region and a memory region;
a memory device on the memory region, wherein the memory device includes a gate electrode directly over a gate dielectric;
a dummy gate structure and a shallow trench isolation structure between the logic region and the memory region and having a dummy gate electrode layer directly over a dummy gate dielectric layer; and
a tapered sidewall structure on a side of the dummy gate structure that faces the logic region, wherein the tapered sidewall structure is adjacent to the dummy gate electrode layer;
wherein the dummy gate electrode has a composition corresponding to the gate electrode;
the tapered sidewall structure is directly and entirely over the shallow trench isolation structure;
the dummy gate dielectric has a composition corresponding to the gate dielectric;
the tapered sidewall structure is formed of a conductive material; and
the tapered sidewall structure is separated from the dummy gate electrode layer by a native oxide formed on the dummy gate electrode layer.

6. The IC of claim 1, wherein the tapered sidewall structure is formed by the dummy gate electrode layer.

7. The IC of claim 1, wherein the dummy gate dielectric layer comprises a nitride layer between two oxide layers.

8. An integrated circuit (IC) comprising:
- a semiconductor substrate including a logic region and a memory region;
- an isolation structure between the logic region and the memory region;
- a memory device on the memory region, wherein the memory device includes a gate electrode directly over a gate dielectric;
- a dummy gate structure between the logic region and the memory region and having a dummy gate electrode layer directly over a dummy gate dielectric layer; and
- a tapered sidewall structure on a side of the dummy gate structure that faces the logic region, wherein the tapered sidewall structure is either adjacent to or contiguous with the dummy gate electrode layer;
- wherein the dummy gate electrode has a composition of the gate electrode;
- the dummy gate dielectric has a composition of the gate dielectric;
- one or more layers of the dummy gate dielectric layer are cut off short from extending fully beneath the tapered sidewall structure to create an area between the isolation structure and the tapered sidewall structure from which the dummy gate dielectric layer is absent; and
- the area between the isolation structure and the tapered sidewall structure from which the dummy gate dielectric layer is absent is filled with a dielectric having a different composition or structure from the dummy gate dielectric layer.

9. The IC of claim 1, wherein the side of the dummy gate structure that faces the logic area includes one or more dielectric layers that are above the dummy gate electrode layer and are recessed from the logic area relative to the dummy gate electrode layer.

10. The IC of claim 1, wherein the tapered sidewall structure is polysilicon.

11. The IC of claim 1, wherein the tapered sidewall structure is dielectric.

12. The IC of claim 1, wherein the tapered sidewall structure comprises a lower layer that is polysilicon and an upper layer that is dielectric.

13. The IC of claim 1, wherein the tapered sidewall structure is spaced above the isolation structure by a distance equal to a thickness of the dummy gate dielectric layer.

14. The IC of claim 1, wherein the gate electrode is disposed over a floating gate.

15. The IC of claim 1, wherein high K metal gates are disposed in the logic area.

16. The IC of claim 1, wherein a dielectric distinct from the dummy gate dielectric layer is disposed adjacent the dummy gate dielectric layer and underneath the tapered sidewall structure.

17. The IC of claim 5, wherein:
- the dummy gate structure is directly above an isolation structure;
- the dummy gate dielectric layer has a thickness; and
- the tapered sidewall structure is spaced above the isolation structure by a distance less than or equal to the thickness of the dummy gate dielectric layer.

18. The IC of claim 5, wherein:
- the dummy gate structure is directly above an isolation structure;
- the dummy gate dielectric layer has a thickness; and
- the tapered sidewall structure is spaced above the isolation structure by a distance equal to the thickness of the dummy gate dielectric layer.

19. The IC of claim 8, wherein:
- the dummy gate structure is directly above an isolation structure;
- the dummy gate dielectric layer has a thickness; and
- the tapered sidewall structure is spaced above the isolation structure by a distance less than or equal to the thickness of the dummy gate dielectric layer.

20. The IC of claim 8, wherein:
- the dummy gate structure is directly above an isolation structure;
- the dummy gate dielectric layer has a thickness; and
- the tapered sidewall structure is spaced above the isolation structure by a distance equal to the thickness of the dummy gate dielectric layer.

* * * * *